US 11,309,878 B2

(12) United States Patent
Jin et al.

(10) Patent No.: US 11,309,878 B2
(45) Date of Patent: Apr. 19, 2022

(54) POWER CONVERSION SYSTEM

(71) Applicant: Delta Electronics, Inc., Taoyuan (TW)

(72) Inventors: Da Jin, Taoyuan (TW); Yahong Xiong, Taoyuan (TW); Qinghua Su, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 26 days.

(21) Appl. No.: 17/022,939

(22) Filed: Sep. 16, 2020

(65) Prior Publication Data
US 2021/0083658 A1 Mar. 18, 2021

(30) Foreign Application Priority Data

Sep. 18, 2019 (CN) .......................... 201910883647.6
Aug. 4, 2020 (CN) .......................... 202010772991.0

(51) Int. Cl.
*H03K 17/08* (2006.01)
*H02M 1/32* (2007.01)
(Continued)

(52) U.S. Cl.
CPC .............. *H03K 17/08* (2013.01); *H02M 1/32* (2013.01); *H02M 3/155* (2013.01); *H02M 3/1588* (2013.01)

(58) Field of Classification Search
CPC ........ H03K 17/08; H02M 1/32; H02M 3/155; H02M 3/1588
(Continued)

(56) References Cited

U.S. PATENT DOCUMENTS 5,828,559 A * 10/1998 Chen ................ H03K 17/08148
363/56.05
7,187,263 B2 3/2007 Vinciarelli
(Continued)

FOREIGN PATENT DOCUMENTS

CN 2567748 Y 8/2003
CN 2575820 Y 9/2003
(Continued)

OTHER PUBLICATIONS

Yungtaek Jang et al., Multiphase buck converters with extended duty cycle, IEEE Conference Publication, 2006, pp. 38-44.

*Primary Examiner* — Yemane Mehari
(74) *Attorney, Agent, or Firm* — Kirton McConkie; Evan R. Witt

(57) ABSTRACT

A power conversion system is provided. The power conversion system includes a power conversion circuit and N clamping circuits. The power conversion circuit includes an input port, an output port, N switching power conversion units and N−1 storage device. The switching power conversion unit includes a first switch and a second switch. N is an integer larger than 1. Two ends of the storage device have a first node and a second node respectively. The clamping circuit includes an absorbing capacitor and an absorbing diode and has a first terminal, a second terminal and a third terminal. The first and second terminals are electrically connected to two ends of the corresponding second switch respectively. The absorbing capacitor and the absorbing diode are serially coupled between the first and second terminals for absorbing a peak voltage. The third terminal is electrically connected to the corresponding first node or the input port.

16 Claims, 49 Drawing Sheets

(51) Int. Cl.
*H02M 3/155* (2006.01)
*H02M 3/158* (2006.01)

(58) Field of Classification Search
USPC .................................................. 323/282
See application file for complete search history.

(56) References Cited

U.S. PATENT DOCUMENTS

| | | |
|---|---|---|
| 7,230,405 B2 | 6/2007 | Jang et al. |
| 7,382,113 B2 * | 6/2008 | Wai ................ H02M 3/158 |
| | | 323/222 |
| 7,479,774 B2 * | 1/2009 | Wai ................. H02J 3/382 |
| | | 323/284 |
| 7,944,090 B2 | 5/2011 | Chang et al. |
| 8,188,830 B2 | 5/2012 | Nakahori |
| 8,829,866 B2 | 9/2014 | Lethellier |
| 9,000,874 B2 | 4/2015 | Kim et al. |
| 9,306,458 B2 | 4/2016 | Khayat et al. |
| 9,331,578 B2 | 5/2016 | Cheng |
| 9,548,648 B2 | 1/2017 | Amaro et al. |
| 9,825,521 B2 | 11/2017 | Khayat |
| 10,033,276 B2 | 7/2018 | Shenoy |
| 2006/0087295 A1 | 4/2006 | Jang et al. |
| 2010/0327765 A1 | 12/2010 | Melanson et al. |
| 2011/0121935 A1 | 5/2011 | Chu et al. |
| 2015/0002115 A1 | 1/2015 | Shenoy et al. |
| 2015/0311792 A1 | 10/2015 | Amaro et al. |
| 2015/0311793 A1 | 10/2015 | Khayat et al. |
| 2016/0056709 A1 | 2/2016 | Khayat |
| 2016/0359483 A1 | 12/2016 | Mukhopadhyay et al. |
| 2019/0214904 A1 | 7/2019 | Yu et al. |
| 2020/0350821 A1 | 11/2020 | Cannillo et al. |
| 2020/0381989 A1 | 12/2020 | Kuang |
| 2021/0083584 A1 * | 3/2021 | Jin ..................... H02M 3/07 |

FOREIGN PATENT DOCUMENTS

| | | |
|---|---|---|
| CN | 101291109 A | 10/2008 |
| CN | 1697099 B | 5/2010 |
| CN | 101783587 A | 7/2010 |
| CN | 102904565 A | 1/2013 |
| CN | 202839232 U | 3/2013 |
| CN | 104485806 A | 4/2015 |
| CN | 105119512 A | 12/2015 |
| CN | 205104331 U | 3/2016 |
| CN | 105827101 A | 8/2016 |
| CN | 105915063 A | 8/2016 |
| CN | 205487664 U | 8/2016 |
| CN | 205566087 U | 9/2016 |
| CN | 106230253 A | 12/2016 |
| CN | 106328347 A | 1/2017 |
| CN | 103595367 B | 3/2017 |
| CN | 106664020 A | 5/2017 |
| CN | 106998142 A | 8/2017 |
| CN | 109391156 A | 8/2017 |
| CN | 107437456 A | 12/2017 |
| CN | 104701000 B | 5/2018 |
| CN | 108270358 A | 7/2018 |
| CN | 108599564 A | 9/2018 |
| CN | 108683332 A | 10/2018 |
| CN | 208433282 U | 1/2019 |
| CN | 109390118 A | 2/2019 |
| CN | 208706394 U | 4/2019 |
| CN | 109889075 A | 6/2019 |
| CN | 209312558 U | 8/2019 |
| CN | 110729903 A | 1/2020 |
| CN | 112165252 A | 1/2021 |
| TW | 200703857 A | 1/2007 |
| TW | 201342784 A | 10/2013 |

* cited by examiner

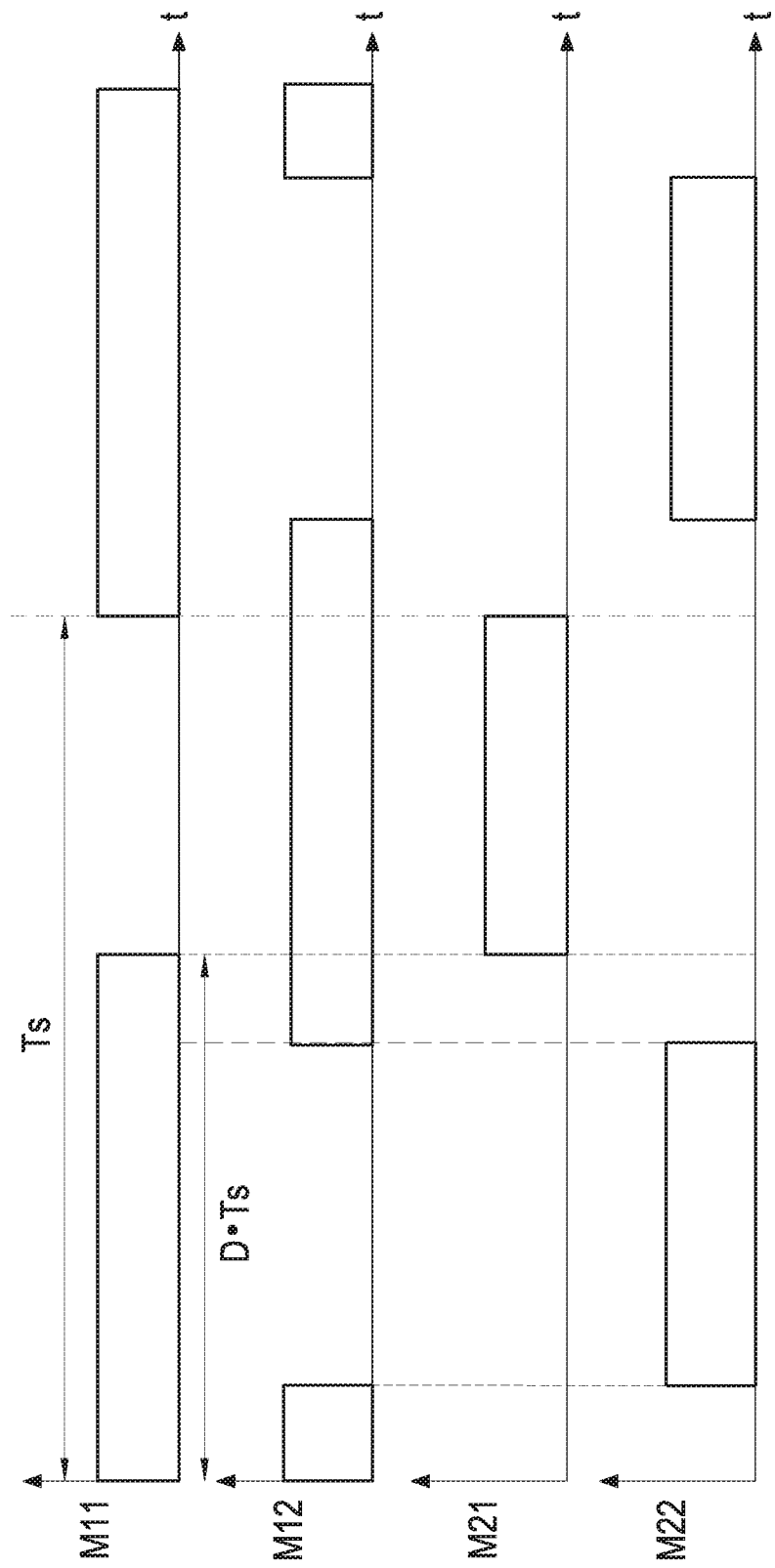

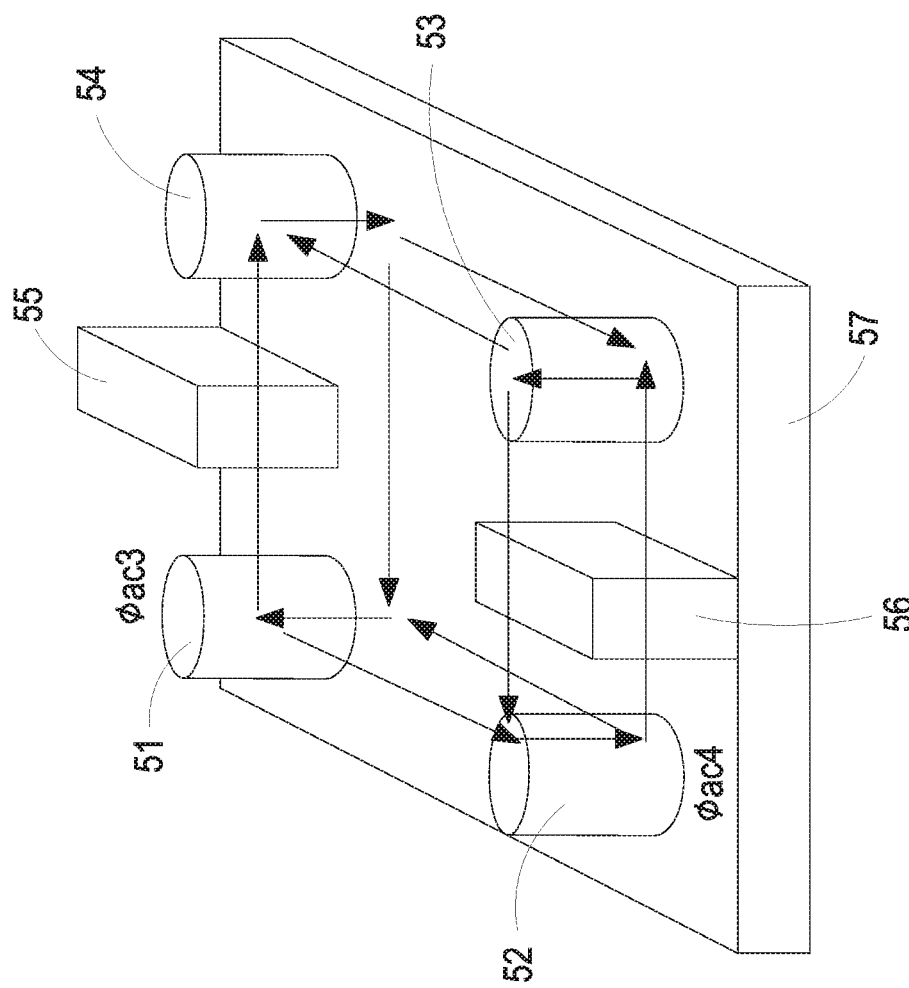

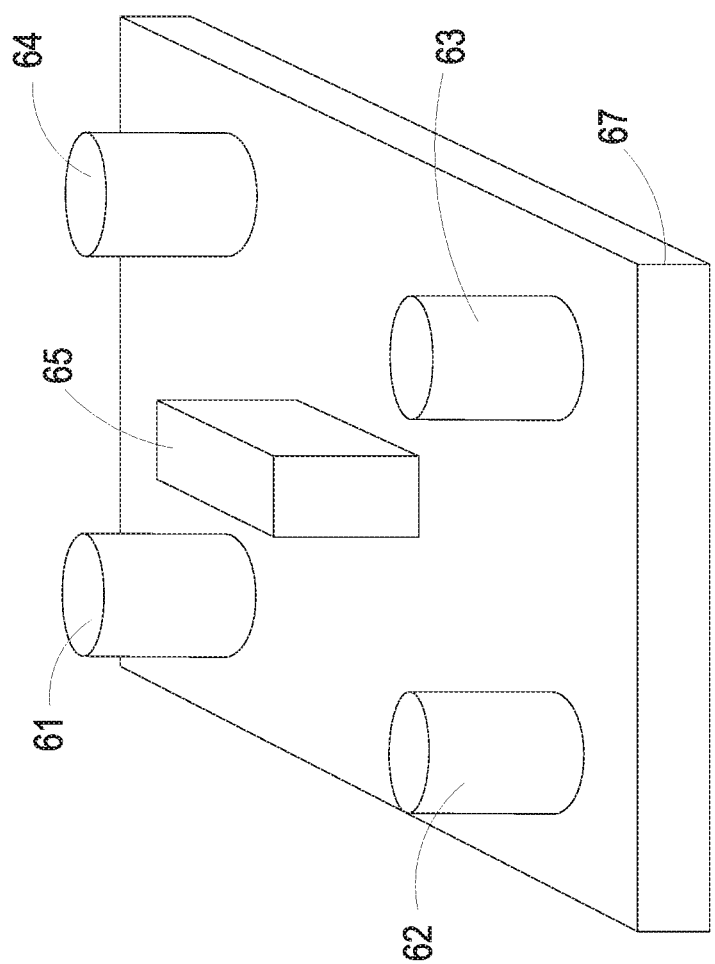

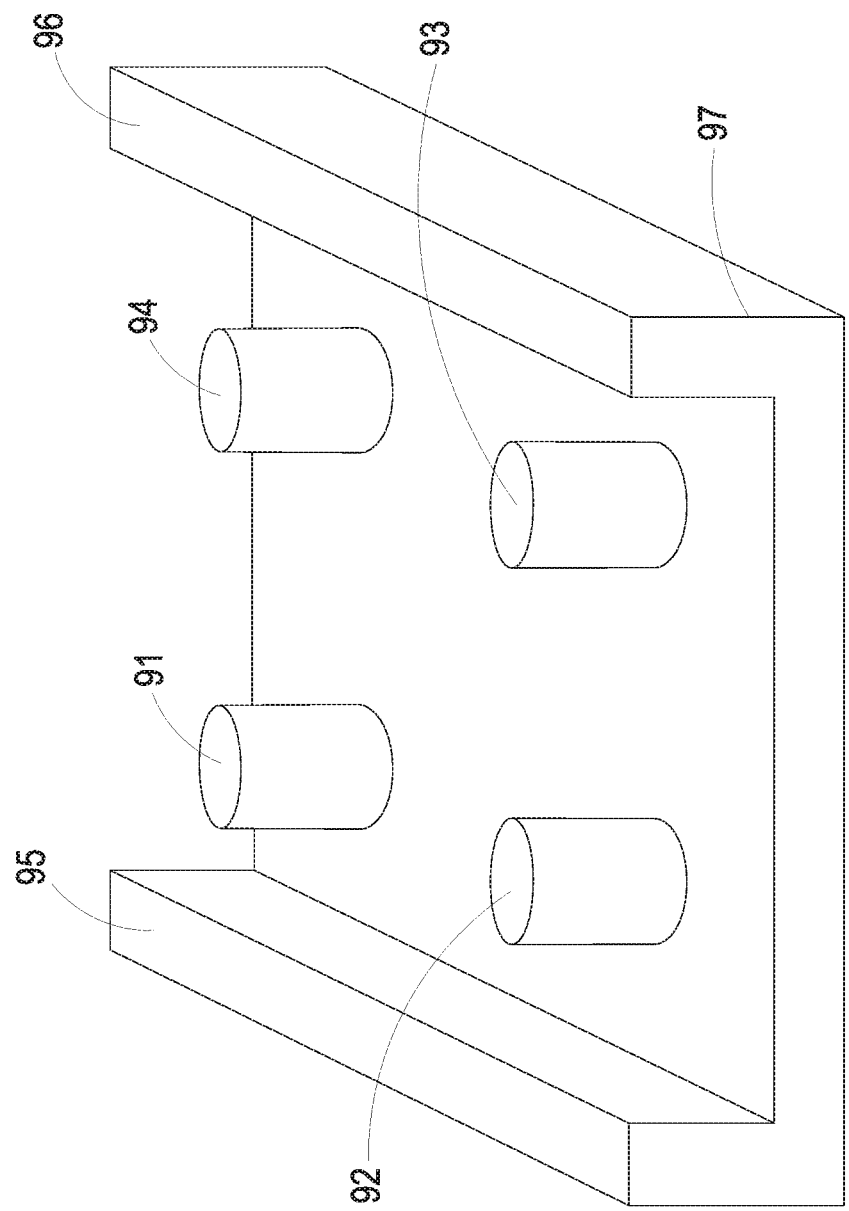

POWER CONVERSION SYSTEM

CROSS-REFERENCE TO RELATED APPLICATION

This application claims priority to China Patent Application No. 201910883647.6 filed on Sep. 18, 2019 and claims priority to China Patent Application No. 202010772991.0 filed on Aug. 4, 2020. The entire contents of the above-mentioned patent applications are incorporated herein by reference for all purposes.

FIELD OF THE INVENTION

The present disclosure relates to a power conversion system, and more particularly to a power conversion system having a clamping circuit for protecting switches.

BACKGROUND OF THE INVENTION

In conventional applications of non-isolated step-down DC-DC converters with high output current, a two-phase buck circuit with parallel configuration is employed. As shown in FIG. 1, the parallel configuration is utilized to reduce the current stress on switches, and the switches in every phase of the buck circuit are driven by two signals having 180 degrees out of phase with respect to each other, so as to reduce the current ripple. However, in the buck circuit, the switching duty ratio equals the voltage transmission ratio of the output voltage to the input voltage, i.e., Vo=Vin*D. Accordingly, in the applications that the input voltage is larger than the output voltage, the switching duty ratio is reduced, which causes the buck circuit unable to operate with the best performance.

Therefore, there is a need of providing a power conversion system to obviate the drawbacks encountered from the prior arts.

SUMMARY OF THE INVENTION

It is an objective of the present disclosure to provide a power conversion system. The power conversion circuit of the power conversion system is a multi-phase buck converter with extended duty ratio. Compared with the conventional buck circuit under the same input and output conditions, the power conversion circuit of the present disclosure can increase the duty ratio and reduce the amount of voltage jump while turning on or off switches. Therefore, the switching loss is reduced, and the efficiency is improved. In addition, the clamping circuit is disposed at the two ends of the switch in the power conversion circuit so as to clamp the peak voltage on the switch and protect the switch. Meanwhile, the peak energy is absorbed and fed back to the circuit. Consequently, the loss of the peak energy is reduced, and the efficiency of the power conversion circuit is improved.

In accordance with an aspect of the present disclosure, there is provided a power conversion system. The power conversion system includes a power conversion circuit and N clamping circuits. The power conversion circuit includes an input port, an output port, N switching power conversion units and N−1 storage device. The input port is configured to receive an input voltage. The output port is configured to output an output voltage. The N switching power conversion units are connected in series. Each of the N switching power conversion units includes a first switch and a second switch. The first switch is serially coupled to one terminal of the second switch, and the other terminal of the second switch is grounded. The first switch of the first switching power conversion unit is connected to the input port, and the first switch of any other of the N switching power conversion units is serially coupled to the first switch of the preceding switching power conversion unit. N is an integer larger than or equal to 2. The N−1 storage device is serially coupled between the input and output ports. Two ends of the storage device have a first node and a second node respectively. There are n first switches between the (n)th storage device and the input port, and n is an integer larger than or equal to 1 and smaller than or equal to N−1. Each of the N clamping circuits includes at least one absorbing capacitor and at least one absorbing diode and has a first terminal, a second terminal and a third terminal. The first and second terminals are electrically connected to two ends of the corresponding second switch respectively. The at least one absorbing capacitor and the at least one absorbing diode are serially coupled between the first and second terminals for absorbing a peak voltage generated at the two ends of the corresponding second switch. The third terminal is electrically connected to the corresponding first node or the input port.

In accordance with another aspect of the present disclosure, there is provided a power conversion system. The power conversion system includes a power conversion circuit and N clamping circuits. The power conversion circuit includes an input port, an output port and N switching power conversion units. The input port is configured to receive an input voltage. The output port is configured to output an output voltage. The N switching power conversion units are connected in series. Each of the N switching power conversion units includes a first switch, a second switch and a third switch. One terminal of the first switch of the N switching power conversion units are electrically connected to the input port. In each of the N switching power conversion units, the other terminal of the first switch is electrically connected to one terminal of the second switch and one terminal of the third switch through a storage device, the other terminal of the second switch is electrically connected to the other terminal of the first switch of another switching power conversion unit. The other terminal of the third switch is grounded. N is an integer larger than or equal to 2. Two ends of the storage device have a first node and a second node respectively. Each of the N clamping circuits includes at least one absorbing capacitor and at least one absorbing diode and has a first terminal, a second terminal and a third terminal. The first and second terminals are electrically connected to two ends of the corresponding third switch respectively. The at least one absorbing capacitor and the at least one absorbing diode are serially coupled between the first and second terminals for absorbing a peak voltage generated at the two ends of the corresponding third switch. The third terminal is electrically connected to the corresponding first node or the input port.

In accordance with another aspect of the present disclosure, there is provided a power conversion system. The power conversion system includes X power conversion circuits and X clamping circuit assemblies, wherein X is an integer larger than or equal to one. The X input ports of the X power conversion circuits are coupled in parallel, and the X output ports of the X power conversion circuits are coupled in parallel. Each of the X clamping circuit assemblies includes N clamping circuits for absorbing a peak voltage generated at two ends of the second or third switch of the corresponding power conversion circuit

BRIEF DESCRIPTION OF THE DRAWINGS

FIG. 3A and FIG. 3B are schematic oscillograms showing the driving signals of the switches of the first power conversion circuit with different duty ratios;

FIG. 10B schematically shows the direction of AC magnetic flux in the magnetic core assembly of FIG. 10A;

FIG. 10D, FIG. 10G, FIG. 10H and FIG. 10I are schematic perspective views illustrating a part of different variants of the magnetic core assembly of FIG. 10A;

DETAILED DESCRIPTION OF THE PREFERRED EMBODIMENT

The present disclosure will now be described more specifically with reference to the following embodiments. It is to be noted that the following descriptions of preferred embodiments of this disclosure are presented herein for purpose of illustration and description only. It is not intended to be exhaustive or to be limited to the precise form disclosed.

Figure 1:
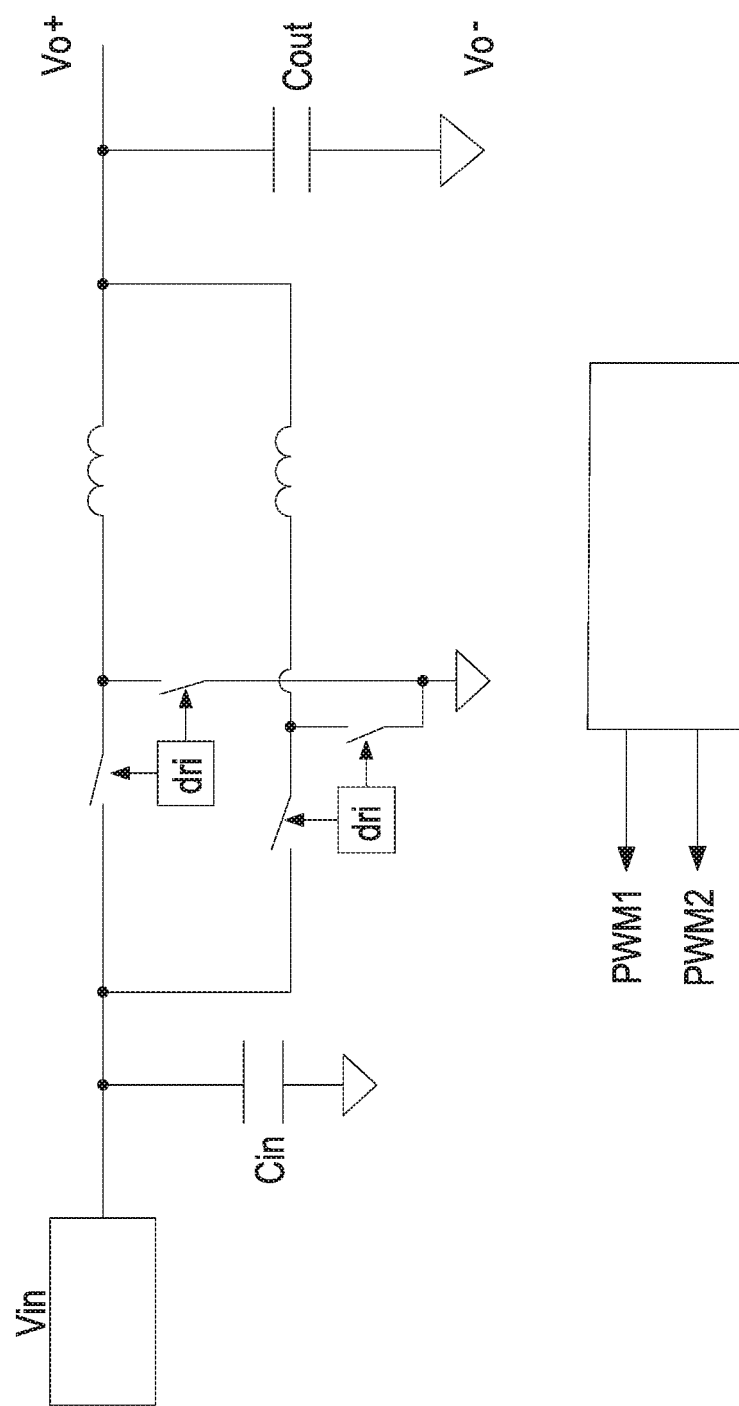
FIG. 1 is a schematic circuit diagram illustrating a conventional two-phase buck circuit.
Figure 2A:
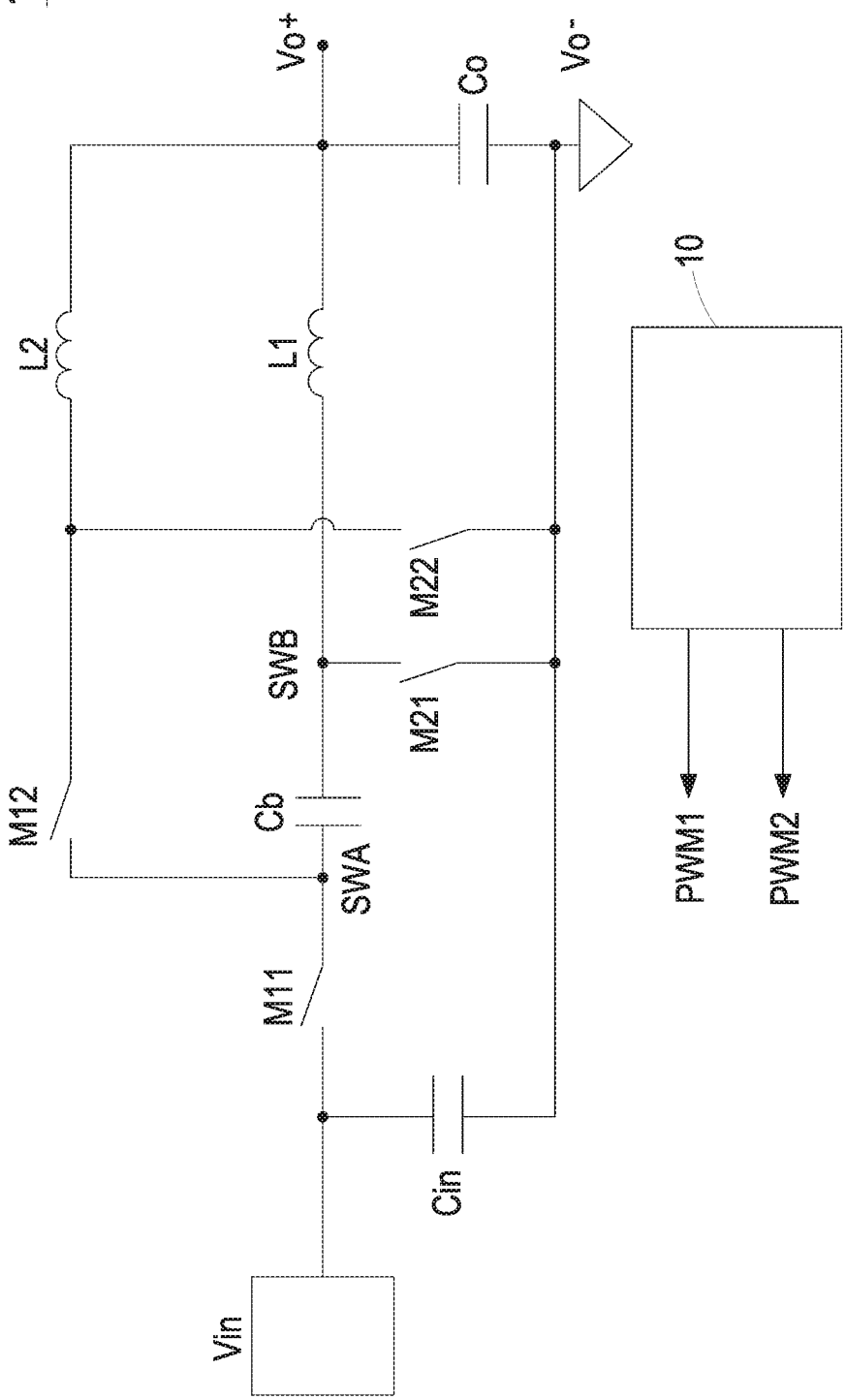
FIG. 2A is a schematic circuit diagram illustrating a first power conversion circuit according to an embodiment of the present disclosure.
Figure 3A:
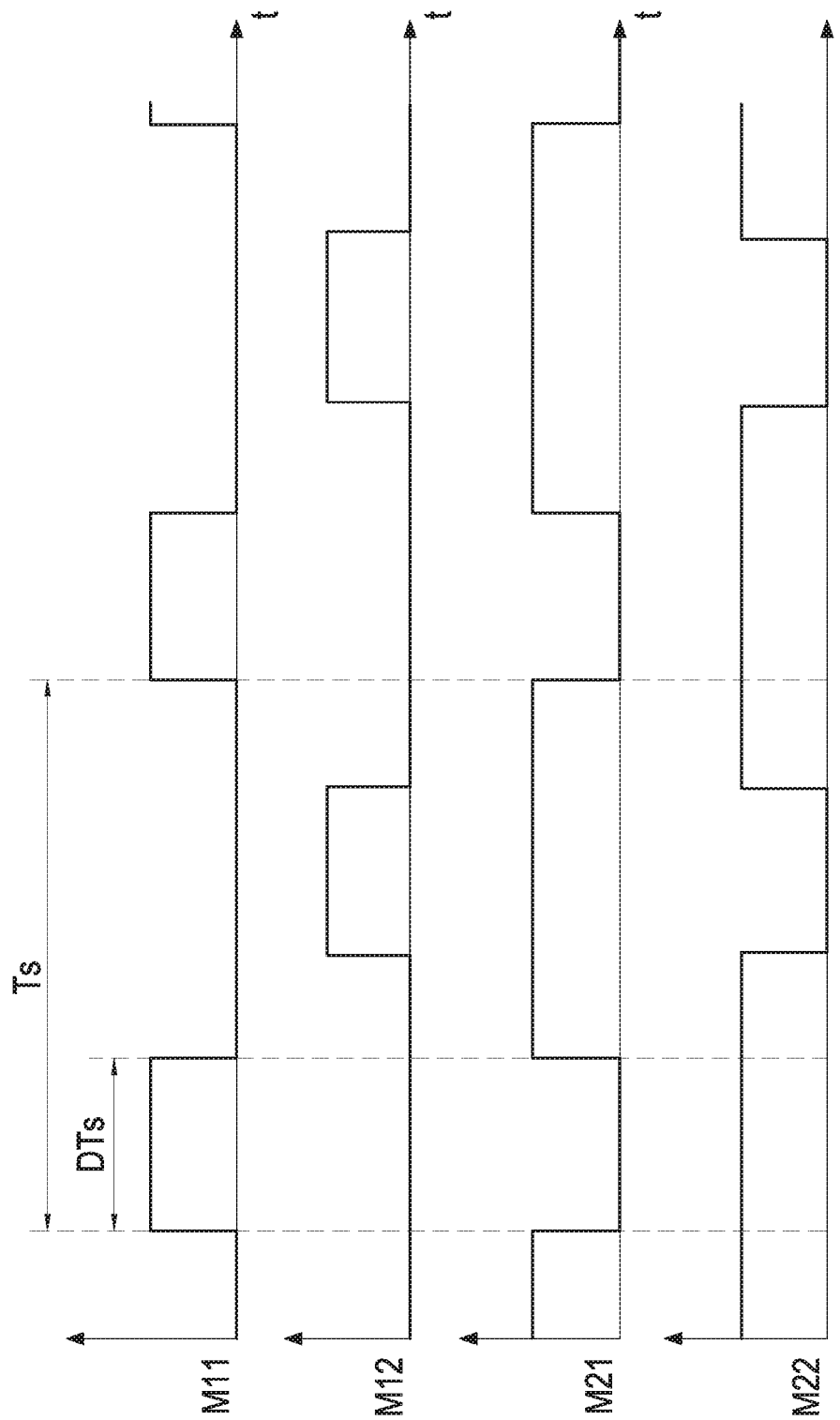
Figure 4A:
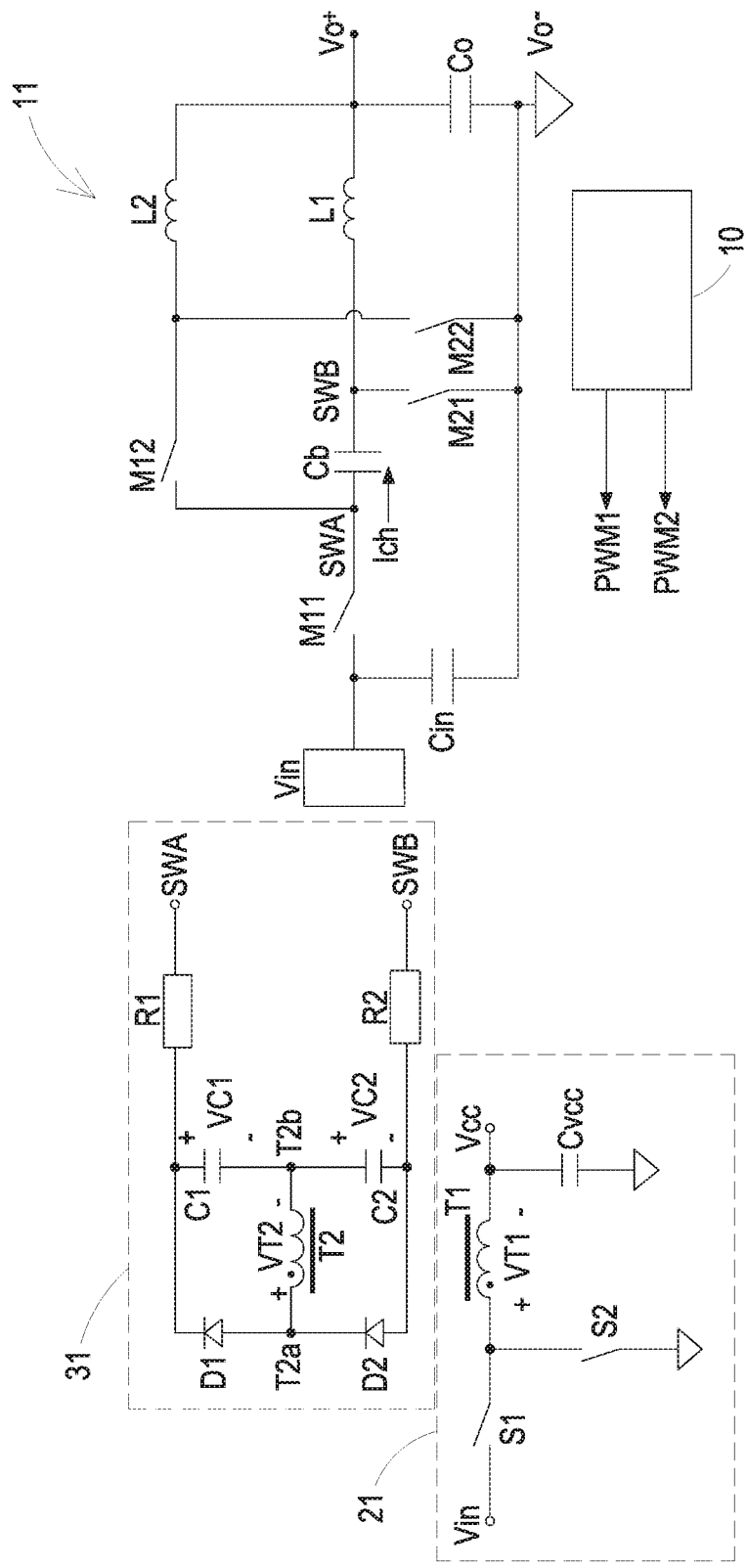
FIG. 4A is a schematic circuit diagram illustrating a first power conversion system according to a first embodiment of the present disclosure.
Figure 4B:
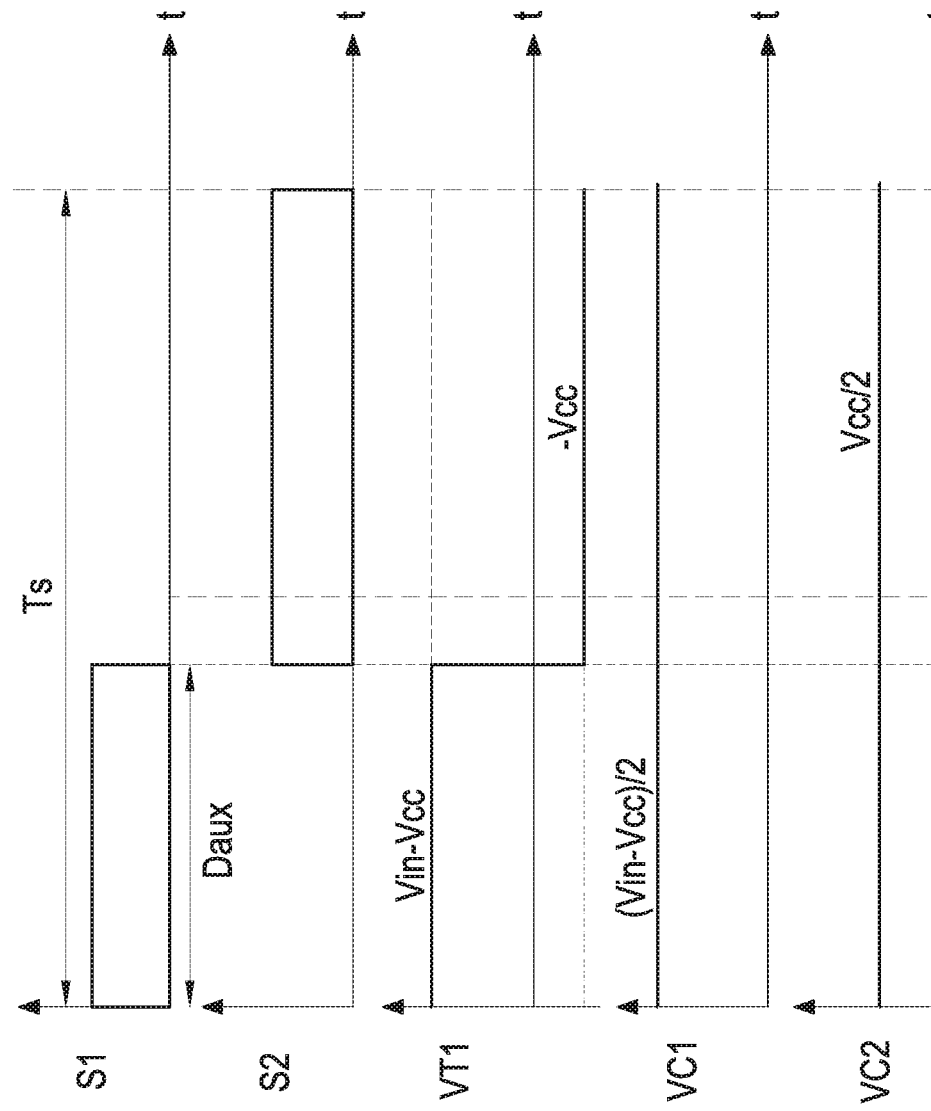
FIG. 4B is a schematic oscillogram showing the switch driving signal and corresponding voltage variation of FIG. 4A.
Figure 5A:
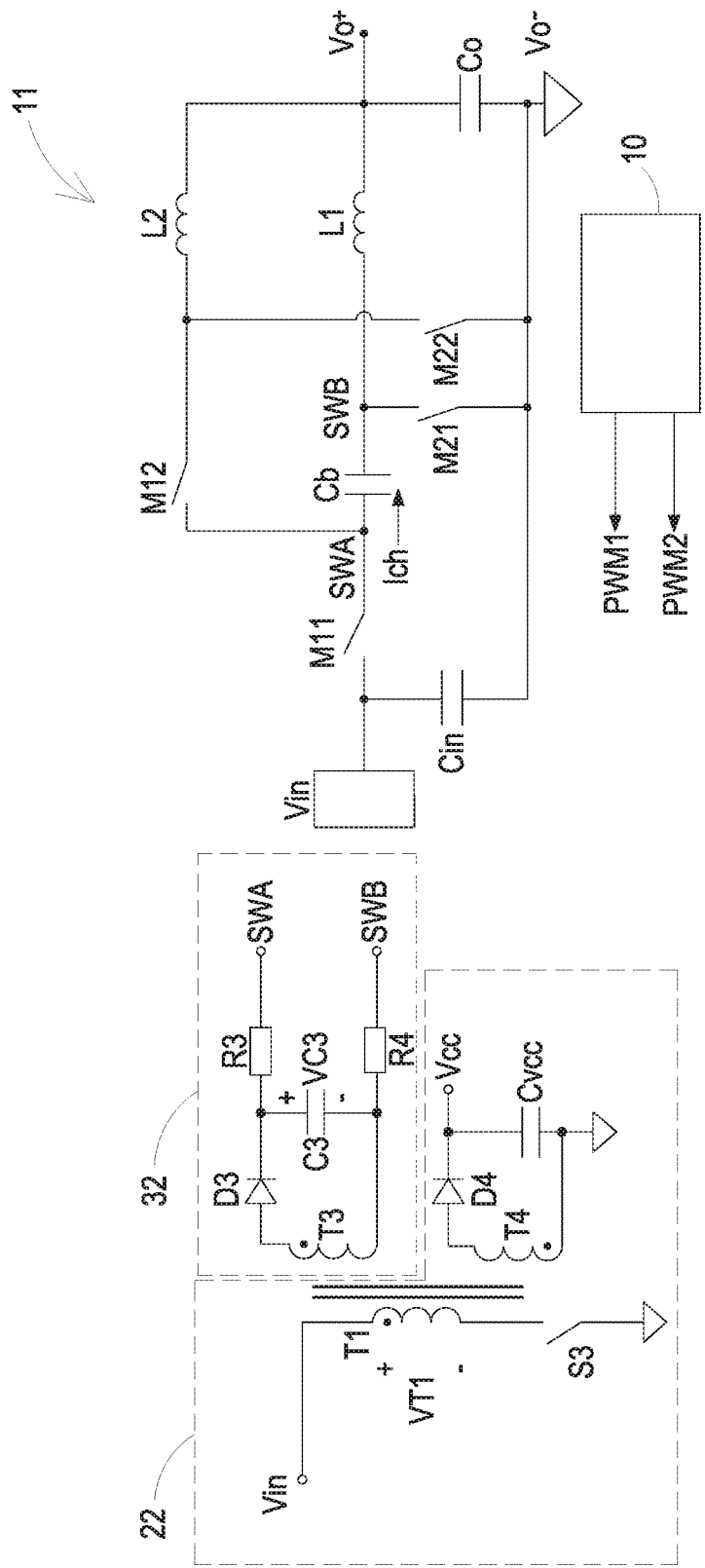
FIG. 5A is a schematic circuit diagram illustrating a first power conversion system according to a second embodiment of the present disclosure.
Figure 5B:
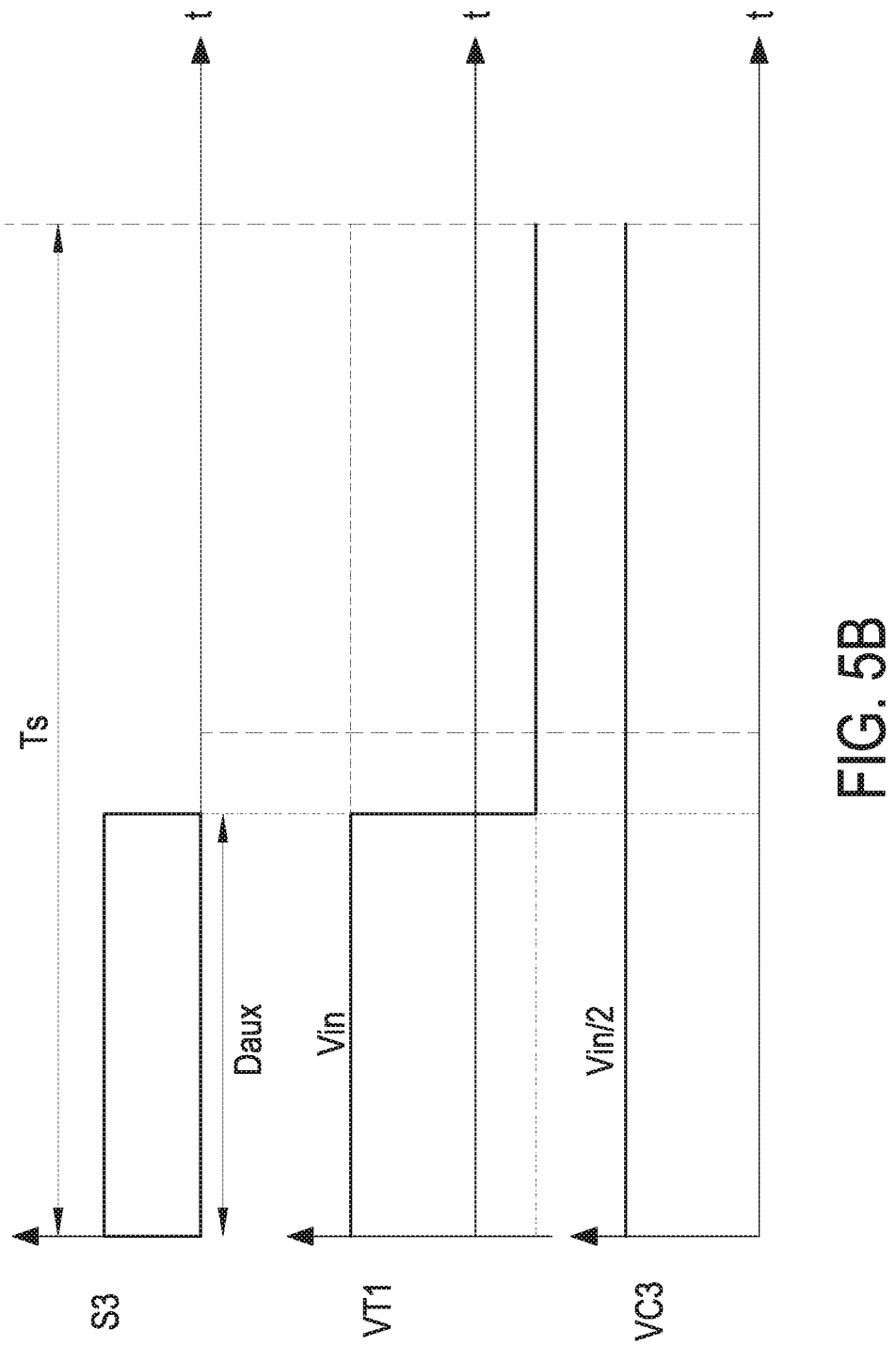
FIG. 5B is a schematic oscillogram showing the switch driving signal and corresponding voltage variation of FIG. 5A.

FIG. 2A is a schematic circuit diagram illustrating a first power conversion circuit according to an embodiment of the present disclosure. FIG. 3A and FIG. 3B are schematic oscillograms showing the driving signals of the switches of the first power conversion circuit with different duty ratios. FIG. 4A is a schematic circuit diagram illustrating a first power conversion system according to a first embodiment of the present disclosure. FIG. 4B is a schematic oscillogram showing the switch driving signal and corresponding voltage variation of FIG. 4A. FIG. 5A is a schematic circuit diagram illustrating a first power conversion system according to a second embodiment of the present disclosure. FIG. 5B is a schematic oscillogram showing the switch driving signal and corresponding voltage variation of FIG. 5A. As shown in FIG. 4A and FIG. 5A, the first power conversion system of the present disclosure includes a first power conversion circuit shown in FIG. 2A, a power circuit and at least one precharge circuit.

The first power conversion circuit includes an input port, an output port, N switching power conversion units and N−1 storage device(s), where N is a positive integer larger than or equal to 2. The input port and the output port are configured to receive an input voltage Vin and generate an output voltage Vo respectively. Each of the N switching power conversion units includes a first switch and a second switch serially connected to each other. The first and second switches have a switching period, and the first and second switches operate periodically according to the switching period. The switching period has a duty ratio. In addition, the first switch of the first switching power conversion unit is connected to the input port, and the first switch of other switching power conversion unit is serially connected to the first switch of the preceding switching power conversion unit in sequence. The N−1 storage device is serially connected between the input and output ports. Two ends of each storage device have a first node and a second node respectively. There is n first switch between the (n)th storage device and the input port, where n is a positive integer larger than or equal to 1 and smaller than or equal to N−1. For example but not exclusively, the storage device is a capacitor. The storage device is configured to divide the input voltage. During one switching period, the storage device stores the energy and transmits the energy to the output port, and the energy stored by the storage device is proportional to the duty ratio. In an embodiment, the power conversion circuit further includes a controller 10. The controller 10 is configured to output at least two control signals PWM1 and PWM2 for controlling the switches of the switching power conversion units of the first power conversion circuit. According to above descriptions, it is noted that the first power conversion circuit of the present disclosure is a multi-phase buck converter with extended duty ratio. Compared with the conventional buck circuit under the same input and output conditions, the first power conversion circuit of the present disclosure can increase the duty ratio and reduce the amount of voltage jump while turning on or off switches. Therefore, the switching loss is reduced, and the efficiency is improved.

The first power conversion system further includes a power circuit. The power circuit is electrically connected to the first power conversion circuit for receiving the input voltage Vin, and the power circuit includes a magnetic element T1. The magnetic element T1 is for example but not limited to an inductor or a transformer. In an embodiment, the power circuit further outputs a supply voltage Vcc to the power conversion circuit so as to supply power for the control and driving chips in the power conversion circuit.

The first power conversion system further includes N−1 precharge circuit. The N−1 precharge circuit is corresponding to the N−1 storage device one-to-one so as to charge the storage device. Each of the N−1 precharge circuit includes a winding and a rectifier filter circuit connected to each other. The winding is coupled to the magnetic element T1 for receiving a conversion voltage. The output of the rectifier filter circuit is electrically connected to the first and second nodes at two ends of the corresponding storage device. Consequently, the rectifier filter circuit receives the conversion voltage and outputs a charge voltage to the corresponding storage device. In addition, the turns ratio of the winding of the precharge circuit configured for charging the (n)th storage device to the magnetic element is (N−n):N.

Therefore, before the first power conversion circuit performs the voltage conversion, the voltages on the magnetic element T1 of the power circuit and the precharge circuit are utilized to precharge the storage device. Accordingly, the first power conversion circuit enters the soft switching state of the output voltage, which means that the terminal voltage stress on the second switch is low when the first switch is turned on. Consequently, it is allowed to employ a switch component with low withstanding voltage as the second switch so that the cost is reduced. Moreover, the switch component with low withstanding voltage has low conducting inner resistance, which can improve the power conversion efficiency and reduce the loss.

In addition, the specific topologies of the power circuit and the precharge circuit may be varied corresponding to the type of power circuit.

In an embodiment, the power circuit may be a buck circuit. As shown in FIG. 4A, the power circuit 21 includes the magnetic element T1, a fourth switch S1 and a fifth switch S2. One terminal of the fourth switch S1 is electrically connected to the input port, and the other terminal of the fourth switch S1 is connected to one terminal of the fifth switch S2 and one terminal of the magnetic element T1. The other terminal of the fifth switch S2 is grounded, and the other terminal of the magnetic element T1 is connected to the positive terminal of the supply voltage Vcc. The fourth switch S1 and the fifth switch S2 are turned on by complementary signals. In this embodiment, in each precharge circuit 31, the winding T2 has a first terminal T2a and a second terminal T2b, and the rectifier filter circuit includes a first diode D1, a first capacitor C1, a second diode D2 and a second capacitor C2. The first terminal T2a of the winding T2 is connected to the positive electrode of the first diode D1 and the negative electrode of the second diode D2. The second terminal T2b of the winding T2 is connected to the negative electrode of the first capacitor C1 and the positive electrode of the second capacitor C2. The negative electrode of the first diode D1 and the positive electrode of the first capacitor C1 are electrically connected to the corresponding first node SWA. The positive electrode of the second diode D2 and the negative electrode of the second capacitor C2 are electrically connected to the corresponding second node SWB. Consequently, the precharge for the storage device Cb can be realized. In fact, through adjusting the capacitance of the first and second capacitors C1 and C2, the charge current outputted from the rectifier filter circuit 31 to the storage device Cb can be limited, thereby achieving the current limiting function. However, the way for limiting the charge current is not limited thereto. In an embodiment, the rectifier filter circuit 31 further includes a first resistor R1 and a second resistor R2. One terminal of the first resistor R1 is connected to the negative electrode of the first diode D1 and the positive electrode of the first capacitor C1, the other terminal of the first resistor R1 is connected to the corresponding first node SWA. One terminal of the second resistor R2 is connected to the positive electrode of the second diode D2 and the negative electrode of the second capacitor C2, and the other terminal of the second resistor R2 is connected to the corresponding second node SWB. Therefore, the first and second resistors R1 and R2 can work as current limiting resistors for limiting the charge current provided to the storage device Cb. In addition, in an embodiment, the power circuit 21 further includes a capacitor Cvcc. One terminal of the capacitor Cvcc is connected to the other terminal of the magnetic element T1 (i.e., the positive terminal of the supply voltage Vcc), and the other terminal of the capacitor Cvcc is grounded.

In another embodiment, the power circuit may be a flyback circuit. As shown in FIG. 5A, the power circuit 22 includes the magnetic element T1 and a sixth switch S3 connected in series. In each precharge circuit 32, the winding T3 is positively coupled to the magnetic element T1. The first terminal of the winding T3 is connected to the positive electrode of the third diode D3. The negative electrode of the third diode D3 is connected to the positive electrode of the third capacitor C3 and is electrically connected to the corresponding first node SWA. The second terminal of the winding T3 is connected to the negative electrode of the third capacitor C3 and is electrically connected to the second node SWB. Consequently, the precharge for the storage device Cb can be realized. In an embodiment, the rectifier filter circuit 32 further includes a third resistor R3 and a fourth resistor R4. One terminal of the third resistor R3 is connected to the negative electrode of the third diode D3 and the positive electrode of the third capacitor C3, and the other terminal of the third resistor R3 is connected to the corresponding first node SWA. One terminal of the fourth resistor R4 is connected to the second terminal of the winding T3 and the negative electrode of the third capacitor C3, and the other terminal of the fourth resistor R4 is connected to the corresponding second node SWB. Therefore, the third and fourth resistors R3 and R4 can work as current limiting resistors for limiting the charge current provided to the storage device Cb. In an embodiment, the power circuit 22 further includes a winding T4, a fourth diode D4 and a capacitor Cvcc. One terminal of the winding T4 is connected to the positive electrode of the fourth diode D4, the negative electrode of the fourth diode D4 is connected to one terminal of the capacitor Cvcc and the power conversion circuit, and the other terminal of the winding T4 is connected to the other terminal of the capacitor Cvcc and is grounded. Consequently, through the winding T4 negatively coupled to the magnetic element T1, the supply voltage Vcc is generated and is supplied to the power conversion circuit.

The actual implementation of the first power conversion circuit with N equal to 2 is exemplified as follows according to the embodiments shown in FIG. 4A and FIG. 5A.

In the first embodiment shown in FIG. 4A, N equals 2, and the power conversion circuit 11 includes two switching power conversion units and one storage device. The storage device is the capacitor Cb, and there are the first node SWA and the second node SWB at the two ends of the capacitor Cb respectively. The first switching power conversion unit includes a first switch M11, a second switch M21 and an inductor L1. The second switching power conversion unit includes a first switch M12, a second switch M22 and an inductor L2. Please refer to FIG. 3A and FIG. 3B, Ts is the switching period, and D is the duty ratio of the switching period. FIG. 3A and FIG. 3B shows the switch driving signals of the power conversion circuit 11 with D smaller than 50% and D larger than 50% respectively. The control sequences of the first switches M11 and M12 are 180 degrees out of phase with respect to each other. The driving signals of the first and second switches M11 and M21 are complementary to each other, and the driving signals of the first and second switches M12 and M22 are complementary to each other.

The winding T2 of the precharge circuit 31 has the first terminal T2a and the second terminal T2b, and the turns ratio of the magnetic element T1 of the power circuit 21 to the winding T2 is 2:1. Please refer to the oscillogram shown in FIG. 4B, where Daux is the duty ratio of the auxiliary power. When the fourth switch S1 is turned on and the fifth switch S2 is turned off, the voltage VT1 on the magnetic element T1 equals Vin−Vcc, and the voltage VT2 on the winding T2 equals (Vin−Vcc)/2. Meanwhile, the potential at the first terminal T2a is positive, the potential at the second terminal T2b is negative, and the first diode D1 is turned on. Therefore, the voltage VC1 on the first capacitor C1 equals (Vin−Vcc)/2. On the contrary, when the fourth switch S1 is turned off and the fifth switch S2 is turned on, the voltage VT1 on the magnetic element T1 equals −Vcc. Meanwhile, the potential at the first terminal T2a is negative, the potential at the second terminal T2b is positive, and the second diode D2 is turned on. Therefore, the voltage VC2 on the second capacitor C2 equals Vcc/2. From above, it is noted that the superposition voltage (equals Vin/2) on the two ends of the first and second capacitors C1 and C2 charge the capacitor Cb through the first and second resistors R1 and R2, which makes the voltage on the capacitor Cb equal to Vin/2. Moreover, when the first switch M11 is turned on, the voltage stress on the second switches M21 and M22 equals the difference between the input voltage Vin and the voltage on the capacitor Cb (i.e., Vin−Vin/2=Vin/2). Since the voltage stress is low, it is allowed to employ the switches with low withstanding voltage as the second switches M21 and M22.

In the second embodiment shown in FIG. 5A, N equals 2, the power conversion circuit 11 is similar to the power conversion circuit 11 of FIG. 2A and FIG. 4A, and the detailed description thereof is omitted herein. The turns ratio of the magnetic element T1 of the power circuit 22 to the winding T3 of the precharge circuit 32 is 2:1, and the winding T3 is positively coupled to the magnetic element T1. Please refer to the oscillogram shown in FIG. 5B. When the sixth switch S3 is turned on, the voltage VT1 on the magnetic element T1 equals Vin, the voltage on the winding T3 equals Vin/2, and the third diode D3 is turned on. Therefore, the voltage VC3 on the third capacitor C3 equals Vin/2. When the sixth switch S3 is turned off, the supply voltage Vcc is provided through the negative coupling between the winding T4 and the magnetic element T1. Meanwhile, the voltage VC3 on the third capacitor C3 charges the capacitor Cb through the third resistor R3 and the fourth resistor R4, which makes the voltage on the capacitor Cb equal to Vin/2. Moreover, when the first switch M11 is turned on, the voltage stress on the second switches M21 and M22 equals the difference between the input voltage Vin and the voltage on the capacitor Cb (i.e., Vin−Vin/2=Vin/2). Since the voltage stress is low, it is allowed to employ the switches with low withstanding voltage as the second switches M21 and M22.

Figure 2B:
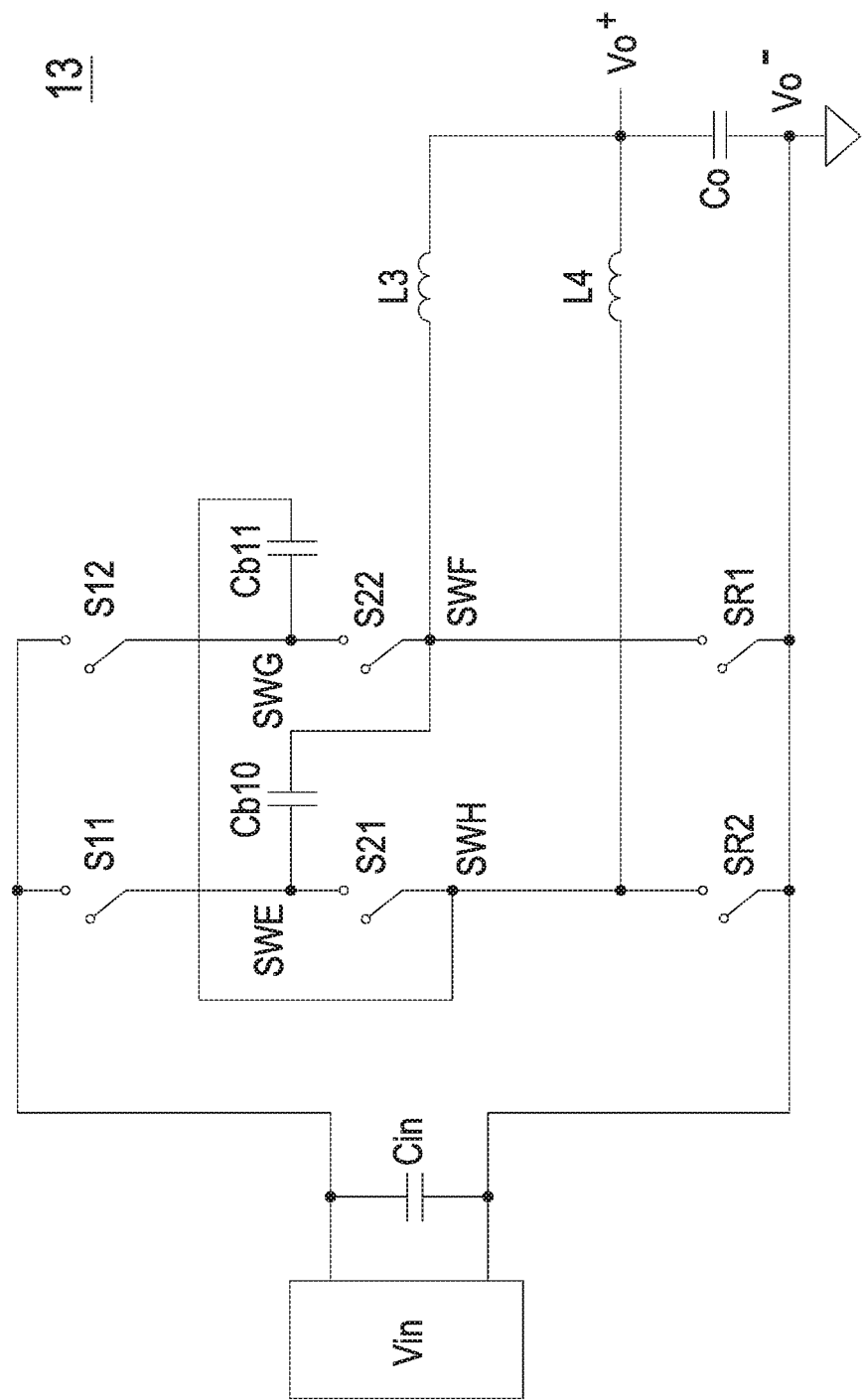
FIG. 2B is a schematic circuit diagram illustrating a second power conversion circuit according to an embodiment of the present disclosure.
Figure 3C:
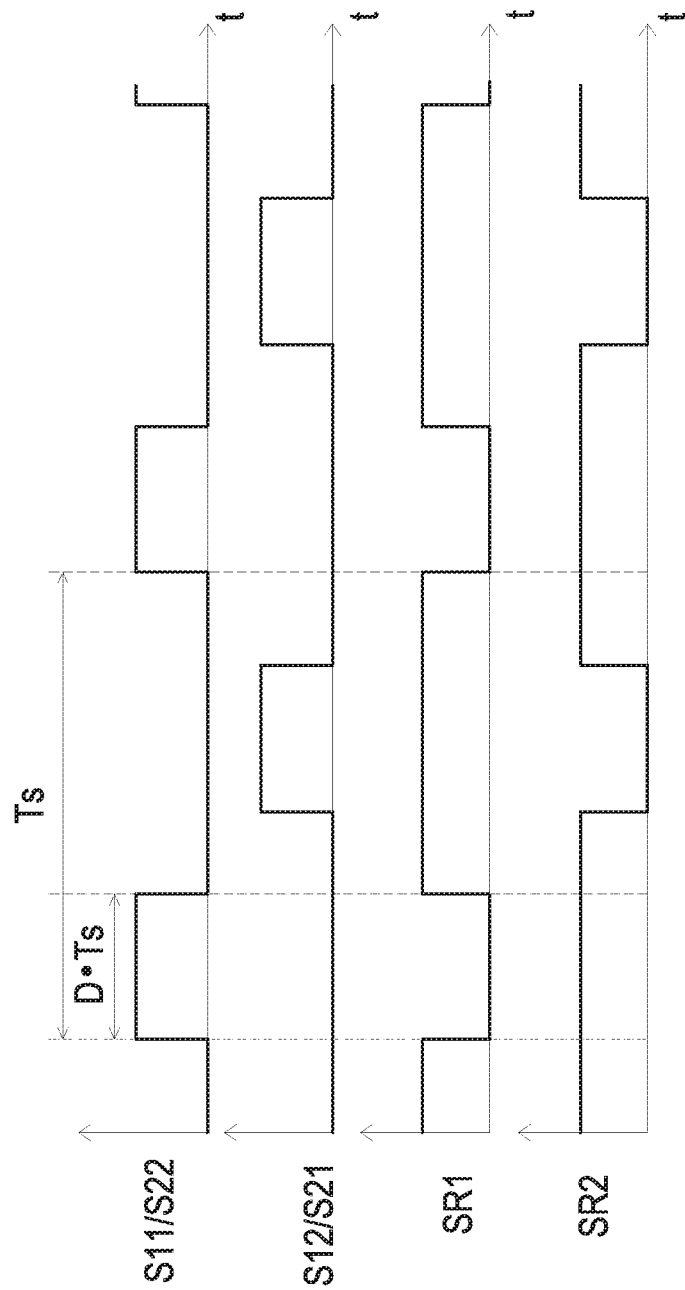
FIG. 3C is a schematic oscillogram showing the driving signals of the switches of the second power conversion circuit.
Figure 5C:
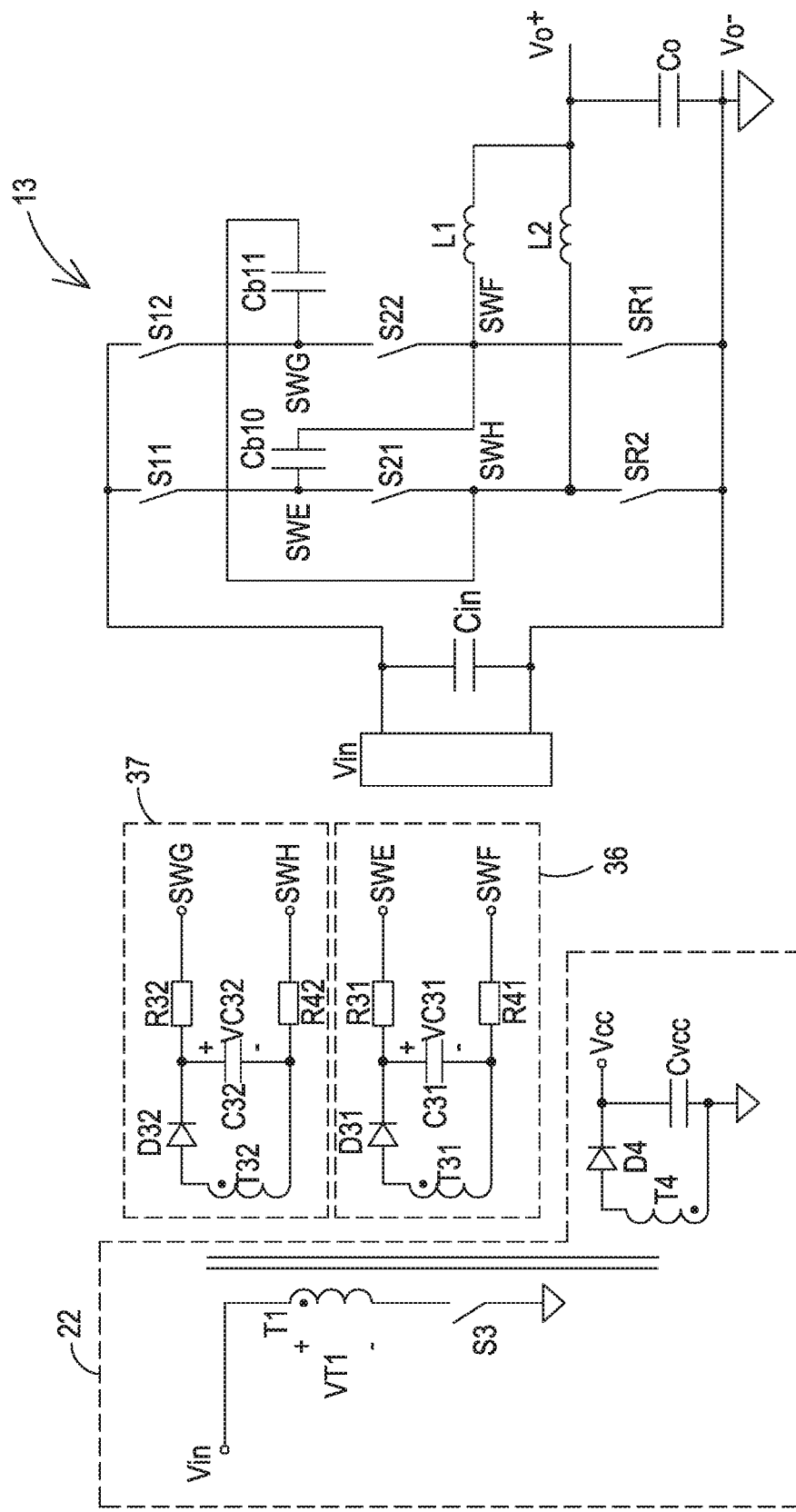
FIG. 5C is a schematic circuit diagram illustrating a second power conversion system according to a third embodiment of the present disclosure.
Figure 5D:
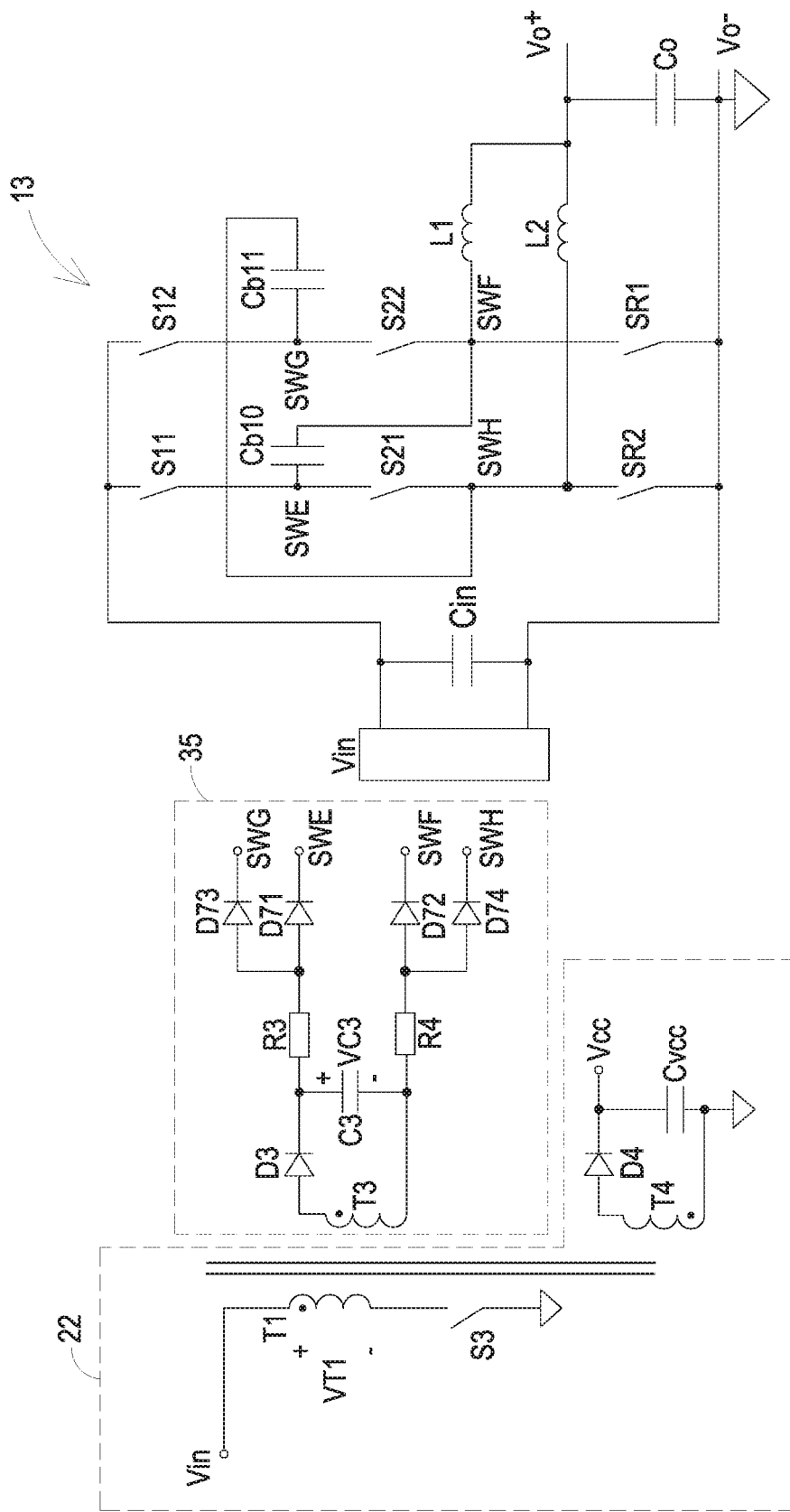
FIG. 5D is a schematic circuit diagram illustrating a second power conversion system according to a fourth embodiment of the present disclosure.

FIG. 2B is a schematic circuit diagram illustrating a second power conversion circuit according to an embodiment of the present disclosure. FIG. 3C is a schematic oscillogram showing the driving signals of the switches of the second power conversion circuit. FIG. 5C is a schematic circuit diagram illustrating a second power conversion system according to a third embodiment of the present disclosure. FIG. 5D is a schematic circuit diagram illustrating a second power conversion system according to a fourth embodiment of the present disclosure. As shown in FIG. 5C and FIG. 5D, the second power conversion system of the present disclosure includes a second power conversion circuit shown in FIG. 2B, a power circuit and at least one precharge circuit.

The second power conversion circuit includes an input port, an output port, N switching power conversion units and N storage devices, where N is a positive integer larger than or equal to 2. The input port and the output port are configured to receive an input voltage Vin and generate an output voltage Vo respectively. Each of the N switching power conversion units includes a first switch, a second switch and a third switch. The first, second and third switches operate periodically according to a switching period. The switching period has a duty ratio. In addition, the first terminal of the first switch is electrically connected to the input port, and the first terminal of the storage device is electrically connected to the second terminal of the first switch. The second terminal of the storage device is electrically connected to the second terminal of the second switch and one terminal of the third switch, and the other terminal of the third switch is grounded. The first terminal of the second switch is electrically connected to the second terminal of the first switch of another switching power conversion unit.

The second power conversion system further includes a power circuit. The power circuit is electrically connected to the second power conversion circuit for receiving the input voltage Vin, and the power circuit includes a magnetic element T1. The magnetic element T1 is for example but not limited to an inductor or a transformer. In an embodiment, the power circuit further outputs a supply voltage Vcc to the power conversion circuit so as to supply power for the control and driving chips in the power conversion circuit. As shown in FIG. 5C and FIG. 5D, the power circuit may be the flyback circuit shown in FIG. 5A, and the detailed description thereof is omitted herein.

The second power conversion system further includes at least one precharge circuit. The number of the precharge circuit is larger than or equal to 1 and is smaller than or equal to N. Each precharge circuit includes a winding and a rectifier filter circuit connected to each other. The winding is coupled to the magnetic element T1 for receiving a conversion voltage. The output of the rectifier filter circuit is electrically connected to the first and second nodes at two ends of the corresponding storage device respectively. Consequently, the rectifier filter circuit receives the conversion voltage and outputs a charge voltage to the corresponding storage device. In addition, the turns ratio of the winding of the precharge circuit configured for charging the storage device to the magnetic element is 1:2.

In an embodiment, the second power conversion system may include one precharge circuit, and the one precharge circuit outputs charge voltage to the N storage devices. In another embodiment, the second power conversion system may include N precharge circuits, and the N precharge circuits are corresponding to the N storage devices one-to-one so as to charge the corresponding storage device respectively. In further another embodiment, some storage devices of the N storage devices share one precharge circuit. Taking the second power conversion circuit including two switching power conversion units as an example, the precharge circuit therefor is exemplified as follows. Further, the second power conversion circuit includes two storage device, which are storage capacitors Cb10 and Cb11.

In an embodiment, as shown in FIG. 5C, the second power conversion system includes two precharge circuits 36 and 37. In these two precharge circuits 36 and 37, two windings T31 and T32 are both positively coupled to the magnetic element T1, and each of the two windings T31 and T32 has a first terminal and a second terminal. One rectifier filter circuit includes a third diode D31 and a third capacitor C31, and the other rectifier filter circuit includes a third diode D32 and a third capacitor C32. The first terminal of the winding T31 is connected to the positive electrode of the third diode D31, and the negative electrode of the third diode D31 is connected to the positive electrode of the third capacitor C31 and is electrically connected to the first node SWE of the storage device Cb10. The second terminal of the winding T31 is electrically connected to the second node SWF of the storage device Cb10. Consequently, the precharge for the storage device Cb10 can be realized. The first terminal of the winding T32 is connected to the positive electrode of the third diode D32, and the negative electrode of the third diode D32 is connected to the positive electrode of the third capacitor C32 and is electrically connected to the first node SWG of the storage device Cb11. The second terminal of the winding T32 is electrically connected to the second node SWH of the storage device Cb11. Consequently, the precharge for the storage device Cb11 can be realized.

In another embodiment, the second power conversion system includes one precharge circuit 35. In the precharge circuit 35, the winding T3 is positively coupled to the magnetic element T1, the winding T3 has a first terminal and a second terminal, and the rectifier filter circuit includes a third diode D3 and a third capacitor C3. The first terminal of the winding T3 is connected to the positive electrode of the third diode D3, the negative electrode of the third diode D3 is connected to the positive electrode of the third capacitor C3, and the two ends of the third capacitor C3 are electrically connected to two sets of isolation diodes (D73, D74) and (D71, D72) respectively. The third capacitor C3 precharges the storage devices Cb10 and Cb11 through the two sets of isolation diodes. In particular, the positive electrode of the third capacitor C3 is electrically connected to the positive electrodes of the two isolation diodes D71 and D73, and the negative electrodes of the two isolation diodes D71 and D73 are electrically connected to the corresponding first nodes SWE and SWG respectively. The negative electrode of the third capacitor C3 (i.e., the second terminal of the winding T3) is electrically connected to the positive electrodes of the two isolation diodes D72 and D74, and the negative electrodes of the two isolation diodes D72 and D74 are electrically connected to the corresponding second nodes SWF and SWH respectively. Consequently, the precharge for the storage devices Cb10 and Cb11 can be realized.

The actual implementation of the second power conversion circuit with N equal to 2 is exemplified as follows according to the embodiments shown in FIG. 5C and FIG. 5D.

In the third embodiment shown in FIG. 5C, N equals 2, and the second power conversion circuit 13 includes two switching power conversion units and two storage devices. The first switching power conversion unit includes a first switch S11, a second switch S22, a third switch SR1 and an inductor L1. The second switching power conversion unit includes a first switch S12, a second switch S21, a third switch SR2 and an inductor L2. The storage devices are the capacitors Cb10 and Cb11. There are the first node SWE and the second node SWF at two ends of the capacitor Cb10 respectively, and there are the first node SWG and the second node SWH at two ends of the capacitor Cb11 respectively. Please refer to FIG. 3C, where Ts is the switching period, and D is the duty ratio of the switching period. The first switch S11 and the second switch S22 are turned on and off simultaneously, and the first switch S12 and the second switch S21 are turned on and off simultaneously. The control sequences of the first switches S11 and S12 are 180 degrees out of phase with respect to each other. The driving signals of the first and third switches S11 and SR1 are complementary to each other, and the driving signals of the first and third switches S12 and SR2 are complementary to each other.

The turns ratio of the magnetic element T1 of the power circuit 22 to the winding T31 of the precharge circuit 36 is 2:1, and the turns ratio of the magnetic element T1 of the power circuit 22 to the winding T32 of the precharge circuit 37 is 2:1. Moreover, the winding T31 is positively coupled to the magnetic element T1, and the winding T32 is positively coupled to the magnetic element T1. Please refer to the oscillogram shown in FIG. 5B. When the sixth switch S3 is turned on, the voltage VT1 on the magnetic element T1 equals Vin, and the voltages on the windings T31 and T32 both equal Vin/2, and the third diodes D31 and D32 are turned on. Therefore, the voltages VC31 and VC32 on the third capacitors C31 and C32 respectively both equal Vin/2. When the sixth switch S3 is turned off, the supply voltage Vcc is provided through the negative coupling between the winding T4 and the magnetic element T1. Meanwhile, the voltage VC31 on the third capacitor C31 charges the capacitor Cb10 through the third resistor R31 and the fourth resistor R41, which makes the voltage on the capacitor Cb10 equal to Vin/2. Similarly, the voltage VC32 on the third capacitor C32 charges the capacitor Cb11 through the third resistor R32 and the fourth resistor R42, which makes the voltage on the capacitor Cb11 equal to Vin/2. Moreover, when the first switch S11 and the second switch S22 are turned on, the voltage stress on the third switch SR1 equals the difference between the input voltage Vin and the voltage on the capacitor Cb10 (i.e., Vin−Vin/2=Vin/2). When the first switch S12 and the second switch S21 are turned on, the voltage stress on the third switch SR2 equals the difference between the input voltage Vin and the voltage on the capacitor Cb11 (i.e., Vin−Vin/2=Vin/2). Since the voltage stress is low, it is allowed to employ the switches with low withstanding voltage as the third switches SR1 and SR2.

In the fourth embodiment shown in FIG. 5D, N equals 2. The power conversion circuit 13 is similar to the power conversion circuit 13 of FIG. 2B and FIG. 5C, and the detailed description thereof is omitted herein. The turns ratio of the magnetic element T1 of the power circuit 22 to the winding T3 of the precharge circuit 35 is 2:1, and the winding T3 is positively coupled to the magnetic element T1. Please refer to the oscillogram shown in FIG. 5B. With the same work principle, the voltage VC3 on the third capacitor C3 equals Vin/2. The voltage VC3 charges the capacitor Cb10 through the third resistor R3, the fourth resistor R4 and the isolation diodes D71 and D72, which makes the voltage on the capacitor Cb10 equal to Vin/2. The voltage VC3 charges the capacitor Cb11 through the third resistor R3, the fourth resistor R4 and the isolation diodes D73 and D74, which makes the voltage on the capacitor Cb11 equal to Vin/2. The other work principle is the same as that shown in FIG. 5C, and the detailed description thereof is omitted herein.

Naturally, in the above-mentioned embodiments, N may be a positive integer larger than or equal to 2 and is not limited to 2. Namely, the power conversion circuit may be a circuit with two or more phases. In order to clarify the variation of the power conversion system as N increases, the power conversion system with N equal to 3 is exemplified as follows.

Figure 6A:
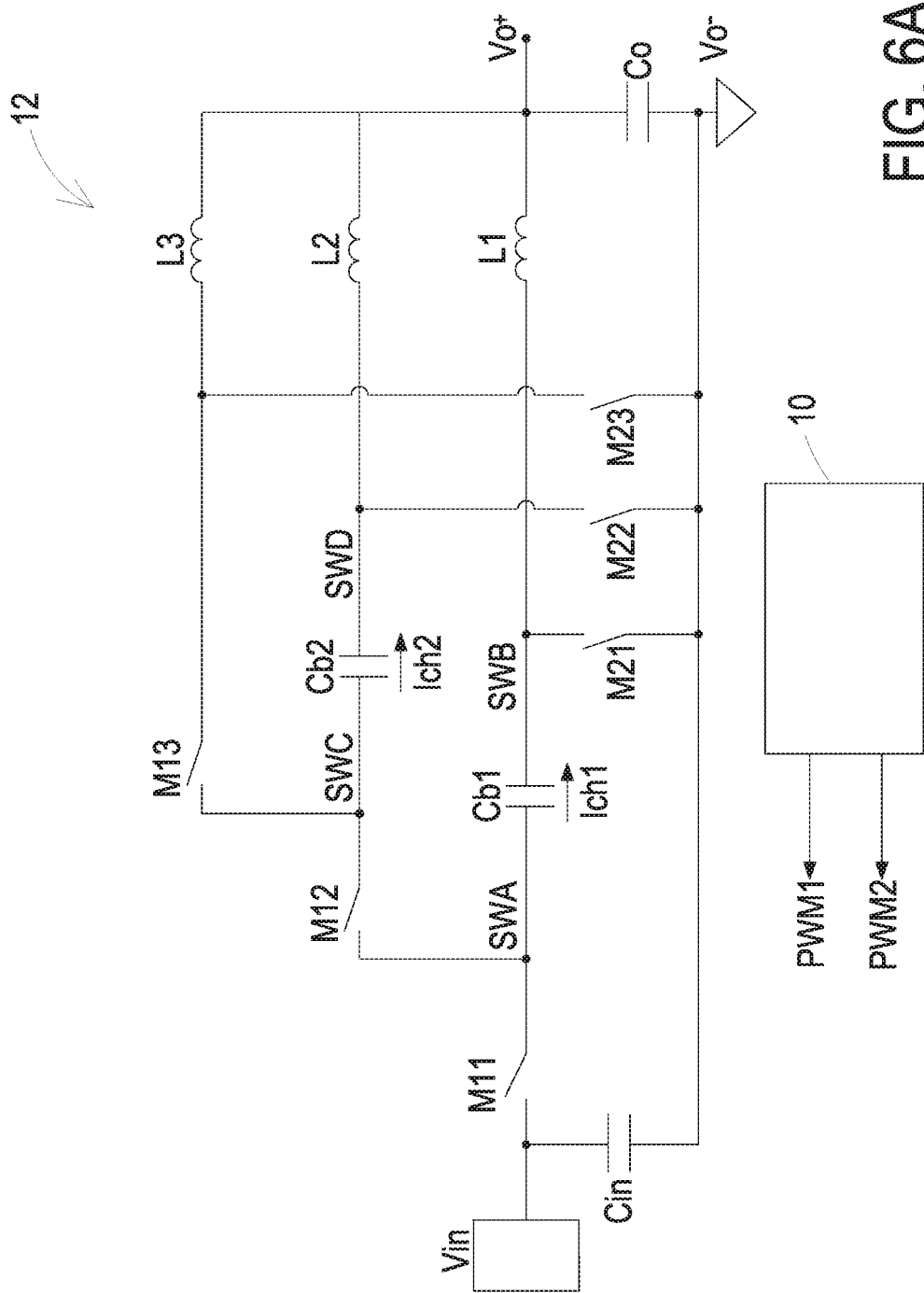
FIG. 6A is a schematic circuit diagram illustrating a first power conversion circuit according to a fifth embodiment of the present disclosure.
Figure 6B:
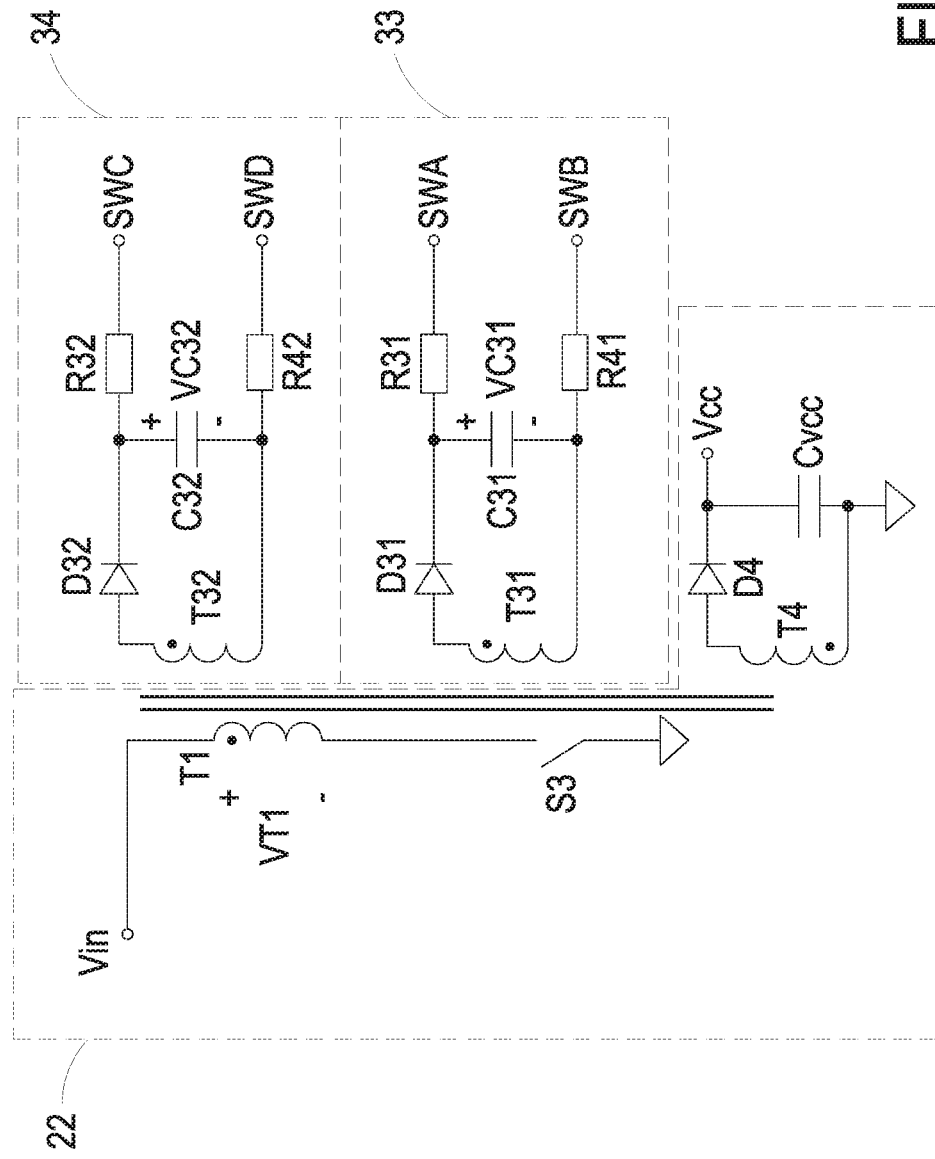
FIG. 6B is a schematic circuit diagram illustrating a power circuit and a precharge circuit that are applied to the first power conversion circuit of the fifth embodiment shown in FIG. 6A.

FIG. 6A is a schematic circuit diagram illustrating a first power conversion circuit according to a fifth embodiment of the present disclosure. FIG. 6B is a schematic circuit diagram illustrating a power circuit and a precharge circuit that are applied to the first power conversion circuit of the fifth embodiment shown in FIG. 6A. As shown in FIG. 6A and FIG. 6B, N equals 3, and the first power conversion circuit 12 includes three switching power conversion units and two storage devices. The two storage devices are capacitors Cb1 and Cb2 respectively. Two ends of the capacitor Cb1 have a first node SWA and a second node SWB respectively, and two ends of the capacitor Cb2 have a first node SWC and a second node SWD respectively. The first switching power conversion unit includes a first switch M11, a second switch M21 and an inductor L1, the second switching power conversion unit includes a first switch M12, a second switch M22 and an inductor L2, and the third switching power conversion unit includes a first switch M13, a second switch M23 and an inductor L3. The controller 10 generates two control signals PWM1 and PWM2, and the two control signals are 180 degrees out of phase with respect to each other. The control signal PWM1 is utilized to control the on and off of the first switches M11 and M13, and the control signal PWM2 is utilized to control the on and off of the first switch M12. The control signal of the second switches M21 and M23 is complementary to the control signal PWM1, and the control signal of the second M22 is complementary to the control signal PWM2. This control method can also be applied to the power conversion circuit including N switching power conversion units and N−1 storage devices connected in series. In particular, in the odd-numbered switching power conversion units, the first switch is controlled by the control signal PWM1, and the control signal of the second switch is complementary to the control signal PWM1. In the even-numbered switching power conversion units, the first switch is controlled by the control signal PWM2, and the control signal of the second switch is complementary to the control signal PWM2.

The circuit structure of the power circuit 22 and the precharge circuit 33 in the case that the power circuit is a flyback circuit is exemplified as follows, but not limited thereto. If the power circuit is a buck circuit, the circuit structure of the power circuit and the multi-branch precharge circuit can be derived and constructed according to the circuit structure shown in FIG. 4A. Please refer to FIG. 6B. The turns ratio of the magnetic element T1 to the winding T31 of the first precharge circuit 33 is 3:2, and the winding T31 is positively coupled to the magnetic element T1. The turns ratio of the magnetic element T1 to the winding T32 of the second precharge circuit 34 is 3:1, and the winding T32 is positively coupled to the magnetic element T1. The output of the first precharge circuit 33 is electrically connected to the first and second nodes SWA and SWB at two ends of the capacitor Cb1 respectively. The output of the second precharge circuit 34 is electrically connected to the first and second nodes SWC and SWD at two ends of the capacitor Cb2 respectively. Therefore, the third capacitor C31 of the first precharge circuit 33 can charge the capacitor Cb1 to 2Vin/3 through the third resistor R31 and the fourth resistor R41, and the third capacitor C32 of the second precharge circuit 34 can charge the capacitor Cb2 to Vin/3 through the third resistor R32 and the fourth resistor R42. Moreover, when the first switches M11 and M13 are turned on, or when the first switch M12 is turned on, the voltage stress on the second switches M21, M22 and M23 equals the difference between the input voltage Vin and the voltage on the capacitor Cb1 (i.e., Vin−2Vin/3=Vin/3). Since the voltage stress is low, it is allowed to employ the switches with low withstanding voltage as the second switches M21, M22 and M23.

Figure 6C:
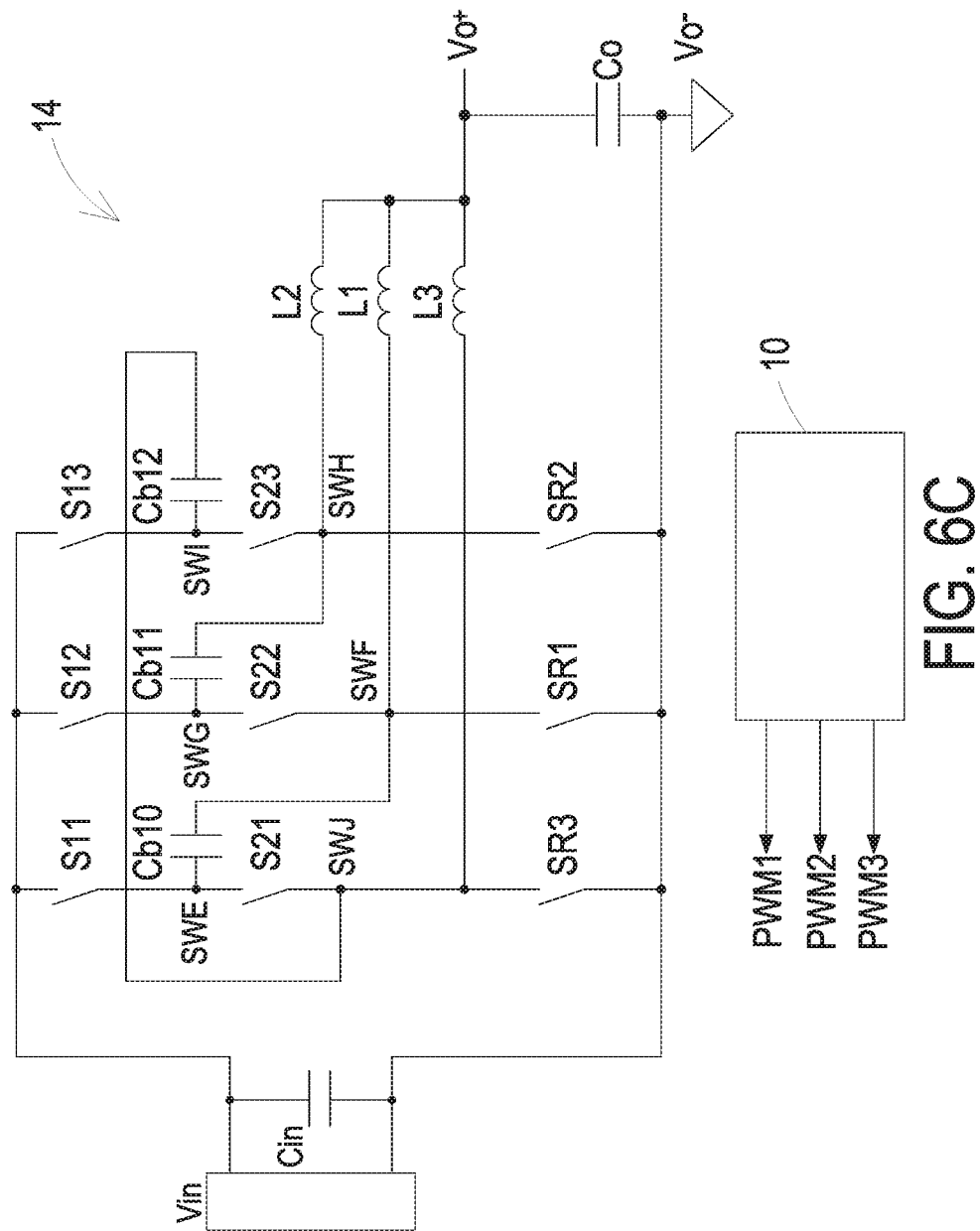
FIG. 6C is a schematic circuit diagram illustrating a second power conversion circuit according to a sixth embodiment of the present disclosure.
Figure 6D:
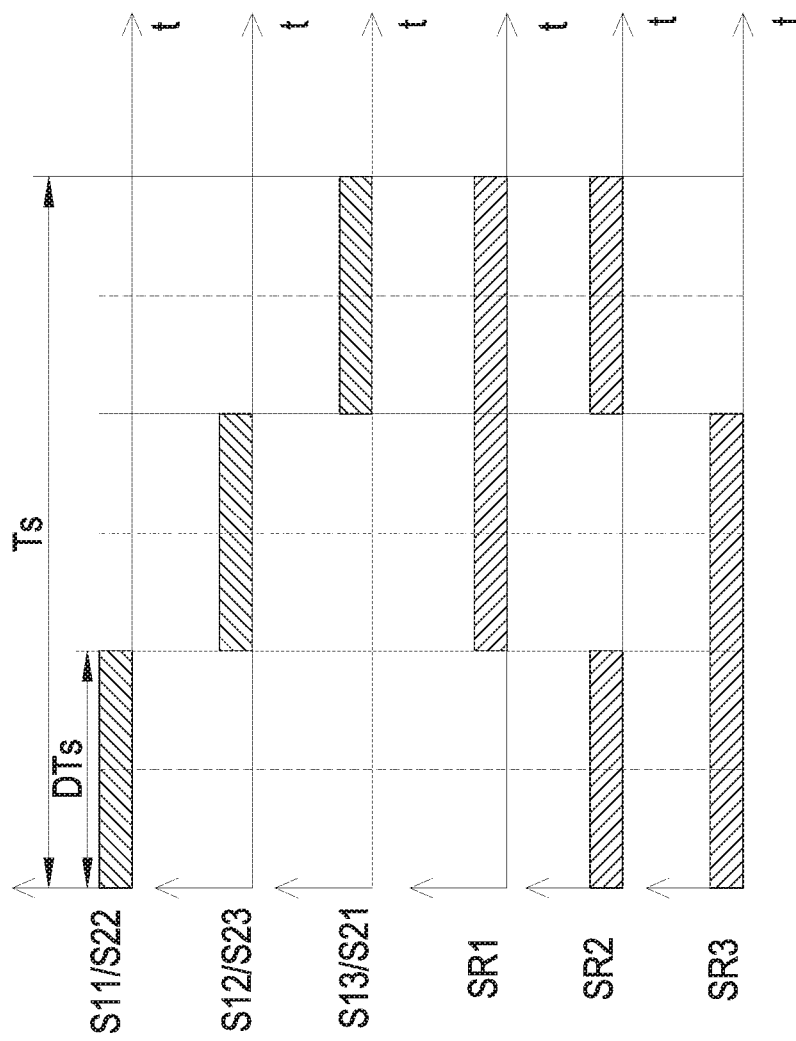
FIG. 6D shows the timing diagrams of the second power conversion circuit of FIG. 6C.

FIG. 6C is a schematic circuit diagram illustrating a second power conversion circuit according to a sixth embodiment of the present disclosure. FIG. 6D shows the timing diagrams of the second power conversion circuit of FIG. 6C. As shown in FIG. 6C, N equals 3, the second power conversion circuit 14 includes three switching power conversion units and three storage devices. The three storage devices are capacitors Cb10, Cb11 and Cb12 respectively. Two ends of the capacitor Cb10 have a first node SWE and a second node SWF respectively, two ends of the capacitor Cb11 have a first node SWG and a second node SWH respectively, and two ends of the capacitor Cb12 have a first node SWI and a second node SWJ respectively. The first switching power conversion unit includes a first switch S11, a second switch S22, a third switch SR1 and an inductor L1. The second switching power conversion unit includes a first switch S12, a second switch S23, a third switch SR2 and an inductor L2. The third switching power conversion unit includes a first switch S13, a second switch S21, a third switch SR3 and an inductor L3. Please refer to FIG. 6D, where Ts is the switching period, and D is the duty ratio of the switching period. FIG. 6D shows the switch driving signals of the second power conversion circuit 14 of FIG. 6C with D smaller than 50%. In each switching power conversion unit, the control signals of the first and second switches are the same, and the control signal of the third switch is complementary to that of the second switch. Further, the control signals of the first switches of the three switching power conversion units are 120 degrees out of phase with respect to each other in sequence. Namely, the controller 10 generates three control signals PWM1, PWM2 and PWM3, which are 120 degrees out of phase with respect to each other in sequence. This control method can also be applied to the second power conversion circuit including N switching power conversion units. In particular, the N first switches of the N switching power conversion units are controlled by N control signals respectively, and the N control signals are 360/N degrees out of phase with respect to each other in sequence. In each switching power conversion unit, the control signals of the first and second switches are the same, and the control signal of the third switch is complementary to that of the first switch.

For realizing the precharge for the storage device of the second power conversion circuit of FIG. 6C, in an embodiment, the second power conversion system may include three precharge circuits. The precharge circuit is similar to that shown in FIG. 5C, namely the three precharge circuits are utilized to charge the three storage devices, such as the capacitors Cb10, Cb11 and Cb12, respectively. Each precharge circuit includes a winding positively coupled to the magnetic element T1 of the power circuit 22, and the turns ratio of the magnetic element T1 to each winding is 2:1. In another embodiment, the second power conversion system may include one precharge circuit, and the precharge circuit is similar to that shown in FIG. 5D. Different from the precharge circuit shown in FIG. 5D, the precharge circuit in this embodiment utilizes three sets of isolation diodes to form three sets of charging output terminals for charging the storage devices Cb10, Cb11 and Cb12 respectively. In addition, the winding of the precharge circuit is positively coupled to the magnetic element T1 of the power circuit 22, and the turns ratio of the magnetic element T1 to the winding is 2:1. In further another embodiment, the second power conversion system may include two precharge circuits. One of the two precharge circuits is similar to that shown in FIG. 5C, and the other precharge circuit is similar to that shown in FIG. 5D, so as to charge the storage devices Cb10, Cb11 and Cb12. In the said three embodiments, the work principle thereof is the same as that shown in FIG. 5C and FIG. 5D, thus is omitted herein.

In the power conversion system, the power in the precharge circuit is provided from the magnetic element of the power circuit. There is a voltage on the magnetic element, and the magnetic element is coupled to the winding of the precharge circuit so as to provide the power for the precharge circuit. In addition, all the diodes of the precharge circuits of FIG. 4A, FIG. 5A, FIG. 5C, FIG. 5D and FIG. 6B (e.g., the diodes D1 and D2 of FIG. 4A, the diode D3 of FIG. 5A, the diodes D31 and D32 of FIG. 5C, the diode D3 of FIG. 5D and the diodes D31 and D32 of FIG. 6B) can be replaced by controllable switches.

For the first and second power conversion circuits, due to the existence of storage devices, the circuit wiring is complicated, and the loop formed by the storage device and switch component is large. Accordingly, the peak voltage generated while turning on or off switch becomes larger, thus there is a need of providing a clamping circuit to protect the grounded switch. In order to prevent the peak voltage generated while turning on or off switch from damaging the grounded switch of the switching power conversion unit, the clamping circuit is disposed at two ends of the grounded switch. The clamping circuit includes an absorbing circuit and a discharging circuit. The absorbing circuit is configured to absorb the peak voltage on the grounded switch so as to protect the grounded switch. The discharging circuit feeds the power absorbed by the absorbing circuit back to the storage component of the circuit, so as to reduce the power loss. In particular, in an embodiment, the power conversion system further includes N clamping circuits. Each of the N clamping circuits is connected to the corresponding grounded switch of the switching power conversion unit so that the voltage on the corresponding grounded switch is clamped.

Figure 7A:
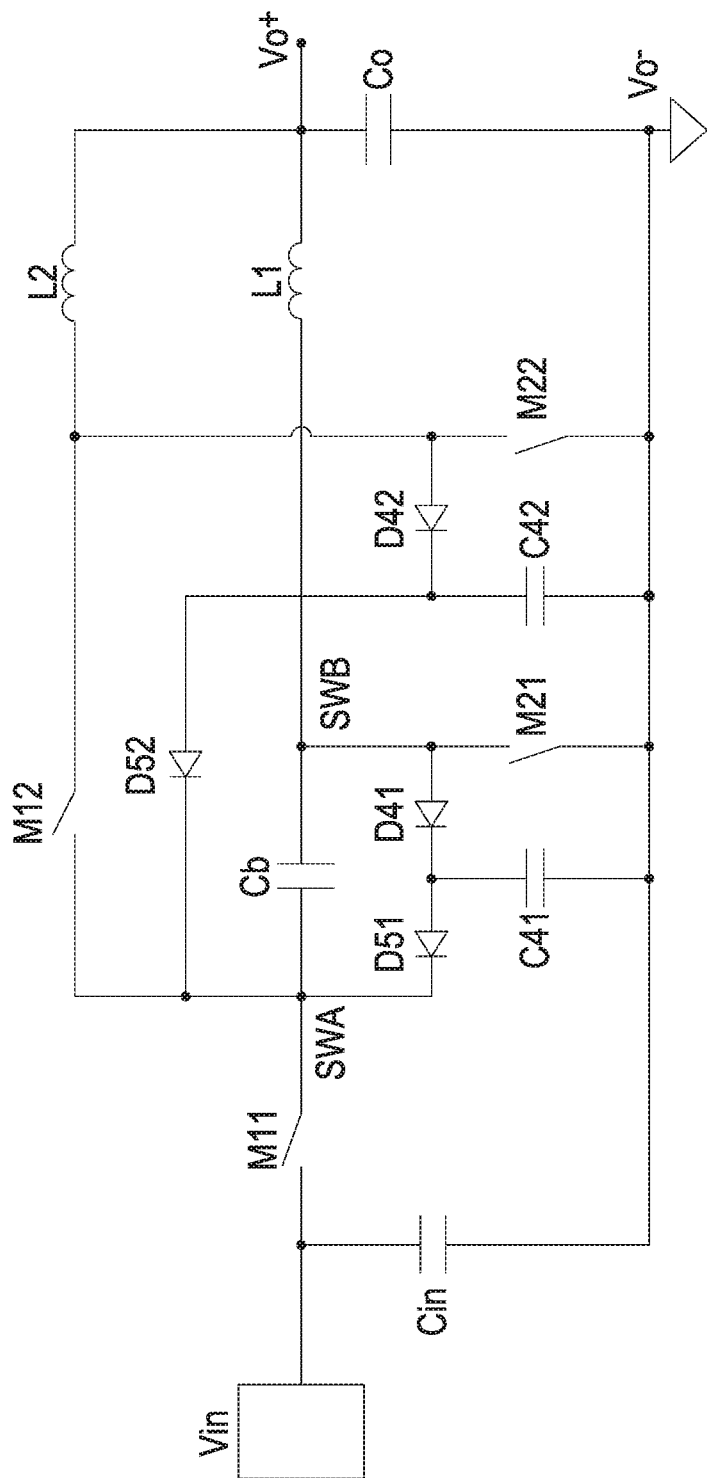
FIG. 7A is a schematic circuit diagram illustrating a first power conversion circuit and clamping circuits according to a seventh embodiment of the present disclosure.
Figure 7B:
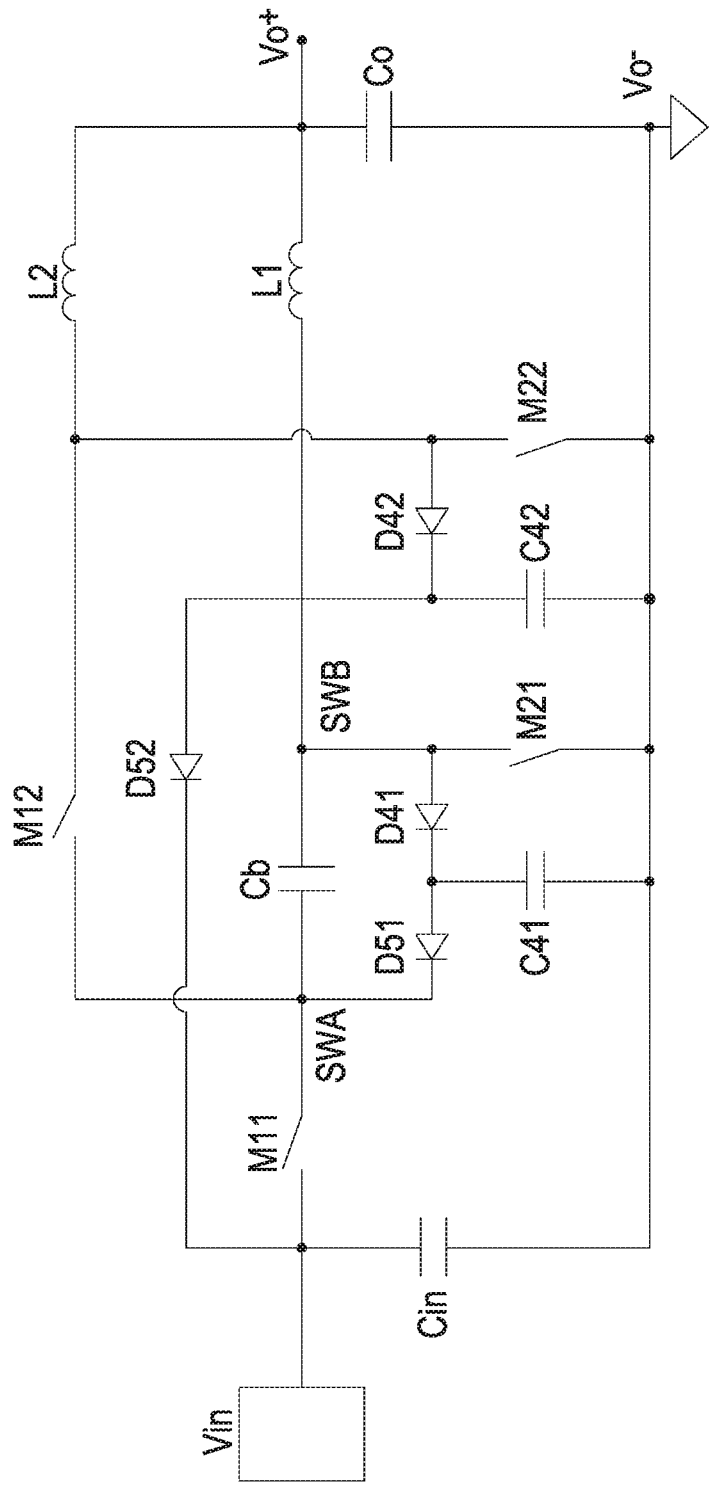
FIG. 7B is a schematic circuit diagram illustrating a first power conversion circuit and clamping circuits according to an eighth embodiment of the present disclosure.

FIG. 7A is a schematic circuit diagram illustrating a first power conversion circuit and clamping circuits according to a seventh embodiment of the present disclosure. FIG. 7B is a schematic circuit diagram illustrating a first power conversion circuit and clamping circuits according to an eighth embodiment of the present disclosure. As shown in FIG. 7A and FIG. 7B, each of the N switching power conversion units of the first power conversion circuit is corresponding to one clamping circuit. Therefore, for example, the voltage on the second switches M21 and M22 are clamped. When the duty ratio of the switching period of the first switch is smaller than or equal to 50%, as shown in FIG. 7A, each clamping circuit includes an absorbing circuit and a discharging circuit. The absorbing circuit includes an absorbing diode and an absorbing capacitor, and the discharging circuit includes a discharging diode. The absorbing diode is connected to the absorbing capacitor in series. The positive electrode of the absorbing diode is connected to one terminal of the corresponding second switch, one terminal of the absorbing capacitor is connected to the negative electrode of the absorbing diode, and the other terminal of the absorbing capacitor is connected to the other terminal of the corresponding second switch. One terminal of the discharging circuit is connected to the negative electrode of the absorbing diode, and the other terminal of the discharging circuit is connected to the corresponding first node. When the duty ratio is larger than 50%, as shown in FIG. 7B, the connection relations of the negative electrode of the discharging diode of some clamping circuits are different from that of the clamping circuit with the duty ratio smaller than or equal to 50%. In specific, in the case that the duty ratio is larger than 50%, the negative electrode of the discharging diode of the first clamping circuit is connected to the corresponding first node, and the negative electrodes of the discharging diodes of other clamping circuits are all connected to the positive input port of the power conversion circuit.

In the seventh embodiment shown in FIG. 7A, N equals 2, and the duty ratio of the switching period of the first switch is smaller than or equal to 50%. The power conversion circuit is the same as that shown in FIG. 2A. With regard to the first clamping circuit, which includes an absorbing circuit and a discharging circuit, the absorbing circuit includes an absorbing diode D41 and an absorbing capacitor C41 connected in series. The negative electrode of the absorbing diode D41 is connected to the absorbing capacitor C41. The absorbing circuit is connected to the two ends of the second switch M21 in parallel. Further, the absorbing circuit is disposed near the second switch M21 on the layout of the printed circuit board, so as to achieve the shortest wiring path between the absorbing circuit and the second switch M21. In addition, in the first clamping circuit, the discharging circuit includes a discharging diode D51. The positive electrode of the discharging diode D51 is connected to the negative electrode of the absorbing diode D41, and the negative electrode of the discharging diode D51 is connected to the first node SWA. When the first switch M11 is turned on, there is a voltage drop of Vin/2 on the two ends of the second switch M21 instantaneously, and the voltage drop includes a peak voltage generated at the conduction moment. Meanwhile, the absorbing diode D41 is turned on, the absorbing capacitor C41 absorbs the peak voltage generated at the conduction moment of the first switch M11. When the first switch M11 is turned off and the second switch M21 is turned on, the drain-source voltage Vds on the two ends of the second switch M21 is decreased, the absorbing diode D41 is cut off inversely, and the discharging diode D51 of the discharging circuit is turned on. Consequently, the power on the absorbing capacitor C41 is discharged and fed back to the storage device Cb of the power conversion circuit through the discharging diode D51.

With regard to the second clamping circuit, which also includes an absorbing circuit and a discharging circuit, the absorbing circuit includes an absorbing diode D42 and an absorbing capacitor C42 connected in series. The negative electrode of the absorbing diode D42 is connected to the absorbing capacitor C42. The absorbing circuit is connected to the two ends of the second switch M22 in parallel. Further, the absorbing circuit is disposed near the second switch M22 on the layout of the printed circuit board, so as to achieve the shortest wiring path between the absorbing circuit and the second switch M22. In addition, in the second clamping circuit, the discharging circuit includes a discharging diode D52. The positive electrode of the discharging diode D52 is connected to the negative electrode of the absorbing diode D42, and the negative electrode of the discharging diode D52 is connected to the first node SWA. When the first switch M12 is turned on, there is a voltage drop of Vin/2 on the two ends of the second switch M22 instantaneously, and the voltage drop includes a peak voltage generated at the conduction moment. Meanwhile, the absorbing diode D42 is turned on, the absorbing capacitor C42 absorbs the peak voltage generated at the conduction moment of the first switch M12. When the voltage on the absorbing capacitor C42 is larger than Vin/2, the discharging diode D52 is turned on. Consequently, the power on the absorbing capacitor C42 is discharged and fed back to the storage device Cb of the power conversion circuit through the discharging diode D52. Therefore, the protection for the second switches M21 and M22 is realized through the clamping circuits.

Usually, in the conventional buck circuit, the power on the absorbing capacitor is fed back to the input capacitor of the converter circuit, and the voltage on the switch is clamped to Vin. However, in the embodiment of the present disclosure, the power on the absorbing capacitor is fed back to the storage device Cb of the power conversion circuit, which can reduce the loss of the peak energy and improves the efficiency of the power conversion circuit. Moreover, since the voltage drop on the two ends of the storage device Cb equals Vin/2 during steady work state, the voltage drops on the second switches M21 and M22 are clamped to Vin/2. Therefore, it is allowed to employ the switch with low withstanding voltage level as the second switch, which reduces the cost.

In the eighth embodiment of the present disclosure shown in FIG. 7B, N equals 2, and the duty ratio of the switching period of the first switch is larger than 50%. The power conversion circuit is similar to that shown in FIG. 2A. The work principle of the first clamping circuit protecting the second switch M21 is similar to that shown in FIG. 7A, and the detailed description thereof is omitted herein. With regard to the second clamping circuit of FIG. 7B, when the first switch M12 and the second switch M21 are both turned on, there is a voltage drop of Vin on the two ends of the second switch M22 instantaneously at the conduction moment of the first switch M11. The voltage drop includes a peak voltage generated at the conduction moment. Meanwhile, the absorbing diode D42 is turned on, the absorbing capacitor C42 absorbs the peak voltage generated at the conduction moment of the first switch M11. When the first switch M12 is turned off and the second switch M22 is turned on, the drain-source voltage Vds on the two ends of the second switch M22 is decreased, the absorbing diode D42 is cut off inversely, and the discharging diode D52 of the discharging circuit is turned on. Consequently, the power on the absorbing capacitor C42 is discharged and fed back to the input capacitor at the input port of the power conversion circuit through the discharging diode D52.

In the embodiments shown in FIG. 7A and FIG. 7B, the mentioned clamping circuit is DCD clamping circuit. For example, the absorbing capacitor C41 and the absorbing diode D41 are connected to the two ends of the second switch M21 in parallel, thus the absorbing loop has short path and achieves good absorbing effect. However, in these embodiments, a voltage ripple is superimposed on the DC potential of the voltage of Vin/2 on the first node SWA, and the voltage ripple causes some energy loss when the power on the absorbing capacitor C41 is discharged to the storage device Cb through the discharging diode D51. In another embodiment, in order to avoid the energy loss, a CDC clamping circuit is provided and is applied to the first power conversion circuit of FIG. 2A. The CDC clamping circuit replaces the DCD clamping circuit disposed at the two ends of the second switch M21 of the first switching power conversion unit. The clamping circuit which is disposed at the two ends of the second switch of any other switching power conversion unit (e.g., the second switch M22) is still DCD clamping circuit.

Figure 7C:
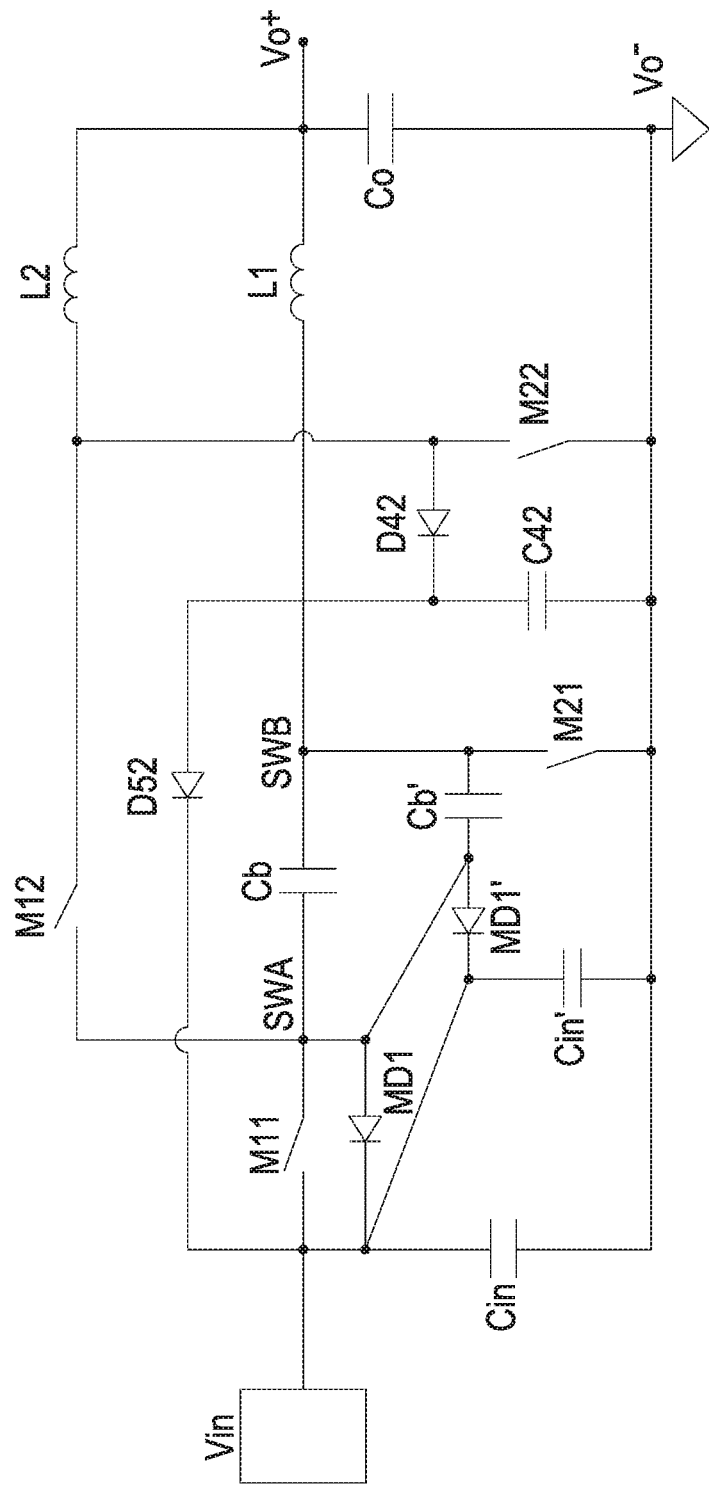
FIG. 7C is a schematic circuit diagram illustrating a first power conversion circuit and clamping circuits according to a ninth embodiment of the present disclosure.

FIG. 7C is a schematic circuit diagram illustrating a first power conversion circuit and clamping circuits according to a ninth embodiment of the present disclosure. In the embodiment shown in FIG. 7C, N equals 2, and the power conversion circuit is the same as that of FIG. 2A. The work principle of the second clamping circuit protecting the second switch M22 is similar to that shown in FIG. 7A and FIG. 7B, and the detailed description thereof is omitted herein. As shown in FIG. 7C, at the moment that the first switch M11 is turned on, there is a voltage drop of Vin/2 on the two ends of the second switch M21 instantaneously, and the voltage drop includes a peak voltage generated at the conduction moment. In this embodiment, a CDC clamping circuit is connected to the two ends of the second switch M21 in parallel, and the CDC clamping circuit forms mirror symmetry relative to the storage device Cb, the input capacitor Cin and the parasitic diode MD1 at the two ends of the first switch M11. The CDC clamping circuit includes an absorbing circuit that includes an absorbing diode MD1' and absorbing capacitors Cb' and Cin'. One terminal of the absorbing capacitor Cb' is serially connected to the positive electrode of the absorbing diode MD1', and one terminal of the absorbing capacitor Cin' is serially connected to the negative electrode of the absorbing diode MD1'. The absorbing circuit is connected to the two ends of the second switch M21 in parallel. Further, the components of the absorbing circuit are disposed near the second switch M21 on the layout of the printed circuit board, so as to achieve the shortest wiring path. In this embodiment, there is no need to dispose the discharging circuit. By connecting the positive and negative electrodes of the absorbing diode MD1' to the first node and the positive input port respectively, the energy absorption and long-distance discharge can be realized by the switches and capacitors of the power conversion circuit.

The work principle is illustrated as follows. At the moment that the first switch M11 is turned on, the peak voltage generated on the two ends of the second switch M21 is absorbed by the absorbing capacitors Cb' and Cin' of the CDC clamping circuit. Meanwhile, the absorbing capacitors Cb' and Cin' discharges to the storage device Cb and the input capacitor Cin. Consequently, the protection for the second switch M21 is realized. In addition, in this embodiment, the voltage drop on the two ends of the absorbing capacitor Cin' is clamped to Vin, and the voltage drop on the two ends of the absorbing capacitor Cb' is clamped to –Vin/2. Therefore, in this embodiment, the voltage drop on the two ends of the second switch M21 is clamped to substantially Vin/2, and it is allowed to employ the switch with low withstanding-voltage level as the second switch M21. Moreover, in this embodiment, there is no further special requirements to the capacitances of the two capacitors Cb' and Cin' except for absorbing power, which makes the design simpler and reduces the loss.

Figure 7D:
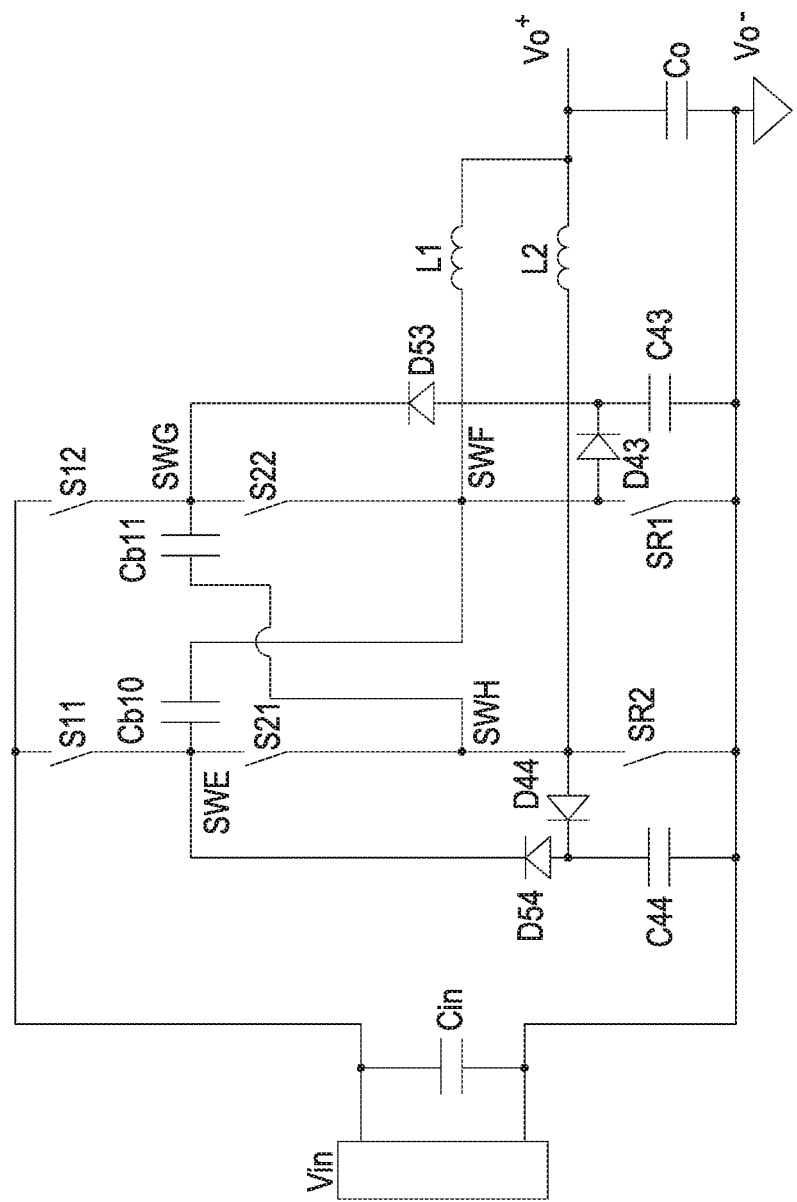
FIG. 7D is a schematic circuit diagram illustrating a second power conversion circuit and clamping circuits according to a tenth embodiment of the present disclosure.
Figure 7E:
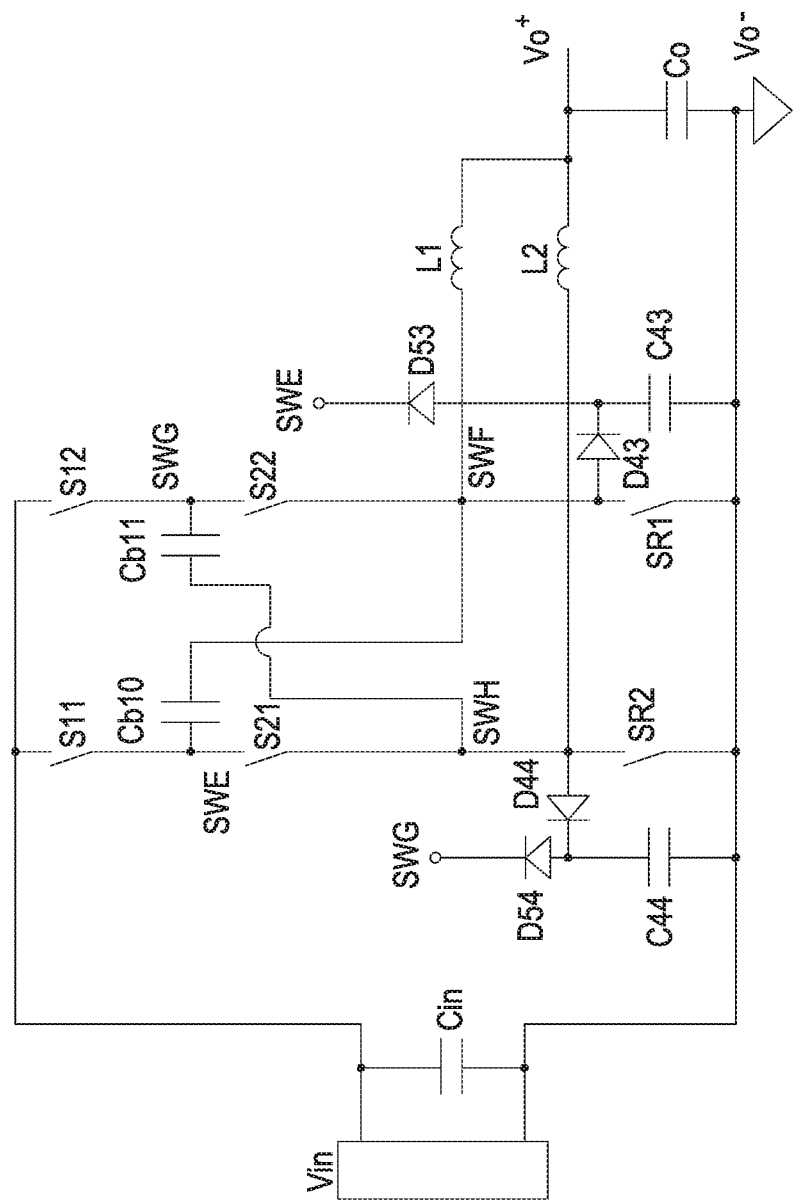
FIG. 7E is a schematic circuit diagram illustrating a second power conversion circuit and clamping circuits according to an eleventh embodiment of the present disclosure.
Figure 7F:
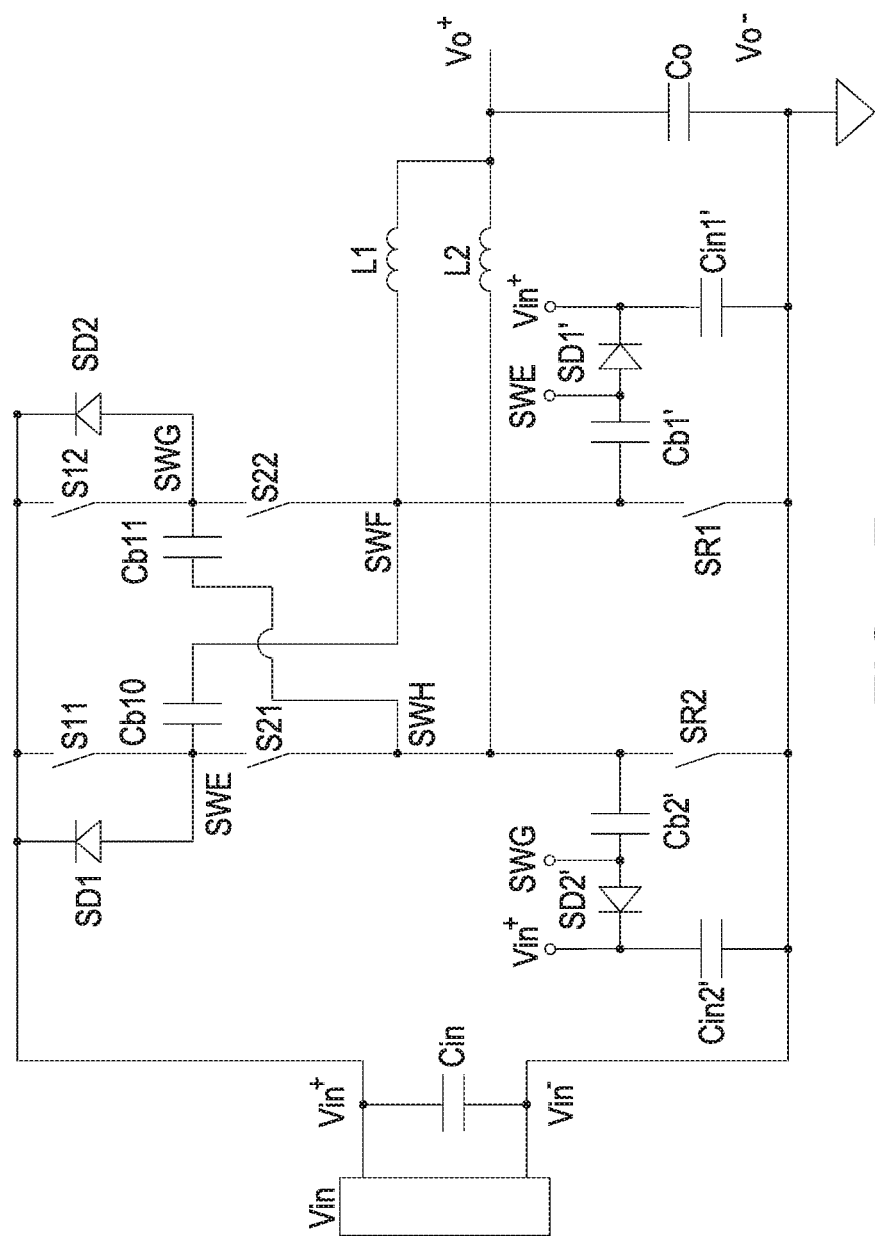
FIG. 7F is a schematic circuit diagram illustrating a second power conversion circuit and clamping circuits according to a twelfth embodiment of the present disclosure.

FIG. 7D is a schematic circuit diagram illustrating a second power conversion circuit and clamping circuits according to a tenth embodiment of the present disclosure. FIG. 7E is a schematic circuit diagram illustrating a second power conversion circuit and clamping circuits according to an eleventh embodiment of the present disclosure. FIG. 7F is a schematic circuit diagram illustrating a second power conversion circuit and clamping circuits according to a twelfth embodiment of the present disclosure. The clamping circuits of FIG. 7D, FIG. 7E and FIG. 7F can be applied to the second power conversion circuit of FIG. 2B for clamping the voltage on the third switches SR1 and SR2. As shown in FIG. 7D and FIG. 7E, each of the N switching power conversion units of the second power conversion circuit is corresponding to one clamping circuit, and each clamping circuit includes an absorbing circuit and a discharging circuit. The absorbing circuit includes an absorbing diode and an absorbing capacitor, and the discharging circuit includes a discharging diode. The absorbing diode is connected to the absorbing capacitor in series. The positive electrode of the absorbing diode is connected to one terminal of the corresponding third switch, one terminal of the absorbing capacitor is connected to the negative electrode of the absorbing diode, and the other terminal of the absorbing capacitor is connected to the other terminal of the third switch and is grounded. One terminal of the discharging circuit is connected to the negative electrode of the absorbing diode, and the other terminal of the discharging circuit is connected to the corresponding first node.

In the embodiment shown in FIG. 7D, N equals 2. With regard to the clamping circuit corresponding to the first switching power conversion unit, the absorbing circuit includes an absorbing diode D43 and an absorbing capacitor C43 connected in series. The negative electrode of the absorbing diode D43 is connected to the absorbing capacitor C43. The absorbing circuit is connected to the two ends of the third switch SR1 in parallel. Further, the absorbing circuit is disposed near the third switch SR1 on the layout of the printed circuit board, so as to achieve the shortest wiring path between the absorbing circuit and the third switch SR1. The discharging circuit includes a discharging diode D53. The positive electrode of the discharging diode D53 is connected to the negative electrode of the absorbing diode D43, and the negative electrode of the discharging diode D53 is connected to the first node SWG of the second switching power conversion unit. When the first switch S11 and the second switch S22 are turned on, there is a voltage drop of Vin/2 on the two ends of the third switch SR1 instantaneously, and the voltage drop includes a peak voltage generated at the conduction moment. Meanwhile, the absorbing diode D43 is turned on, and the absorbing capacitor C43 absorbs the peak voltage generated at the conduction moment of the first switch S11 and the second switch S22. When the voltage on the absorbing capacitor C43 is larger than Vin/2, the discharging diode D53 is turned on. Consequently, the power on the absorbing capacitor C43 is discharged and fed back to the storage device Cb11 of the second switching power conversion unit through the discharging diode D53. Since the voltage drop on the two ends of the storage device Cb11 equals Vin/2 during steady work state, the voltage drop on the third switch SR1 is clamped to Vin/2. Therefore, it is allowed to employ the switch with low withstanding-voltage level as the third switch SR1.

With regard to the clamping circuit corresponding to the second switching power conversion unit, the absorbing circuit includes an absorbing diode D44 and an absorbing capacitor C44 connected in series. The negative electrode of the absorbing diode D44 is connected to the absorbing capacitor C44. The absorbing circuit is connected to the two ends of the third switch SR2 in parallel. Further, the absorbing circuit is disposed near the third switch SR2 on the layout of the printed circuit board, so as to achieve the shortest wiring path between the absorbing circuit and the third switch SR2. In addition, the discharging circuit includes a discharging diode D54. The positive electrode of the discharging diode D54 is connected to the negative electrode of the absorbing diode D44, and the negative electrode of the discharging diode D54 is connected to the first node SWE of the first switching power conversion unit. When the first switch S12 and the second switch S21 are turned on, there is a voltage drop of Vin/2 on the two ends of the third switch SR2 instantaneously, and the voltage drop includes a peak voltage generated at the conduction moment. Meanwhile, the absorbing diode D44 is turned on, and the absorbing capacitor C44 absorbs the peak voltage generated at the conduction moment of the first switch S12 and the second switch S21. When the voltage on the absorbing capacitor C44 is larger than Vin/2, the discharging diode D54 is turned on. Consequently, the power on the absorbing capacitor C44 is discharged and fed back to the storage device Cb10 of the first switching power conversion unit through the discharging diode D54. Since the voltage drop on the two ends of the storage device Cb10 equals Vin/2 during steady work state, the voltage drop on the third switch SR2 is clamped to Vin/2. Therefore, it is allowed to employ the switch with low withstanding-voltage level as the third switch SR2. Consequently, the protection for the third switches SR1 and SR2 is realized. Since the peak energy absorbed by the absorbing capacitors C43 and C44 is fed back to the storage devices Cb10 and Cb11, the loss of the peak energy is reduced, and the efficiency of the power conversion circuit is improved.

In the embodiment shown in FIG. 7E, N equals 2, the clamping circuits corresponding to the first and second switching power conversion units are similar to that of FIG. 7D except for the connection relations of the negative electrode of the discharging diode of the clamping circuit. Namely, the point of the discharging circuit feeding the absorbed peak energy back to the storage component is different. Taking the clamping circuit corresponding to the first switching power conversion unit as an example, the negative electrode of the discharging diode D53 is connected to the first node SWE. When the first switch S11 and the second switch S22 are turned on, the peak voltage is generated on the third switch SR1 at the conduction moment. Meanwhile, the absorbing diode D43 is turned on, and the absorbing capacitor C43 absorbs the peak voltage. When the first and second switches S11 and S22 are turned off and the first and second switches S12 and S21 are turned on, the absorbing diode D43 is cut off inversely, and the discharging diode D53 of the discharging circuit is turned on. Consequently, the power on the absorbing capacitor C43 is discharged and fed back to the storage device Cb10 through the discharging diode D53. Since the voltage drop on the two ends of the storage device Cb10 equals Vin/2 during steady work state, the voltage drop on the third switch SR1 is clamped to Vin/2. Therefore, it is allowed to employ the switch with low withstanding-voltage level as the third switch SR1. Similarly, the negative electrode of the clamping circuit corresponding to the second switching power conversion unit is connected to the first node SWG, and the work principle is substantially the same, thus the detailed description thereof is omitted herein.

In actual applications, the negative electrode of the discharging diode of each clamping circuit is connected to the first node of the corresponding switching power conversion unit or another switching power conversion unit according to actual requirements, and is not limited herein.

In the embodiments shown in FIG. 7D and FIG. 7E, a voltage ripple is superimposed on the DC potential of the voltage of Vin/2 on the first nodes SWE and SWG, and the voltage ripple causes some energy loss when the power on absorbing capacitors C43 and C44 is discharged to the storage devices Cb11 and Cb10 through the discharging diodes D53 and D54. In the embodiment shown in FIG. 7F, the clamping circuit is the CDC clamping circuit (e.g., the CDC clamping shown in FIG. 7C), and the CDC clamping circuit is disposed between the first node and the ground terminal.

In the embodiment shown in FIG. 7F, N equals 2, and the power conversion circuit is the same as that of FIG. 2B. The CDC clamping circuits corresponding to the first and second switching power conversion units are substantially the same, thus the CDC clamping circuit corresponding to the first switching power conversion unit is taken as an example for explanation. The CDC clamping circuit includes an absorbing circuit that includes an absorbing diode SD1' and absorbing capacitors Cb1' and Cin1'. One terminal of the absorbing capacitor Cb1' is serially connected to the positive electrode of the absorbing diode SD1', and one terminal of the absorbing capacitor Cin1' is serially connected to the negative electrode of the absorbing diode SD1'. The absorbing circuit is connected to the two ends of the third switch SR1 in parallel. Further, the components of the absorbing circuit are disposed near the third switch SR1 on the layout of the printed circuit board, so as to achieve the shortest wiring path. In this embodiment, there is no need to dispose the discharging circuit. By connecting the positive and negative electrodes of the absorbing diode SD1' to the first node SWE of the first switching power conversion unit and the positive input port Vin+ respectively, the energy absorption and long-distance discharge can be realized by the switches and capacitors of the power conversion circuit.

The work principle in this embodiment is similar to that of FIG. 7C. At the moment that the first switch S11 and the second switch S22 are turned on, the peak voltage generated on the two ends of the third switch SR1 is absorbed by the absorbing capacitors Cb1' and Cin1' of the corresponding CDC clamping circuit. Meanwhile, the absorbing capacitors Cb1' and Cin1' discharges to the storage device Cb10 and the input capacitor Cin. Consequently, the clamp protection for the third switch SR1 is realized. Similarly, the CDC clamping circuit corresponding to the second switching power conversion unit utilizes the absorbing capacitors Cb2' and Cin2' to absorb the peak voltage, and the absorbing capacitors Cb2' and Cin2' discharges to the storage device Cb11 and the input capacitor Cin. Consequently, the clamp protection for the third switch SR2 is realized.

In this embodiment, the voltage drops on the absorbing capacitors Cin1' and Cin2' are clamped to Vin, and the voltage drops on the absorbing capacitors Cb1' and Cb2' are clamped to −Vin/2. Therefore, in this embodiment, the voltage drops on the third switches SR1 and SR2 are clamped to substantially Vin/2, and it is allowed to employ the switch with low withstanding-voltage level as the third switch. Moreover, in this embodiment, there is no further special requirements to the capacitances of the capacitors Cb1', Cin1', Cb2' and Cin2' except for absorbing power, which makes the design simpler and reduces the loss.

In addition, all the diodes of the clamping circuits in above embodiments (e.g., the diodes D41, D51, D42 and D52 of FIG. 7A and FIG. 7B, the diodes MD1', D42 and D52 of FIG. 7C, the diodes D43 and D44 of FIG. 7D and FIG. 7E, and the diodes SD1' and SD2' of FIG. 7E) can be replaced by controllable switches.

In the first power conversion circuit of FIG. 2A, the sources of the second switches M21 and M22 are grounded, and the sources of the first switches M11 and M12 are connected to the capacitor Cb and the drain of the second switch M22 respectively. Therefore, the bootstrap supply is needed for driving the first switches M11 and M12 in actual applications. In addition, in the second power conversion circuit of FIG. 2B, the sources of the third switches SR1 and SR2 are grounded, the sources of the second switches S21 and S22 are connected to the drains of the third switches SR2 and SR1 respectively, and the sources of the first switches S11 and S12 are connected to the drains of the second switches S21 and S22 respectively. Therefore, the bootstrap supply is needed for driving the first switches S11 and S12 and the second switches S21 and S22 in actual applications. In an embodiment, the power conversion system further includes a bootstrap circuit and a plurality of driving circuits, so as to control the first and second switches of the power conversion circuits and realize the bootstrap supply for the driving to the switches.

Figure 8A:
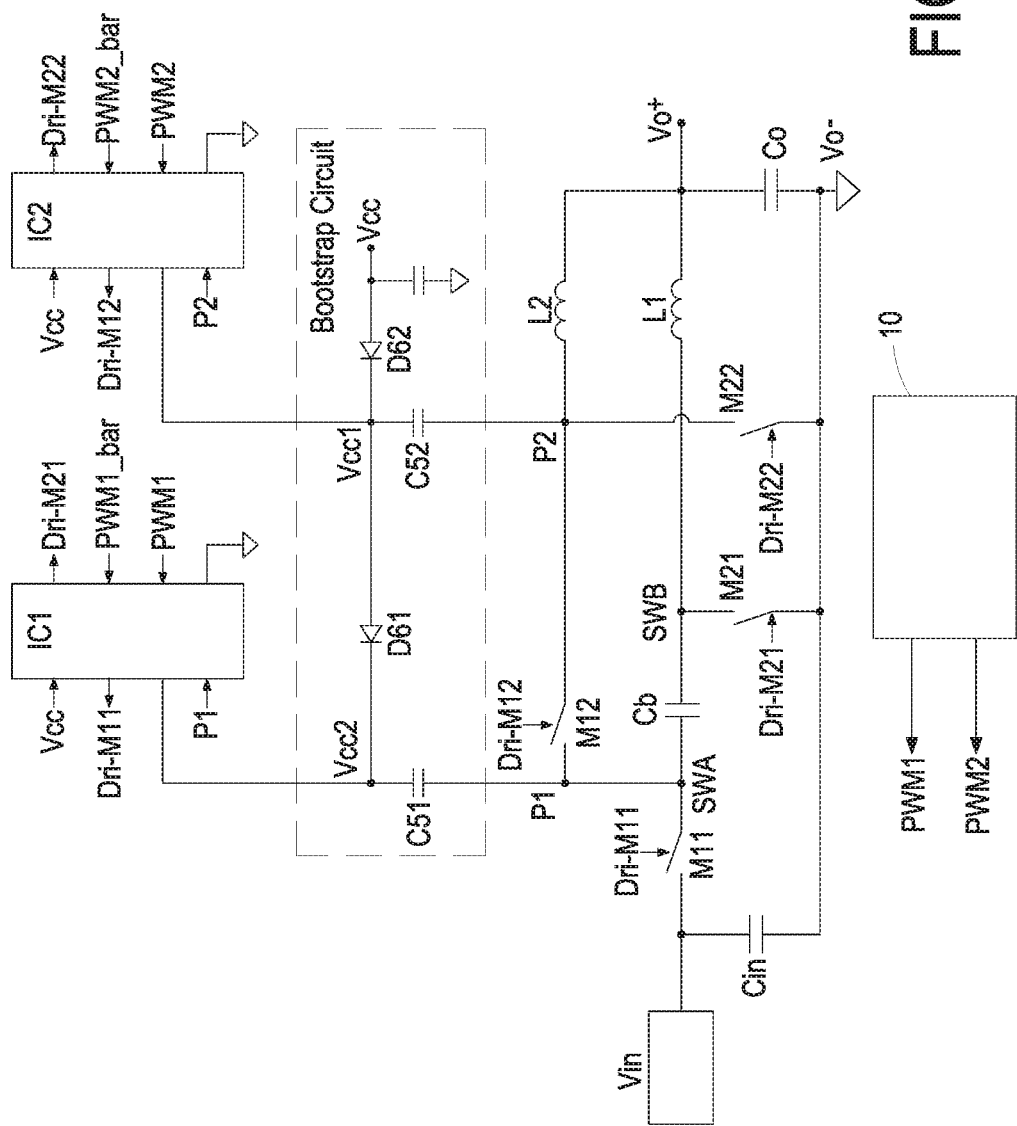
FIG. 8A is a schematic circuit diagram illustrating a first power conversion circuit, a bootstrap circuit and driving circuits according to a thirteenth embodiment of the present disclosure.
Figure 8B:
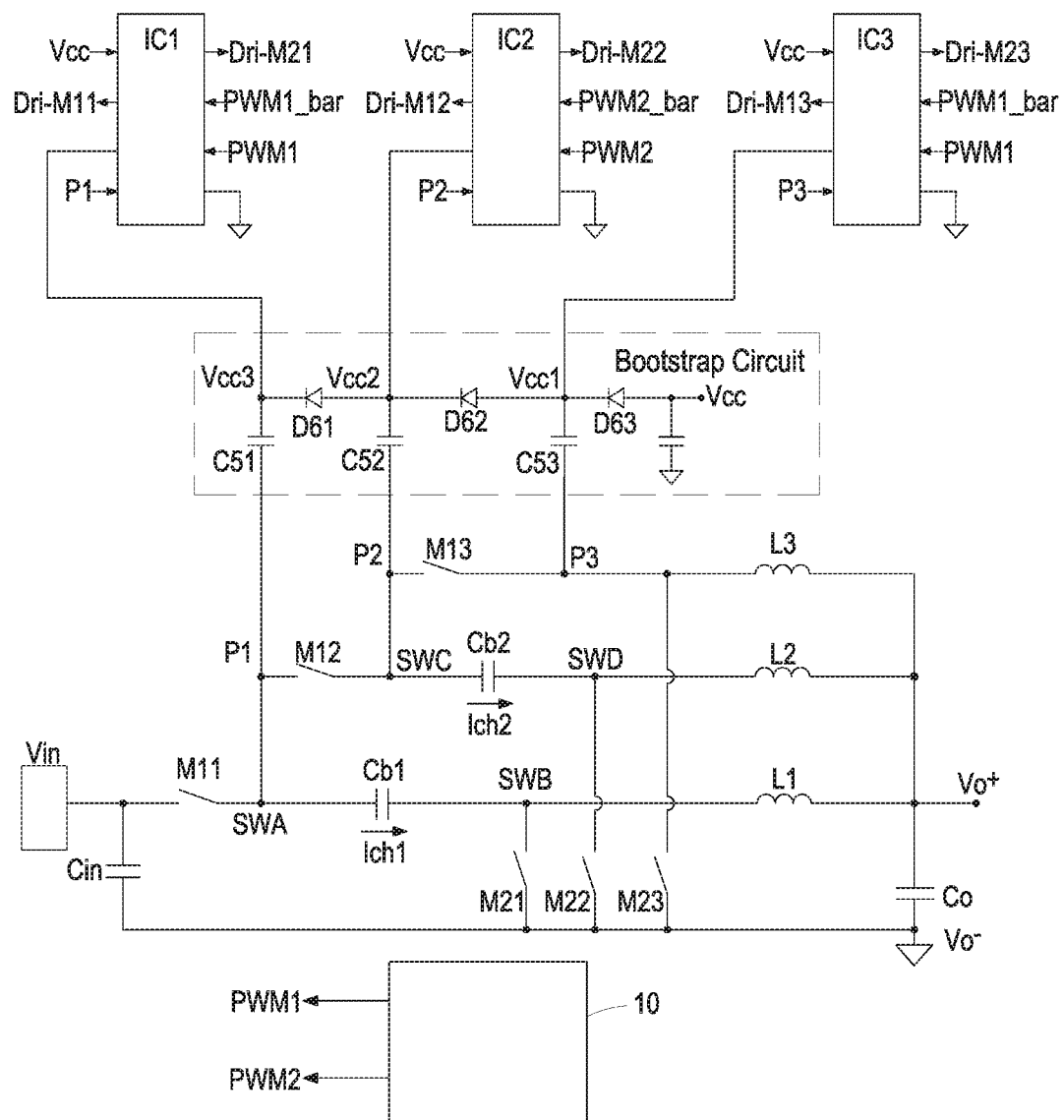
FIG. 8B is a schematic circuit diagram illustrating a first power conversion circuit, a bootstrap circuit and driving circuits according to a fourteenth embodiment of the present disclosure.

FIG. 8A is a schematic circuit diagram illustrating a first power conversion circuit, a bootstrap circuit and driving circuits according to a thirteenth embodiment of the present disclosure. FIG. 8B is a schematic circuit diagram illustrating a first power conversion circuit, a bootstrap circuit and driving circuits according to a fourteenth embodiment of the present disclosure. The bootstrap circuit and the driving circuit of FIG. 8A and FIG. 8B can be applied to the first power conversion circuit. As shown in FIG. 8A and FIG. 8B, the first power conversion circuit further includes N nodes. The (n)th node Pn is located between the first switch of the (n)th switching power conversion unit and the first switch of the (n+1)th switching power conversion unit. The (N)th node PN is located between the first and second switches of the (N)th switching power conversion unit. The bootstrap circuit includes N bootstrap capacitors and N bootstrap diodes. The N bootstrap diodes are serially connected in sequence. One terminal (such as the negative electrode) of the (n)th bootstrap capacitor is electrically connected to the (n)th node Pn, and the other terminal (such as the positive electrode) of the (n)th bootstrap capacitor is electrically connected to the negative electrode of the (n)th bootstrap diode. One terminal (such as the negative electrode) of the (N)th bootstrap capacitor is electrically connected to the (N)th node PN, and the other terminal (such as the positive electrode) of the (N)th bootstrap capacitor is electrically connected to the negative electrode of the (N)th bootstrap diode. The positive electrode of the (N)th bootstrap diode receives the supply voltage Vcc. Each of the N driving circuits is connected to the corresponding bootstrap capacitor. The driving of the first and second switches is powered by the positive electrode voltage of the bootstrap capacitor and the supply voltage Vcc. The driving circuits output the first and second driving signals for controlling the first and second switches of the corresponding power conversion circuits. Consequently, through the bootstrap circuit and the driving circuit, the function of the bootstrap supply and the control of switches are realized, which enhances the applicability of the power conversion circuit greatly and benefits the miniaturization of the power conversion system product. Further, the structure of the bootstrap circuit is simple so that the cost is low.

In an embodiment, the (n)th/(N)th driving circuit includes a first input terminal, a second input terminal and a first output terminal. The first input terminal and the second input terminal of the (n)th driving circuit are electrically connected to the negative electrode of the (n)th bootstrap diode and the (n)th node respectively, and the first output terminal of the (n)th driving circuit outputs the first driving signal for controlling the first switch of the (n)th switching power conversion unit. Moreover, the high level and low level of the first driving signal outputted by the (n)th driving circuit equal the positive electrode voltage of the (n)th bootstrap capacitor and the voltage on the (n)th node respectively. The first input terminal and the second input terminal of the (N)th driving circuit are electrically connected to the negative electrode of the (N)th bootstrap diode and the (N)th node respectively. The first output terminal of the (N)th driving circuit outputs the first driving signal for controlling the first switch of the (N)th switching power conversion unit. Moreover, the high level and low level of the first driving signal outputted by the (N)th driving circuit equal the positive electrode voltage of the (N)th bootstrap capacitor and the voltage on the (N)th node respectively.

In an embodiment, the (n)th/(N)th driving circuit further includes a third input terminal, a fourth input terminal and a second output terminal. The third input terminal and the fourth input terminal of the (n)th driving circuit are further electrically connected to the supply voltage and the ground terminal respectively, and the second output terminal of the (n)th driving circuit further outputs the second driving signal for controlling the second switch of the (n)th switching power conversion unit. Moreover, the high level and low level of the second driving signal equal the supply voltage and the voltage at the ground terminal respectively. The third input terminal and the fourth input terminal of the (N)th driving circuit are further electrically connected to the supply voltage and ground terminal respectively, and the second output terminal of the (N)th driving circuit further outputs the second driving signal for controlling the second switch of the (N)th switching power conversion unit. Moreover, the high level and low level of the second driving signal equal the supply voltage and the voltage at the ground terminal respectively.

In the embodiment shown in FIG. 8A, N equals 2. The supply voltage Vcc is connected to one terminal (e.g., the positive electrode) of the second bootstrap capacitor C52 through the second bootstrap diode D62, and the other terminal (e.g., the negative electrode) of the bootstrap capacitor C52 is connected to the second node P2. When the second switch M22 is turned on, the node P2 is shorted to the ground terminal, the bootstrap diode D62 is turned on, and the positive electrode voltage Vcc1 of the bootstrap capacitor C52 is increased to Vcc (the voltage drop caused by the conduction of diodes is omitted). When the second switch M22 is turned off, the node P2 is floated, the positive electrode voltage Vcc1 of the bootstrap capacitor C52 is utilized to supply power for the driving circuit of the first switch M12 so as to increase the potential of the driving of the first switch M12. The positive electrode voltage Vcc1 of the bootstrap capacitor C52 is connected to one terminal (e.g., the positive electrode) of the first bootstrap capacitor C51 through the first bootstrap diode D61, and the other terminal (e.g., the negative electrode) of the bootstrap capacitor C51 is connected to the first node P1. When the first switch M12 is turned on, the node P1 is shorted to the node P2, the bootstrap diode D61 is turned on, and the positive electrode voltage Vcc2 of the bootstrap capacitor C51 is increased to Vcc1. When the first switch M12 is turned off, the positive electrode voltage Vcc2 of the bootstrap capacitor C51 is utilized to supply power for the driving circuit of the first switch M11 so as to increase the potential of the driving of the first switch M11. Therefore, each phase of the power conversion circuit can realize the bootstrap supply function by utilizing only one bootstrap diode and one bootstrap capacitor. The circuit structure is simple, and the cost is low, which enhances the applicability greatly and benefits the miniaturization of the power conversion system.

In addition, the driving circuit IC1 receives the control signal PWM1 and is connected to the bootstrap capacitor C51 and the supply voltage Vcc. The driving circuit IC1 outputs a first driving signal Dri-M11 and a second driving signal Dri-M21 according to the positive electrode voltage Vcc2 of the bootstrap capacitor C51 and the supply voltage Vcc, so as to control the corresponding first and second switches M11 and M21. The driving circuit IC2 receives the control signal PWM2 and is connected to the bootstrap capacitor C52 and the supply voltage Vcc. The driving circuit IC2 outputs a first driving signal Dri-M12 and a second driving signal Dri-M22 according to the positive electrode voltage Vcc1 of the bootstrap capacitor C52 and the supply voltage Vcc, so as to control the corresponding first and second switches M12 and M22. Moreover, the time sequences of the first driving signals Dri-M11 and Dri-M12 are corresponding to the time sequences of the control signals PWM1 and PWM2 respectively. The high and low levels of the first driving signal Dri-M11 equal the positive electrode voltage of the first bootstrap capacitor C51 and the voltage on the first node P1 respectively. The high and low levels of the first driving signal Dri-M12 equal the positive electrode voltage of the second bootstrap capacitor C52 and the voltage on the second node P2 respectively. In an embodiment, the driving circuit (IC1, IC2) is further connected to the controller 10 for receiving the control signal (PWM1, PWM2) and outputting the driving signal accordingly. In this embodiment, the first switch M11 (the upper switch), the first switch M12 (the middle switch) and the second switch M22 (the lower switch) are connected in series. One terminal of the upper switch is electrically connected to the positive input port, and one terminal of the lower switch is electrically connected to the negative input port. The positive electrode voltage of the second bootstrap capacitor C52 is utilized to supply power for the control signal of the middle switch. The positive electrode voltage of the first bootstrap capacitor C51 is utilized to supply power for the control signal of the upper switch.

In the embodiment shown in FIG. 8B, N equals 3. The supply voltage Vcc is connected to one terminal (e.g., the positive electrode) of the third bootstrap capacitor C53 through the third bootstrap diode D63, and the other terminal (e.g., the negative electrode) of the bootstrap capacitor C53 is connected to the third node P3. When the second switch M23 is turned on, the node P3 is shorted to the ground terminal, the bootstrap diode D63 is turned on, and the positive electrode voltage Vcc1 of the bootstrap capacitor C53 is increased to Vcc. When the second switch M23 is turned off, the node P3 is floated, the positive electrode voltage Vcc1 of the bootstrap capacitor C53 is utilized to supply power for the driving of the first switch M13 so as to increase the potential of the driving of the first switch M13. The positive electrode voltage Vcc1 of the bootstrap capacitor C53 is connected to one terminal (e.g., the positive electrode) of the second bootstrap capacitor C52 through the second bootstrap diode D62, and the other terminal (e.g., the negative electrode) of the bootstrap capacitor C52 is connected to the second node P2. When the first switch M13 is turned on, the node P2 is shorted to the node P3, the bootstrap diode D62 is turned on, and the positive electrode voltage Vcc2 of the bootstrap capacitor C52 is increased to Vcc1. When the first switch M13 is turned off, the positive electrode voltage Vcc2 of the bootstrap capacitor C52 is utilized to supply power for the driving circuit of the first switch M12 so as to increase the potential of the driving of the first switch M12. The positive electrode voltage Vcc2 of the bootstrap capacitor C52 is connected to one terminal (e.g., the positive electrode) of the first bootstrap capacitor C51 through the first bootstrap diode D61, and the other terminal (e.g., the negative electrode) of the bootstrap capacitor C51 is connected to the first node P1. When the first switch M12 is turned on, the node P1 is shorted to the node P2, the bootstrap diode D61 is turned on, and the positive electrode voltage Vcc3 of the bootstrap capacitor C51 is increased to Vcc2. When the first switch M12 is turned off, the positive electrode voltage Vcc3 of the bootstrap capacitor C51 is utilized to supply power for the driving circuit of the first switch M11 so as to increase the potential of the driving of the first switch M11.

In addition, the driving circuit IC1 receives the control signal PWM1 and is connected to the bootstrap capacitor C51 and the supply voltage Vcc. The driving circuit IC1 outputs a first driving signal Dri-M11 and a second driving signal Dri-M21 according to the positive electrode voltage Vcc3 of the bootstrap capacitor C51 and the supply voltage Vcc, so as to control the corresponding first and second switches M11 and M21. The driving circuit IC2 receives the control signal PWM2 and is connected to the bootstrap capacitor C52 and the supply voltage Vcc. The driving circuit IC2 outputs a first driving signal Dri-M12 and a second driving signal Dri-M22 according to the positive electrode voltage Vcc2 of the bootstrap capacitor C52 and the supply voltage Vcc, so as to control the corresponding first and second switches M12 and M22. The driving circuit IC3 receives the control signal PWM1 and is connected to the bootstrap capacitor C53 and the supply voltage Vcc. The driving circuit IC3 outputs a first driving signal Dri-M13 and a second driving signal Dri-M23 according to the positive electrode voltage Vcc1 of the bootstrap capacitor C53 and the supply voltage Vcc, so as to control the corresponding first and second switches M13 and M23.

Moreover, the time sequences of the first driving signals Dri-M11 and Dri-M13 are corresponding to the time sequence of the control signal PWM1, and the time sequence of the first driving signal Dri-M12 is corresponding to the time sequence of the control signal PWM2. The high and low levels of the first driving signal Dri-M11 equal the positive electrode voltage of the first bootstrap capacitor C51 and the voltage on the first node P1 respectively. The high and low levels of the first driving signal Dri-M12 equal the positive electrode voltage of the second bootstrap capacitor C52 and the voltage on the second node P2 respectively. The high and low levels of the first driving signal Dri-M13 equal the positive electrode voltage of the third bootstrap capacitor C53 and the voltage on the third node P3 respectively. In an embodiment, the driving circuit (IC1, IC2, IC3) is further connected to the controller 10 for receiving the control signal (PWM1, PWM2) and outputting the driving signal accordingly.

Figure 8C:
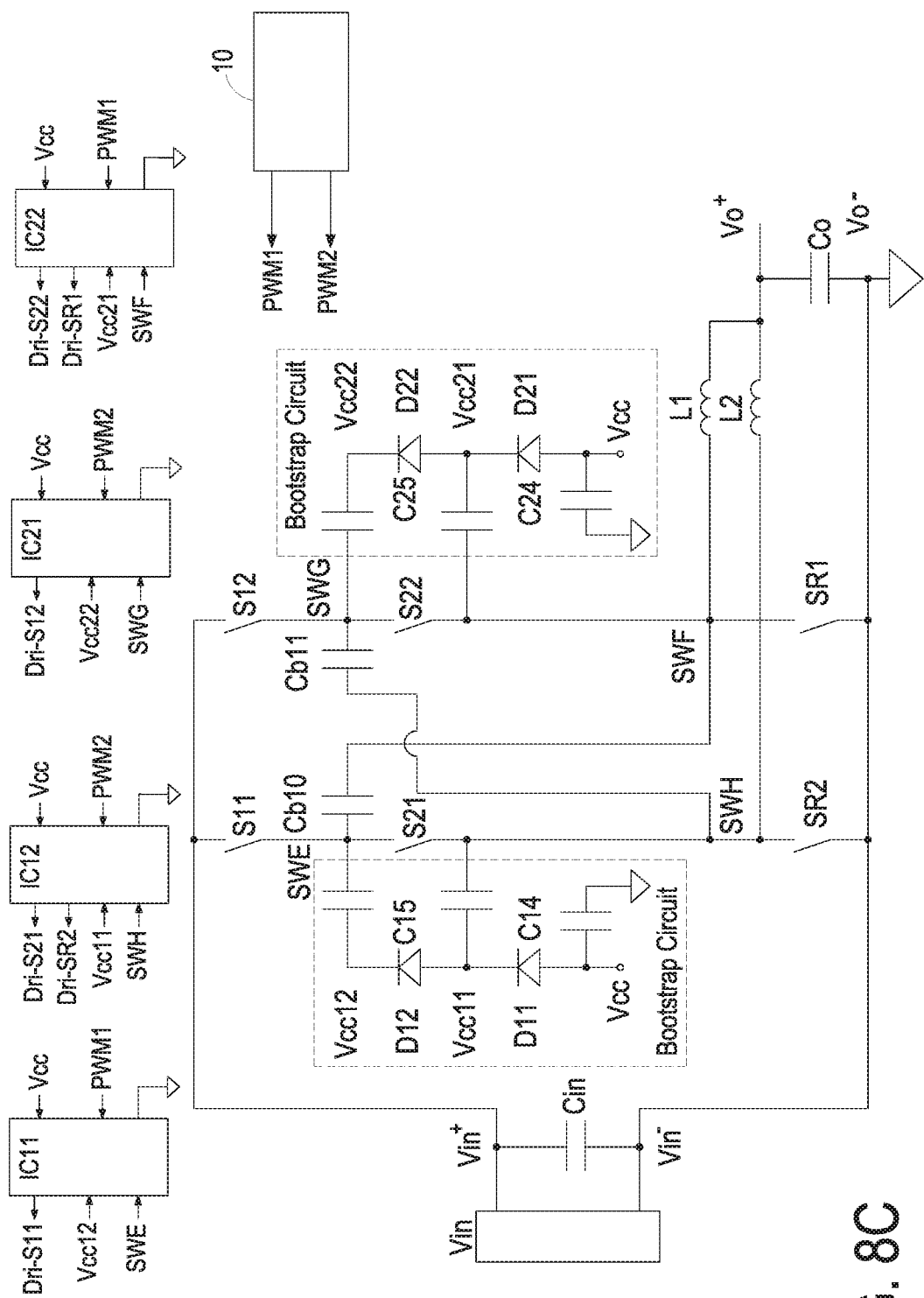
FIG. 8C is a schematic circuit diagram illustrating a second power conversion circuit, bootstrap circuits and driving circuits according to a fifteenth embodiment of the present disclosure.

FIG. 8C is a schematic circuit diagram illustrating a second power conversion circuit, bootstrap circuits and driving circuits according to the fifteenth embodiment of the present disclosure. The bootstrap circuit and driving circuit of FIG. 8C can be applied to the second power conversion circuit. As shown in FIG. 8C, the second power conversion circuit includes N bridge arms, and each of the N bridge arms includes a first switch, a second switch and a third switch connected in series, where N is an integer larger than or equal to 2. Each bridge arm includes two nodes which are a first node and a second node. The first node is located between the first and second switches of the bridge arm, and the second node is located between the second and third switches of the bridge arm. Taking the first bridge arm as an example, the first bridge arm is formed by a first switch S11, a second switch S21 and a third switch SR2 serially connected, the first node SWE is located between the first and second switches S11 and S21, and the second node SWH is located between the second and third switches S21 and SR2. Each bridge arm is corresponding to one bootstrap circuit. Each bootstrap circuit includes two bootstrap capacitors and two bootstrap diodes, and the two bootstrap diodes are serially connected in series. The negative electrode of the first bootstrap capacitor is electrically connected to the first node of the corresponding bridge arm. The positive electrode of the first bootstrap capacitor is electrically connected to the negative electrode of the first bootstrap diode. The positive electrode of the first bootstrap diode is electrically connected to the positive electrode of the second bootstrap capacitor. The negative electrode of the second bootstrap capacitor is electrically connected to the second node of the corresponding bridge arm. The positive electrode of the second bootstrap capacitor is electrically connected to the negative electrode of the second bootstrap diode. The positive electrode of the second bootstrap diode receives the supply voltage Vcc.

Please refer to FIG. 8C again. Each bridge arm is corresponding to two driving circuits, and each driving circuit is connected to the corresponding bootstrap capacitor. The driving of the first, second and third switches is powered by the positive electrode voltage of the bootstrap capacitor and the supply voltage Vcc. The driving circuits output the first, second and third driving signals for controlling the first, second and third switches of the corresponding bridge arm. Consequently, through the bootstrap circuit and the driving circuit, the bootstrap supply function and the control of switches are realized, which enhances the applicability of the power conversion circuit greatly and benefits the miniaturization of the power conversion system product. Further, the structure of the bootstrap circuit is simple so that the cost is low.

In an embodiment, with regard to each bridge arm, the input terminals of the corresponding first driving circuit are electrically connected to the negative electrode of the first bootstrap diode and the first node respectively. The output terminal of the corresponding first driving circuit outputs a first driving signal for controlling the corresponding first switch. The high and low levels of the first driving signal outputted by the first driving circuit equal the positive electrode voltage of the first bootstrap capacitor and the voltage on the first node. The input terminals of the corresponding second driving circuit are electrically connected to the negative electrode of the second bootstrap diode and the second node respectively. The output terminal of the corresponding second driving circuit outputs a second driving signal and a third driving signal for controlling the corresponding second and third switches. The high and low levels of the second driving signal outputted by the second driving circuit equal the positive electrode voltage of the second bootstrap capacitor and the voltage on the second node.

In the embodiment shown in FIG. 8C, N equals 2. The second power conversion circuit includes two bridge arms, and the second power conversion system includes two bootstrap circuits and four driving circuits. The first bridge arm and the corresponding one bootstrap circuit and two driving circuits are taken as an example. The supply voltage Vcc is connected to the positive electrode of the second bootstrap capacitor C14 through the second bootstrap diode D11, and the negative electrode of the bootstrap capacitor C14 is connected to the second node SWH. When the third switch SR2 is turned on, the second node SWH is shorted to the ground terminal, the bootstrap diode D11 is turned on, and the positive electrode voltage Vcc11 of the bootstrap capacitor C14 is increased to Vcc (the voltage drop caused by the conduction of diodes is omitted). When the third switch SR2 is turned off, the second node SWH is floated, the positive electrode voltage Vcc11 of the bootstrap capacitor C14 is utilized to supply power for the driving circuit of the second switch S21 so as to increase the potential of the driving of the second switch S21. The positive electrode voltage Vcc11 of the bootstrap capacitor C14 is connected to the positive electrode of the first bootstrap capacitor C15 through the first bootstrap diode D12, and the negative electrode of the bootstrap capacitor C15 is connected to the first node SWE. When the second switch S21 is turned on, the first node SWE is shorted to the second node SWH, the bootstrap diode D12 is turned on, and the positive electrode voltage Vcc12 of the bootstrap capacitor C15 is increased to Vcc11. When the second switch S21 is turned off, the positive electrode voltage Vcc12 of the bootstrap capacitor C15 is utilized to supply power for the driving of the first switch S11 so as to increase the potential of the driving of the first switch S11. Therefore, each bridge arm can realize the bootstrap supply function by utilizing two bootstrap diodes and two bootstrap capacitors. The circuit structure is simple, and the cost is low, which enhances the applicability greatly and benefits the miniaturization of the power conversion system.

In this embodiment, the first switch S11 (the upper switch), the second switch S21 (the middle switch) and the third switch SR2 (the lower switch) of one bridge arm are connected in series. One terminal of the upper switch is electrically connected to the positive input port, and one terminal of the lower switch is electrically connected to the negative input port. The positive electrode voltage of the second bootstrap capacitor C14 is utilized to supply power for the control signal of the middle switch, and the positive electrode voltage of the first bootstrap capacitor C15 is utilized to supply power for the control signal of the upper switch. Similarly, the first switch S12 (the upper switch), the second switch S22 (the middle switch) and the third switch SR1 (the lower switch) of the other bridge arm are connected in series. One terminal of the upper switch is electrically connected to the positive input port, and one terminal of the lower switch is electrically connected to the negative input port. The positive electrode voltage of the second bootstrap capacitor C24 is utilized to supply power for the control signal of the middle switch, and the positive electrode voltage of the first bootstrap capacitor C25 is utilized to supply power for the control signal of the upper switch.

In addition, the driving circuit IC11 receives the control signal PWM1 and is connected to the bootstrap capacitor C15 and the supply voltage Vcc. The driving circuit IC11 outputs a first driving signal Dri-S11 according to the positive electrode voltage Vcc12 of the bootstrap capacitor C15 and the supply voltage Vcc, so as to control the corresponding first switch S11. The driving circuit IC12 receives the control signal PWM2 and is connected to the bootstrap capacitor C14 and the supply voltage Vcc. The driving circuit IC12 outputs a second driving signal Dri-S21 and a third driving signal Dri-SR2 according to the positive electrode voltage Vcc11 of the bootstrap capacitor C14 and the supply voltage Vcc, so as to control the corresponding second and third switches S21 and SR2. Moreover, the time sequences of the first driving signals Dri-S11 and Dri-S21 are corresponding to the time sequences of the control signals PWM1 and PWM2 respectively. The third driving signal Dri-SR2 is complementary to the control signal PWM2. The high and low levels of the first driving signal Dri-S11 equal the positive electrode voltage of the first bootstrap capacitor C15 and the voltage on the first node SWE respectively. The high and low levels of the second driving signal Dri-S21 equal the positive electrode voltage of the second bootstrap capacitor C14 and the voltage on the second node SWH respectively.

In an embodiment, the driving circuit (IC11, IC12) is further connected to the controller 10 for receiving the control signal (PWM1, PWM2) and outputting the driving signal accordingly. The work principle of the bootstrap circuit and the driving circuit corresponding to the second bridge arm is similar to that corresponding to the first bridge arm, thus the detailed description thereof is omitted herein. When the power conversion circuit includes N bridge arms, the bootstrap supply and generation of driving signal can be achieved in the same manner. In addition, the manner of bootstrap supply and driving is not limited to be applied to the circuit topologies shown in FIG. 8A, FIG. 8B and FIG. 8C. The bootstrap circuit and the driving circuit of the present disclosure can be applied to any circuit topology including three switches serially connected and satisfying the following conditions. The three switches are an upper switch, a middle switch and a lower switch respectively and are electrically connected to the input port of the power conversion circuit. The lower and middle switches are not in the conducting state at the same time, and the middle and upper switches are not in the conducting state at the same time.

In the above embodiments, the said switches may be MOS, SiC or GaN. Further, the lower switch can be replaced by the free-wheeling diode, and the positive electrode of the free-wheeling diode is electrically connected to the negative output port. For example, the second switches M21 and M22 of FIG. 2A, FIG. 4A, FIG. 5A, FIG. 7A, FIG. 7B and FIG. 8A can be replaced by the free-wheeling diodes, and the second switches M21, M22 and M23 of FIG. 6A and FIG. 8A can be replaced by the free-wheeling diodes. In another embodiment, all the diodes of the bootstrap circuits can be replace by the controllable switches. For example, the diodes D61 and D62 of FIG. 8A and diodes D61, D62 and D63 of FIG. 8B can be replaced by the controllable switches one-to-one. The first terminal of the controllable switch is corresponding to positive electrode of the bootstrap diode, and the second terminal of the controllable switch is corresponding to the negative electrode of the bootstrap diode. The controllable switch may be MOS, SiC or GaN.

In addition, the switching power conversion unit of the power conversion circuit includes inductors. In order to realize the miniaturization of the power conversion system product, the magnetic core assembly around which the inductor is wound may be designed to make the substrate width of the magnetic core assembly as small as possible for reducing the height of the power conversion system product. In the case that N equals 2, the actual implementation of the magnetic core assembly is exemplified as follows.

Figure 9A:
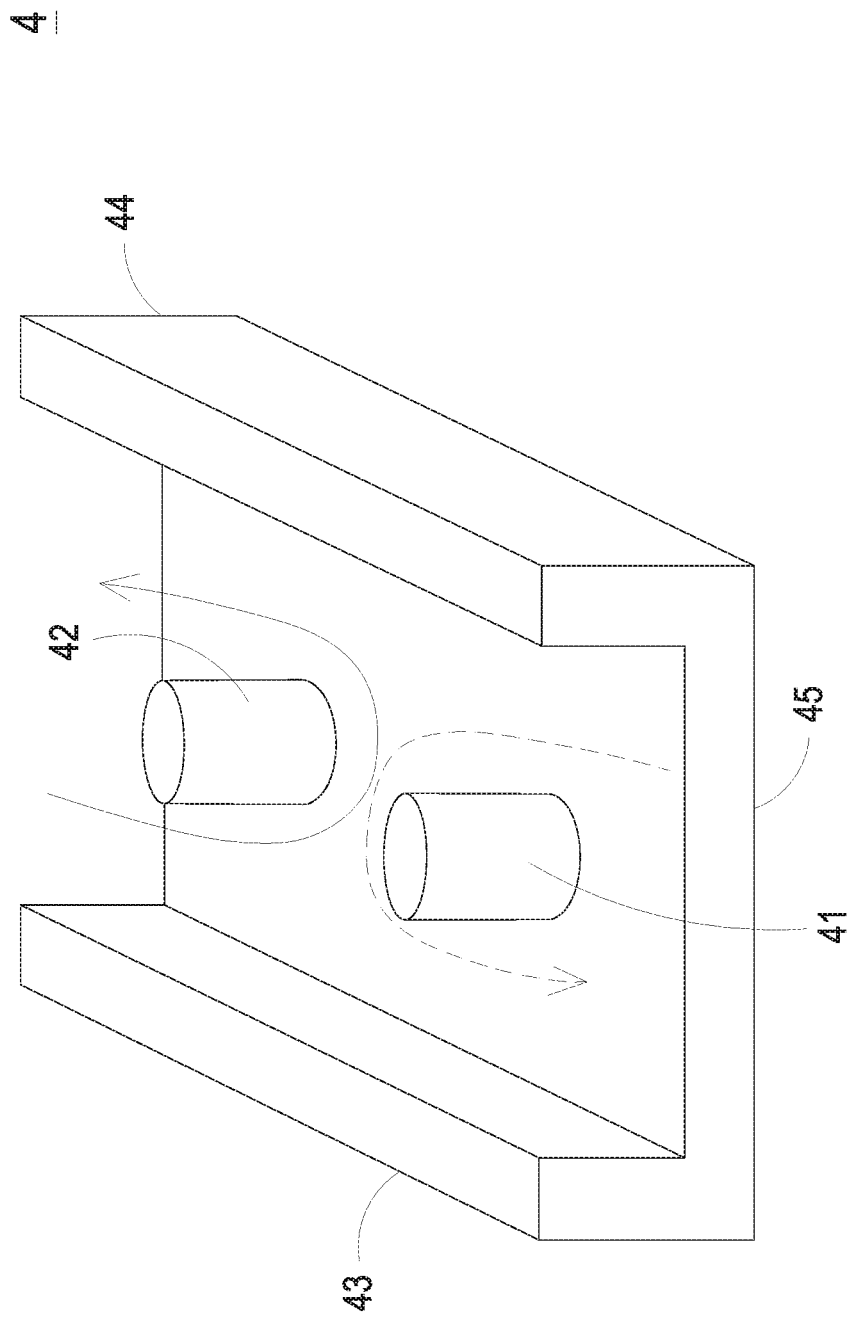
FIG. 9A is a schematic perspective view illustrating a part of the magnetic core assembly according to an embodiment of the present disclosure.
Figure 9B:
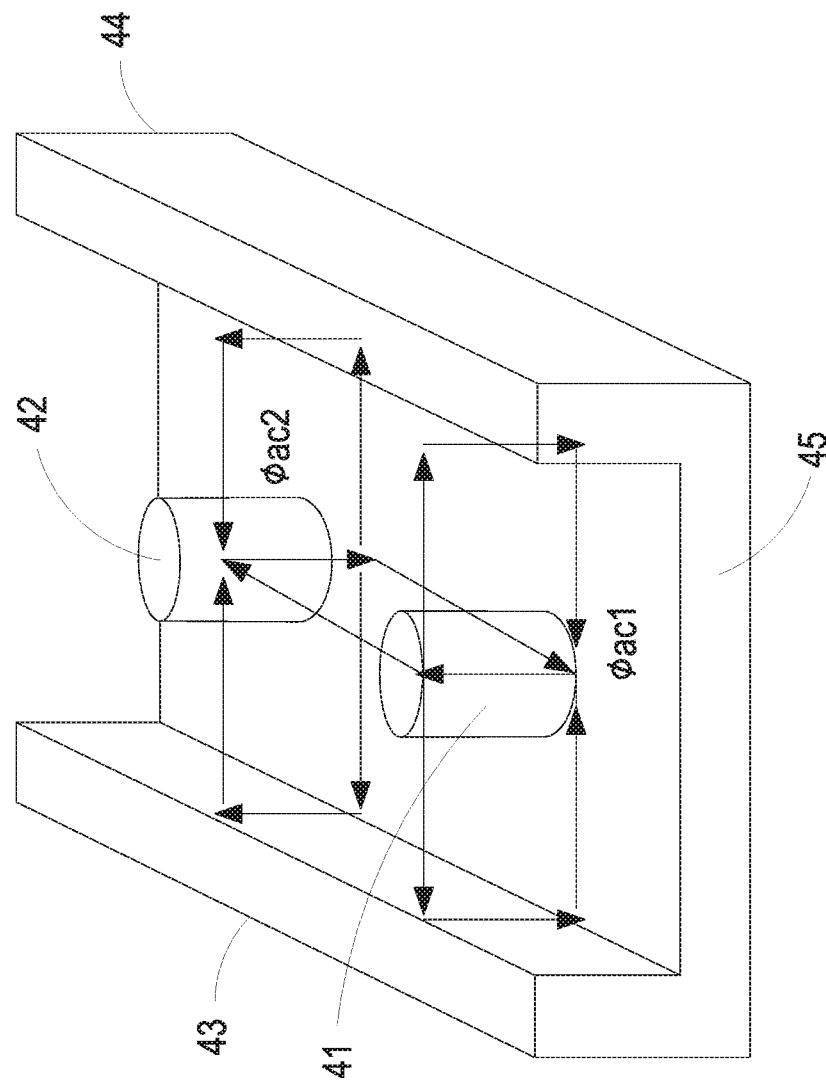
FIG. 9B schematically shows the direction of AC magnetic flux in the magnetic core assembly of FIG. 9A.
Figure 9C:
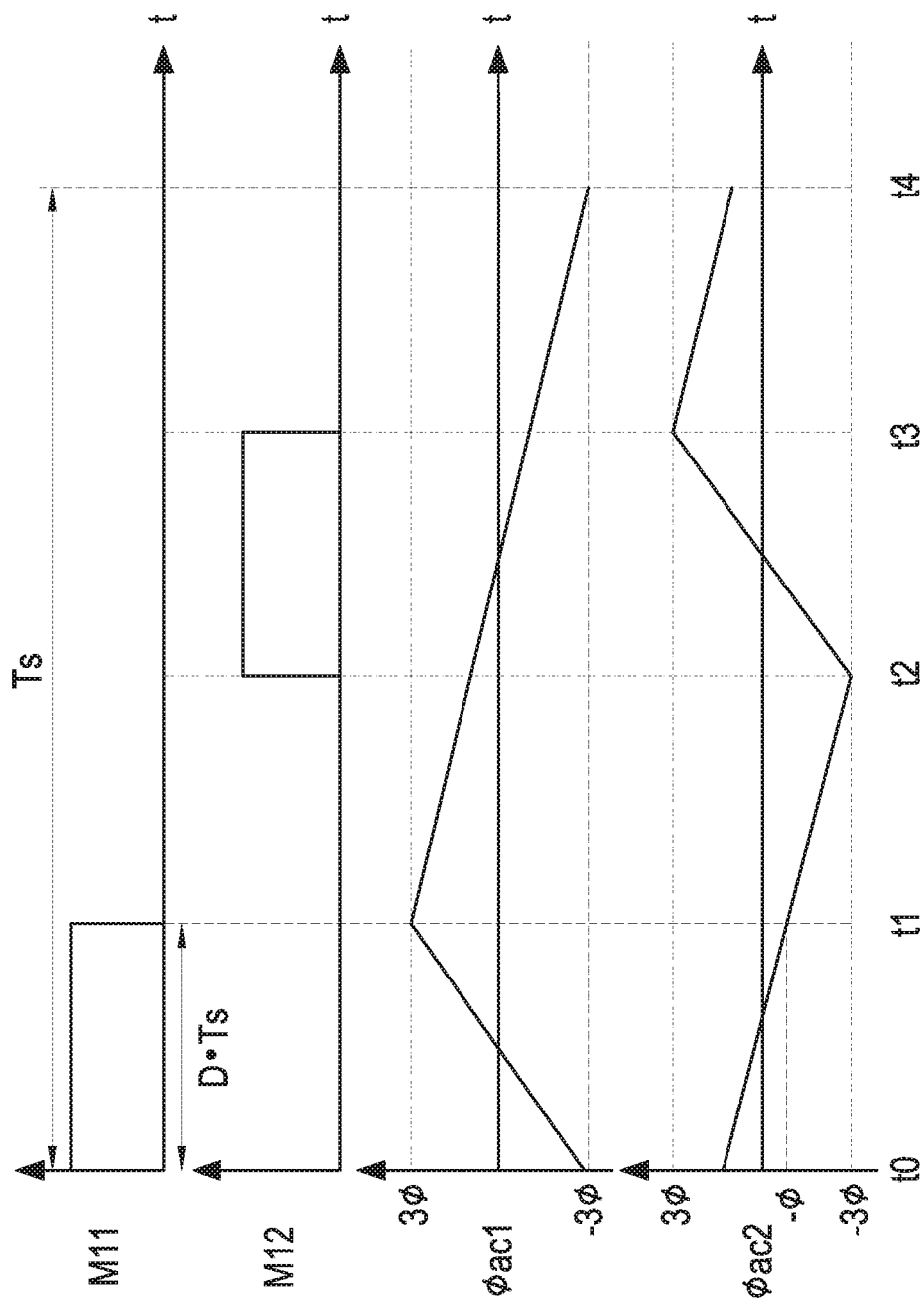
FIG. 9C is a schematic oscillogram showing the AC magnetic flux in the magnetic core assembly of FIG. 9A in one switching period.

FIG. 9A is a schematic perspective view illustrating a part of the magnetic core assembly according to an embodiment of the present disclosure. FIG. 9B schematically shows the direction of AC magnetic flux in the magnetic core assembly of FIG. 9A. FIG. 9C is a schematic oscillogram showing the AC magnetic flux in the magnetic core assembly of FIG. 9A in one switching period. Please refer to FIG. 9A in view of FIG. 2A and FIG. 2B. The two inductors L1 and L2 of the two switching power conversion units are wound around the same magnetic core assembly. The magnetic core assembly includes two substrates, two winding pillars and two side pillars. The two winding pillars and the two side pillars are disposed on at least one of the two substrates and are located between the two substrates. The magnetic core assembly is formed by an upper magnetic core and a lower magnetic core assembled to each other. The lower magnetic core 4 is taken as an example for explaining the magnetic core structure and the winding direction. The lower magnetic core 4 includes two winding pillars 41 and 42, two side pillars 43 and 44 and a substrate 45. The winding pillars 41 and 42 and the side pillars 43 and 44 are disposed on the substrate 45. The two side pillars 43 and 44 are disposed at the two opposite sides of the winding pillars 41 and 42 respectively. From the viewpoint of looking squarely at FIG. 9A, the winding pillar 41 is disposed in front of the winding pillar 42, and the two side pillars 43 and 44 are disposed at the left and right sides of the winding pillars 41 and 42 respectively. In an embodiment, the distance between the centers of the winding pillars 41 and 42, the vertical distance from the center of the winding pillar 41 to the side pillar 43, and the vertical distance from the center of the winding pillar 41 to the side pillar 44 are all the same. In an embodiment, only the side pillars 43 and 44 have air gap, and the length of the two air gaps are substantially the same. Alternatively, each of the two side pillars 43 and 44 and the two winding pillars 41 and 42 has an air gap. The length of the air gaps on the two side pillars are substantially the same, the length of the air gaps on the two winding pillars are substantially the same, and the length of the air gap on the side pillar is larger than or equal to the length of the air gap on the winding pillar.

For example, the winding of two inductors L1 and L2 of FIG. 2A are wound around the two winding pillars 41 and 42, and the direction of DC current is shown as FIG. 9A. The directions of DC magnetic flux on the winding pillars 41 and 42 are the same. As shown in FIG. 9C, the duty ratio D of the switches M11 and M12 is 25%, and the control signals of the two switches M11 and M12 are 180 degrees out of phase with respect to each other. The interval from the time t0 to the time t4 is a switching period Ts. During the interval from the time t0 to the time t1, the first switch M11 is turned on, and the AC magnetic flux $\Phi ac1$ flowing through the winding pillar 41 is increased linearly. The AC magnetic flux $\Phi ac1$ equals $3\Phi$ at the time t1. The direction of the AC magnetic flux $\Phi ac2$ flowing through the winding pillar 42 is opposite to the direction of the AC magnetic flux $\Phi ac1$. The AC magnetic flux $\Phi ac2$ equals $-\Phi$ at the time t1. Consequently, one third of the AC magnetic flux flowing through the winding pillar 41 flows to the winding pillar 42. Moreover, as shown in FIG. 9B, the winding pillar 41 is located at the central position between the two side pillars 43 and 44, namely the vertical distance from the center of the winding pillar 41 to the side pillar 43 equals that between the center of the winding pillar 41 and the side pillar 44. Accordingly, the parts of the AC magnetic flux $\Phi ac1$ flowing to the winding pillar 42, the side pillar 43 and the side pillar 44 respectively are all the same. It is noted that the AC magnetic flux $\Phi ac1$ flowing through the winding pillar 41 flows to the winding pillar 42 and the two side pillars 43 and 44 at the time t1. Similarly, the AC magnetic flux at the time t0, t2, t3 and t4 can be derived, and the detailed description thereof is omitted herein. The above magnetic flux variation $\Phi$ is used for illustration and does not mean specific numerical value. Since the AC magnetic flux $\Phi ac1$ flowing through the winding pillar 41 is divided into three parts that flows to the side pillars 43 and 44 and the winding pillar 42 respectively, the AC magnetic flux is substantially shared equally. Therefore, the thickness of the substrate 45 is reduced, and the height of the power conversion system product is reduced, which makes the power conversion system product become thinner and increases the applicability. Furthermore, in the power conversion system, the power density is improved, and the vertical thermal resistance is reduced. It is noted that the duty ratio D is not limited to 25% in this actual implementation of magnetic core assembly, the duty ratio is allowed to be larger than or equal to 15% and smaller than or equal to 35%. The effect of sharing the AC magnetic flux is the best when the duty ratio D is 25%. In addition, the upper magnetic core of the magnetic core assembly may have the same structure with the lower magnetic core 4, or the upper magnetic core may be an I-type magnetic core. The winding direction of the inductors L1 and L2 are not limited to that shown in the figures. If the AC magnetic flux is ensured to be divided for reducing the thickness of substrate, the winding direction can be varied freely.

Figure 9D:
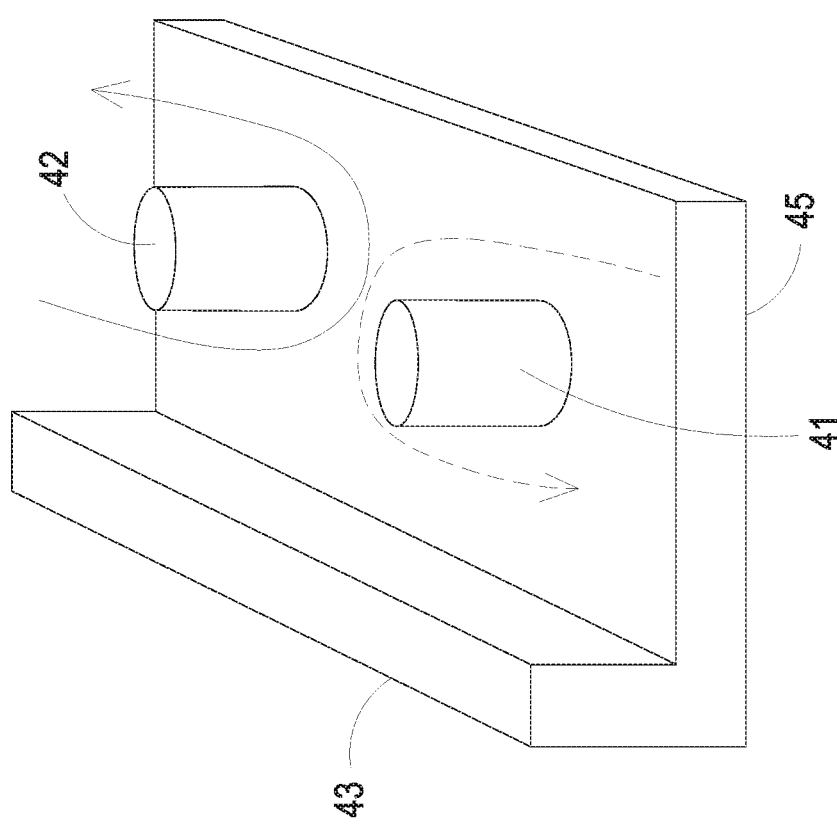
FIG. 9D is a schematic perspective view illustrating a part of the magnetic core assembly according to another embodiment of the present disclosure.
Figure 9E:
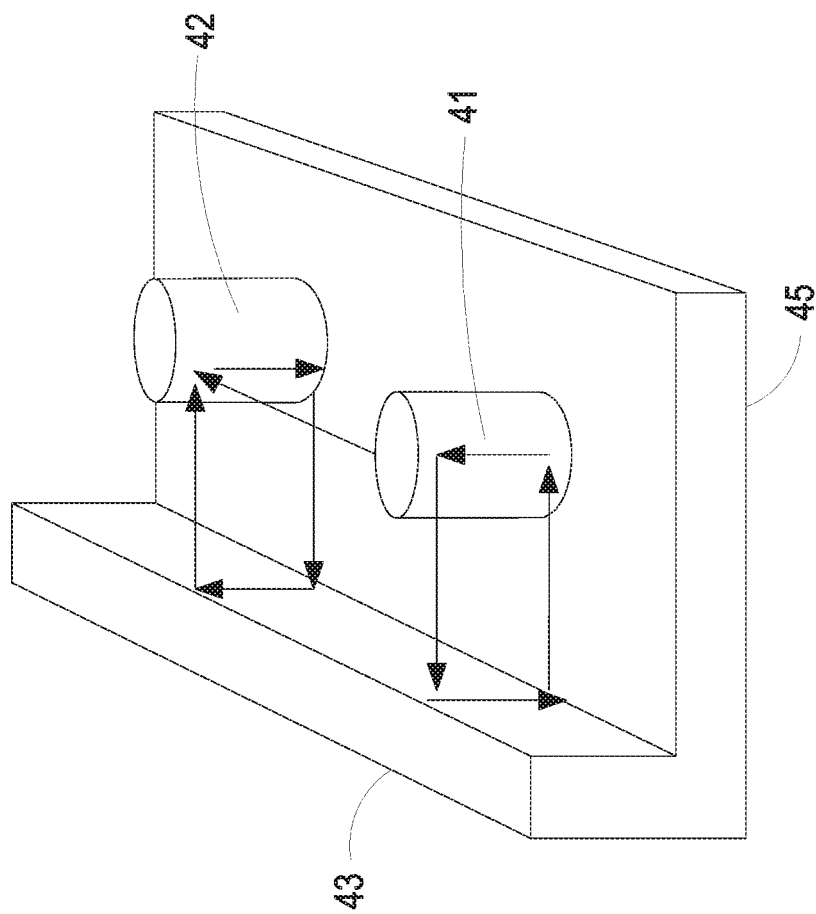
FIG. 9E schematically shows the direction of AC magnetic flux in the magnetic core assembly of FIG. 9D.
Figure 9F:
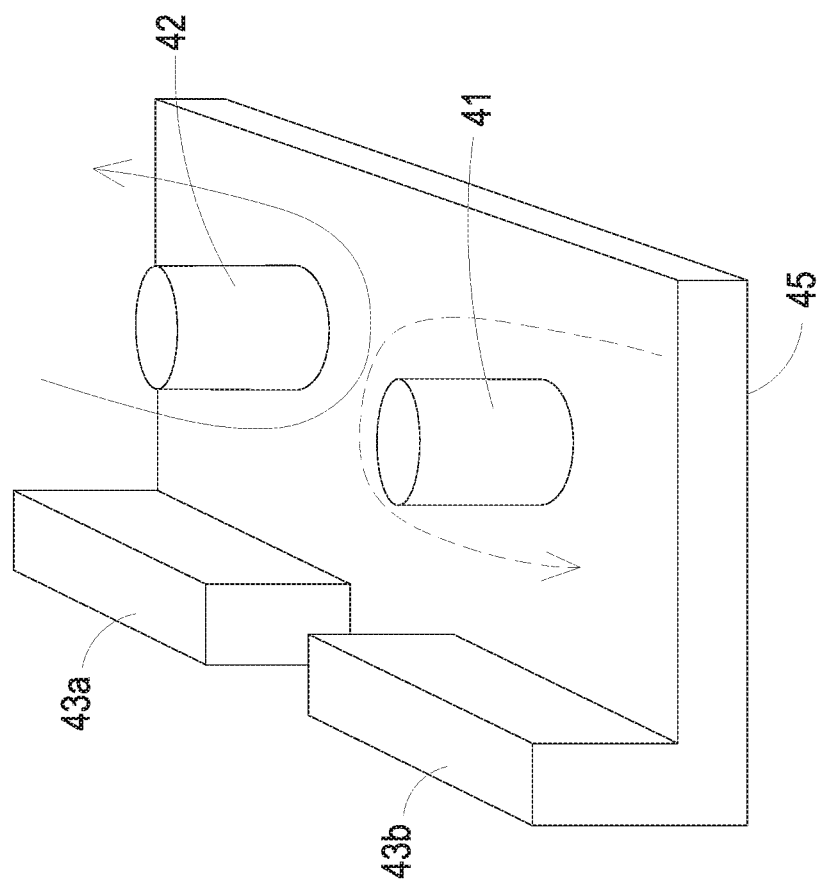
FIG. 9F is a schematic perspective view illustrating a part of the magnetic core assembly according to further another embodiment of the present disclosure.

FIG. 9D is a schematic perspective view illustrating a part of the magnetic core assembly according to another embodiment of the present disclosure. FIG. 9E schematically shows the direction of AC magnetic flux in the magnetic core assembly of FIG. 9D. FIG. 9F is a schematic perspective view illustrating a part of the magnetic core assembly according to further another embodiment of the present disclosure. Please refer to FIG. 9A in view of FIG. 2A and FIG. 2B. The two inductors L1 and L2 of the two switching power conversion units are wound around the same magnetic core assembly. The magnetic core assembly includes two substrates, two winding pillars and one side pillar. The two winding pillars and the side pillar are disposed on at least one of the two substrates and are located between the two substrates. The magnetic core assembly is formed by an upper magnetic core and a lower magnetic core assembled to each other. The lower magnetic core 4 is taken as an example for explaining the magnetic core structure and the winding direction. The lower magnetic core 4 includes two winding pillars 41 and 42, one side pillar 43 and a substrate 45. The winding pillars 41 and 42 and the side pillar 43 are disposed on the substrate 45. From the viewpoint of looking squarely at FIG. 9D, the winding pillar 41 is disposed in front of the winding pillar 42, and the side pillar 43 is disposed at one side of the winding pillars 41 and 42. In an embodiment, the distance between the centers of the winding pillars 41 and 42 and the vertical distance from the centers of the winding pillar 41 to the side pillar 43 are the same. In an embodiment, only the side pillar 43 has an air gap. Alternatively, each of the side pillar 43 and the two winding pillars 41 and 42 has an air gap. The length of the air gaps on the two winding pillars are substantially the same, and the length of the air gap on the side pillar is larger than or equal to the length of the air gap on the winding pillar.

For example, the winding of two inductors L1 and L2 are wound around the two winding pillars 41 and 42, and the direction of DC current is shown as FIG. 9D. The direction of DC magnetic flux on the winding pillars 41 and 42 are the same. As shown in FIG. 9D and FIG. 9E, one third of the AC magnetic flux Φac1 flowing through the winding pillar 41 flows to the winding pillar 42, and two thirds of the AC magnetic flux Φac1 flows to the side pillar 43. Even though the AC magnetic flux Φac1 flowing through the winding pillar 41 cannot be divided equally into two parts flowing toward the side pillar 43 and the winding pillar 42 respectively, the thickness of the substrate 45 can still be reduced to some extent. Consequently, the height of the power conversion system product is reduced. Other details of this embodiment can be derived according to the embodiment shown in FIG. 9A and is omitted herein.

In another embodiment, as shown in FIG. 9F, the side pillar 43 of FIG. 9D can be divided into two side pillars 43a and 43b. The two side pillars 43a and 43b are disposed at the same side of the two winding pillars 41 and 42. The AC magnetic flux flowing through the winding pillar 41 flows to the side pillars 43b and the winding pillar 42. Similarly, the AC magnetic flux flowing through the winding pillar 42 flows to the side pillar 43a and the winding pillar 41. Other details of this embodiment can be derived according to the embodiment shown in FIG. 9D and is omitted herein.

Figure 10A:
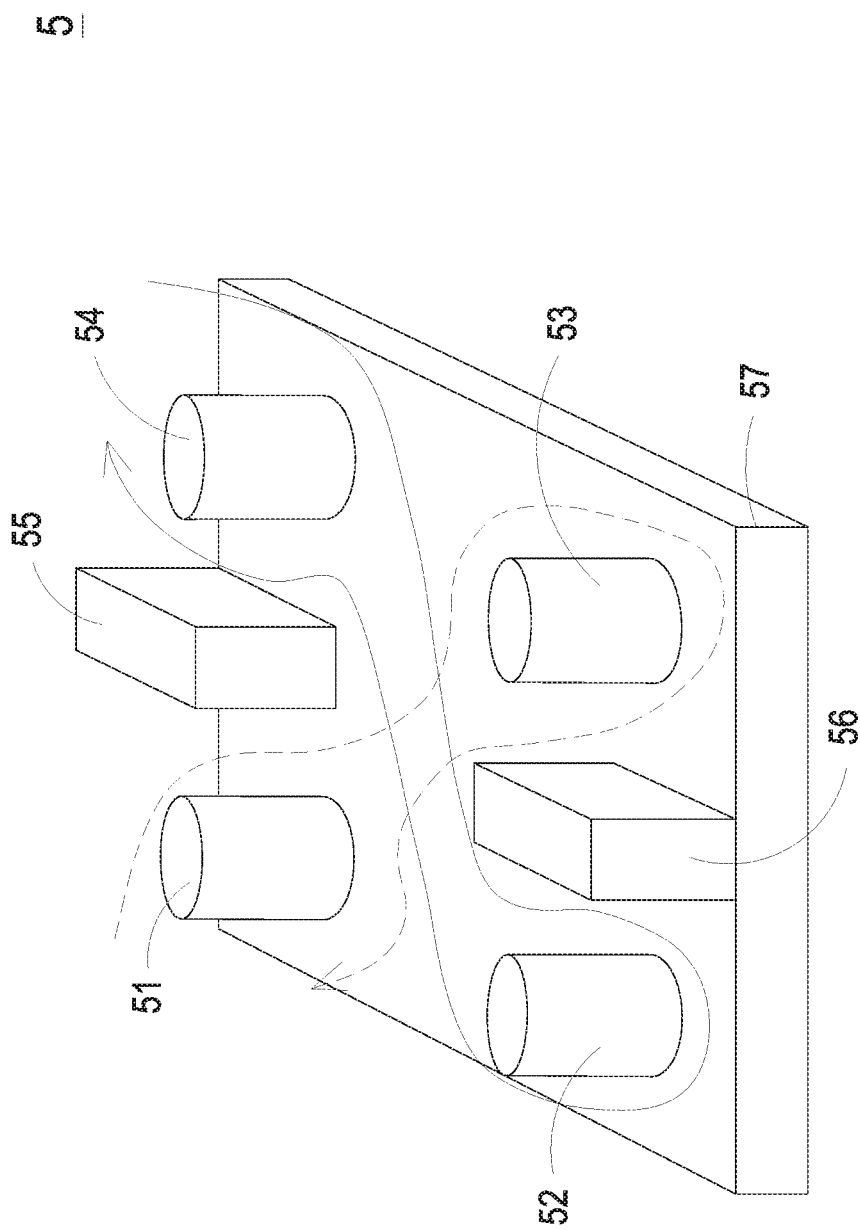
FIG. 10A is a schematic perspective view illustrating a part of the magnetic core assembly according to further another embodiment of the present disclosure.
Figure 10C:
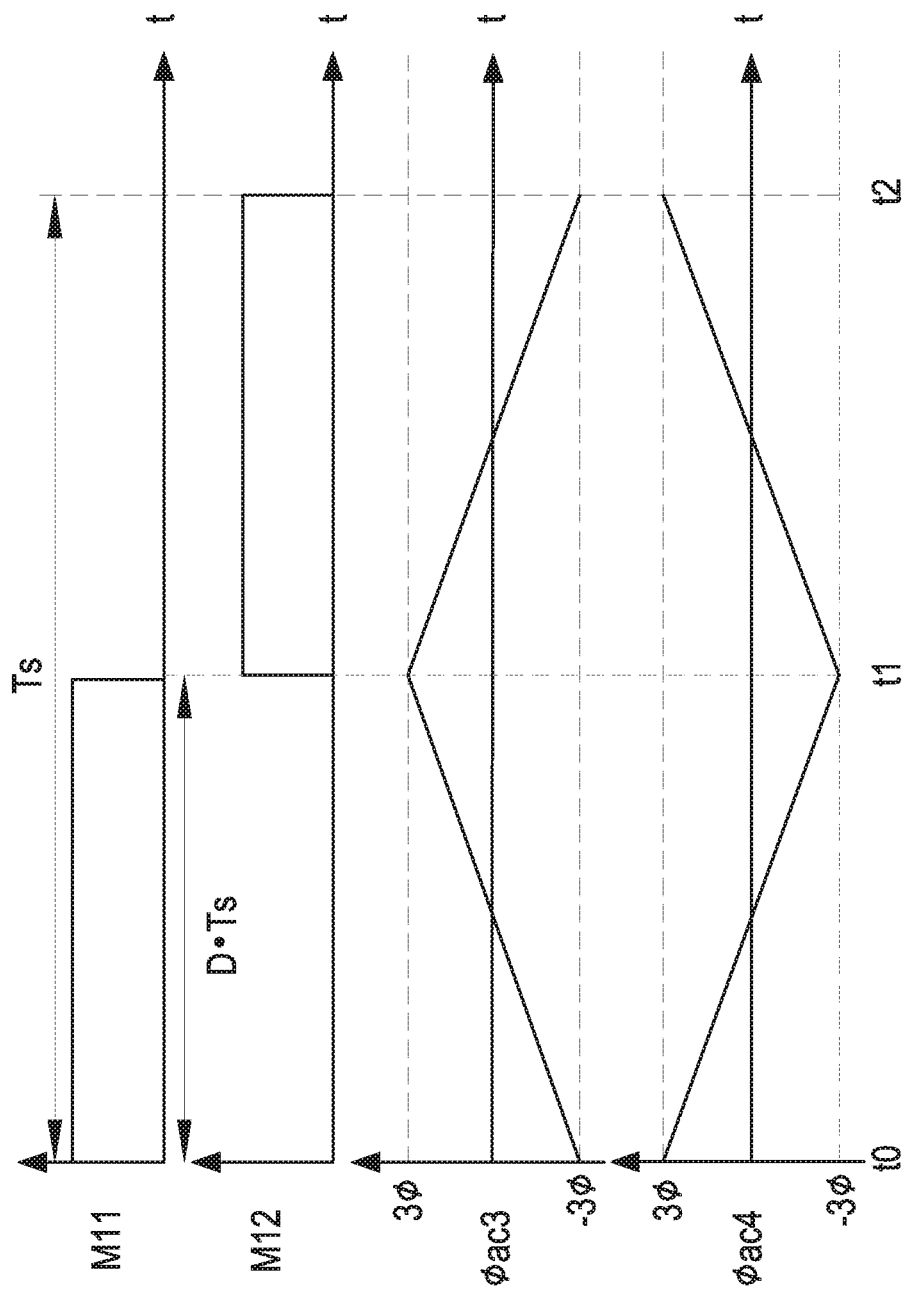
FIG. 10C is a schematic oscillogram showing the AC magnetic flux in the magnetic core assembly of FIG. 10A in one switching period.

FIG. 10A is a schematic perspective view illustrating a part of the magnetic core assembly according to another embodiment of the present disclosure. FIG. 10B schematically shows the direction of AC magnetic flux in the magnetic core assembly of FIG. 10A. FIG. 10C is a schematic oscillogram showing the AC magnetic flux in the magnetic core assembly of FIG. 10A in one switching period. Please refer to FIG. 10A in view of FIG. 2A and FIG. 2B. The two inductors L1 and L2 of the two switching power conversion units are wound around the same magnetic core assembly. The magnetic core assembly includes two substrates, four winding pillars and an auxiliary pillar unit. The four winding pillars and the auxiliary pillar unit are disposed on at least one of the two substrates and are located between the two substrates. The winding of the inductor L1 is wound around at least two winding pillars, and the winding of the inductor L2 is wound around at least two winding pillars. The connecting line of the centers of the four winding pillars forms a quadrangle. In this embodiment, the auxiliary pillar unit includes two middle pillars (i.e., the auxiliary pillars). The magnetic core assembly is formed by an upper magnetic core and a lower magnetic core assembled to each other. The lower magnetic core 5 is taken as an example for explaining the magnetic core structure and the winding direction. The lower magnetic core 5 includes a first winding pillar 51, a second winding pillar 52, a third winding pillar 53, a fourth winding pillar 54, a first middle pillar 55, a second middle pillar 56 and a substrate 57. The first winding pillar 51, the second winding pillar 52, the third winding pillar 53, the fourth winding pillar 54, the first middle pillar 55 and the second middle pillar 56 are disposed on the substrate 57. The first middle pillar 55 is located between the first winding pillar 51 and the fourth winding pillar 54, and the second middle pillar 56 is located between the second winding pillar 52 and the third winding pillar 53. The connecting line of the centers of the first, second, third and fourth winding pillars 51, 52, 53 and 54 forms a quadrangle. The first and third winding pillars 51 and 53 are located on a first diagonal line of the quadrangle, and the second and fourth winding pillars 52 and 54 are located on a second diagonal line of the quadrangle.

For example, the winding of the inductor L1 is wound around the first and third winding pillars 51 and 53, and the winding of the inductor L2 is wound around the second and fourth winding pillar 52 and 54. The direction of DC current is shown as FIG. 10A, and the DC magnetic flux flowing through the fourth winding pillars (51, 52, 53, 54) are superimposed on the two middle pillars (55, 56). As shown in FIG. 10B and FIG. 10C, the duty ratio D is 50%, and the interval from the time t0 to the time t2 is a switching period Ts. During the interval from the time t0 to the time t1, the first switch M11 is turned on, the AC magnetic flux Φac3 flowing through the first and third winding pillars 51 and 53 are increased linearly, and the AC magnetic flux Φac4 flowing through the second and fourth winding pillars 52 and 54 are decreased linearly. At the time t1, one half of the AC magnetic flux flowing through the first winding pillar 51 flows to the second winding pillar 52, and the other half of the AC magnetic flux flowing through the first winding pillar 51 flows to the fourth winding pillar 54. One half of the AC magnetic flux flowing through the third winding pillar 53 flows to the second winding pillar 52, and the other half of the AC magnetic flux flowing through the third winding pillar 53 flows to the fourth winding pillar 54. During the interval from the time t1 to the time t2, the AC magnetic flux Φac4 flowing through the second and fourth winding pillars 52 and 54 are increased linearly, and the AC magnetic flux Φac3 flowing through the first and third winding pillars 51 and 53 are decreased linearly. At the time t2, one half of the AC magnetic flux flowing through the second winding pillar 52 flows to the first winding pillar 51, and the other half of the AC magnetic flux flowing through the second winding pillar 52 flows to the third winding pillar 53. One half of the AC magnetic flux flowing through the fourth winding pillar 54 flows to the first winding pillar 51, and the other half of the AC magnetic flux flowing through the fourth winding pillar 54 flows to the third winding pillar 53.

Since the AC magnetic flux flowing through the winding pillar is divided into two parts that flows to the two neighboring winding pillars respectively, the AC magnetic flux is substantially divided equally. Therefore, the thickness of the substrate 57 is reduced, and the height of the power conversion system product is reduced, which makes the power conversion system product become thinner and increases the applicability. Furthermore, in the power conversion system, the power density is improved, and the vertical thermal resistance is reduced. It is noted that the duty ratio D is not limited to 50% in this actual implementation of magnetic core assembly, the duty ratio is allowed to be larger than or equal to 30% and smaller than or equal to 70%. The AC magnetic flux flowing out of the winding pillar flows to the two neighboring winding pillars and one neighboring middle pillar, and three closed magnetic flux loops are formed accordingly. The effect of sharing the AC magnetic flux is the best when the duty ratio D is 50%. In addition, the upper magnetic core of the magnetic core assembly may have the same structure with the lower magnetic core 5, or the upper magnetic core may be an I-type magnetic core. The winding direction of the inductors L1 and L2 are not limited to that shown in the figures. If the AC magnetic flux is ensured to be divided for reducing the thickness of substrate, the winding direction can be varied freely.

Figure 10E:
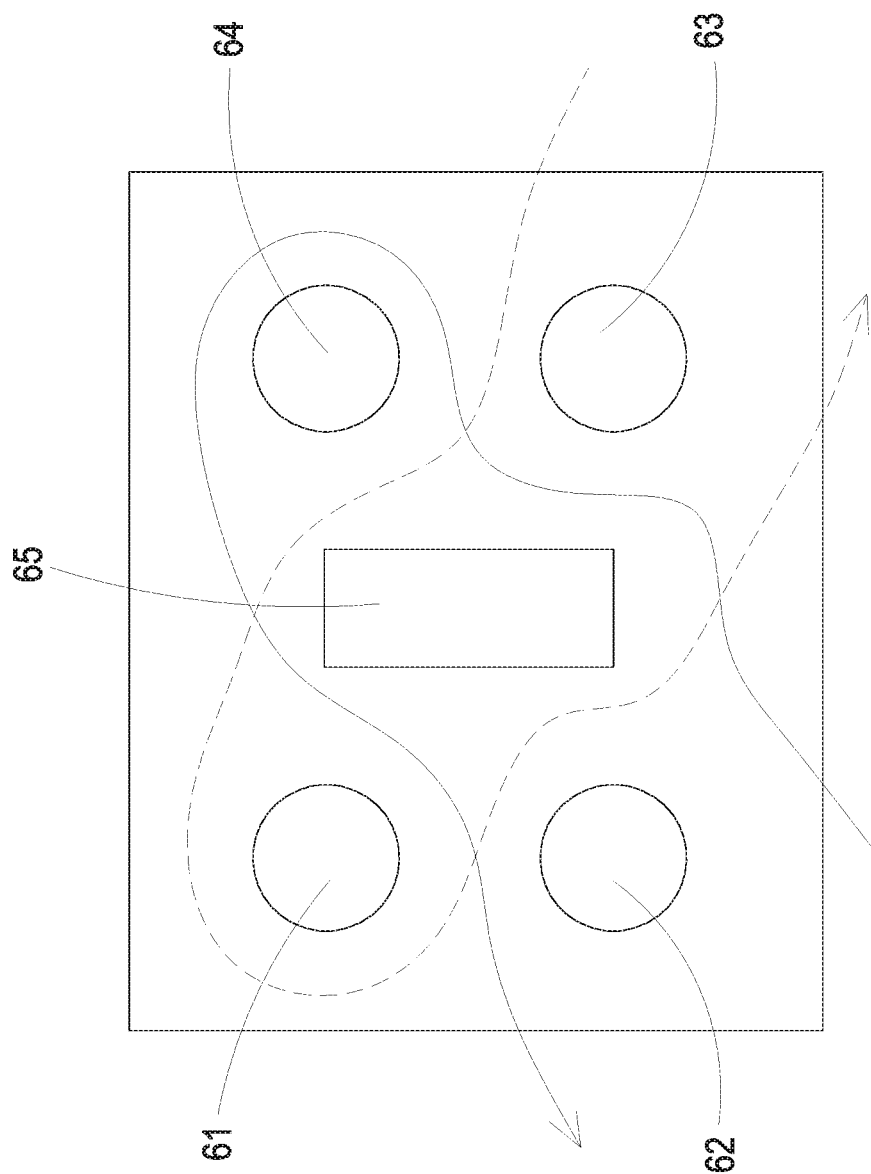
FIG. 10E and FIG. 10F are vertical views of FIG. 10D which schematically shows two different winding manners of inductor.
Figure 10F:
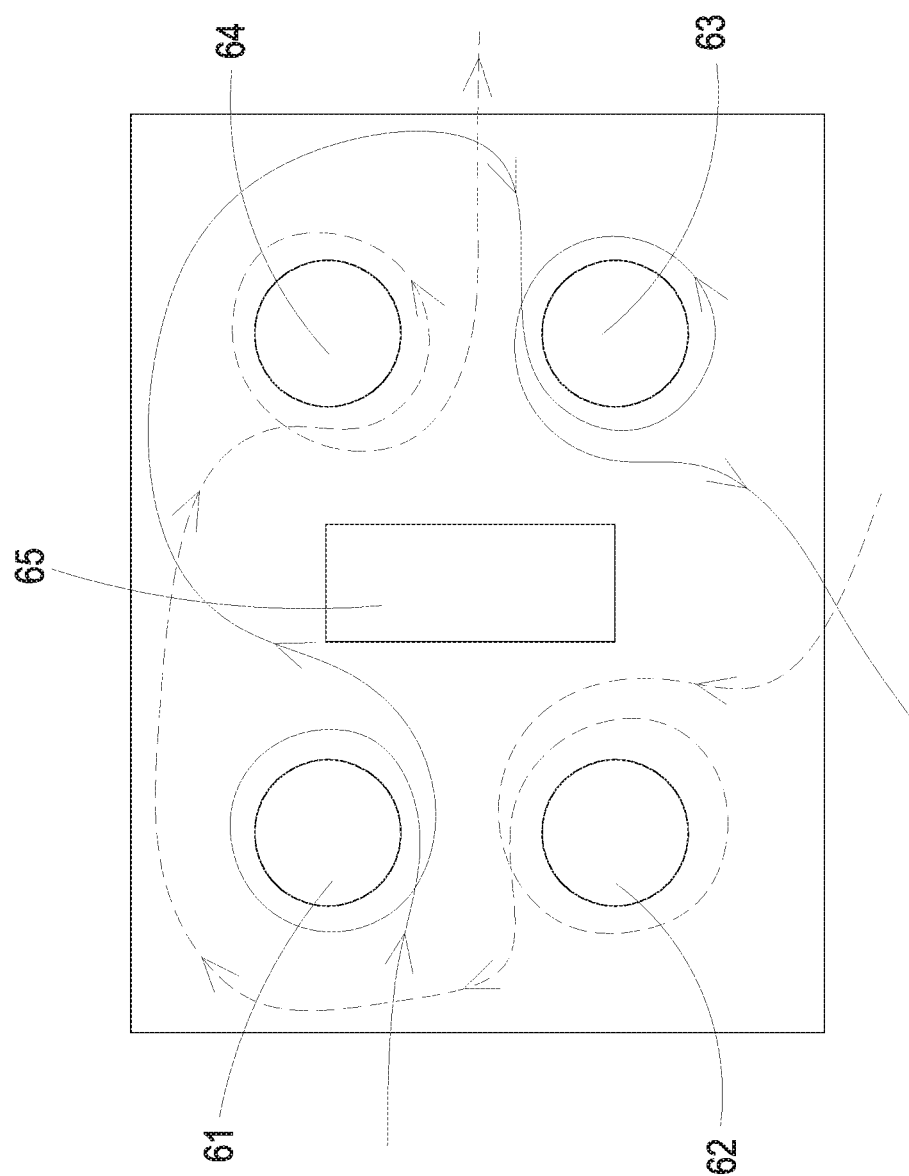
Figure 10G:
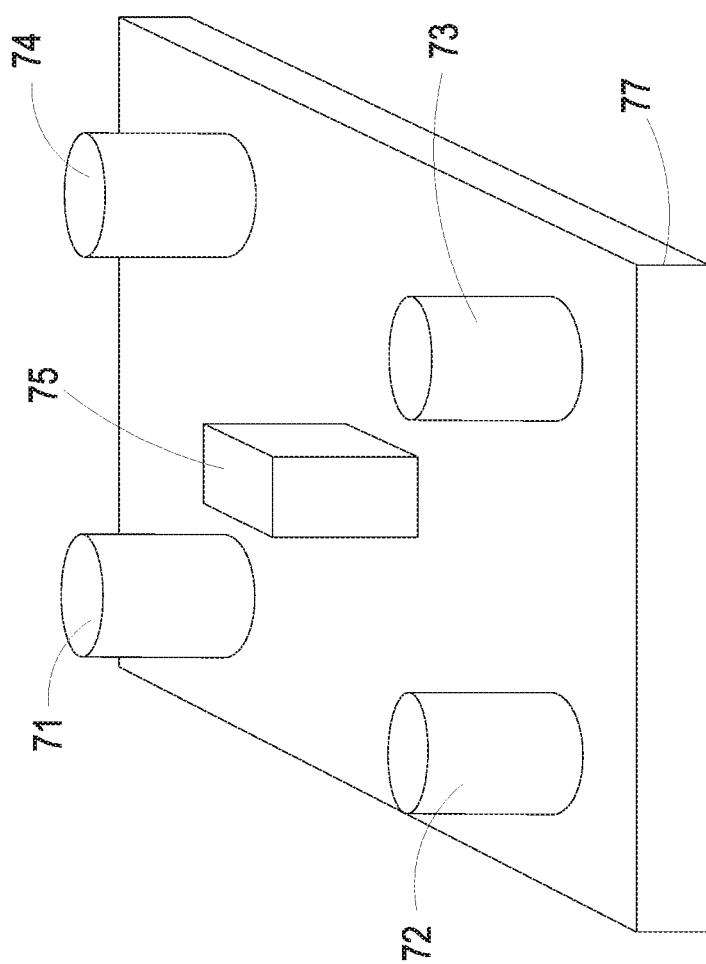
Figure 10H:
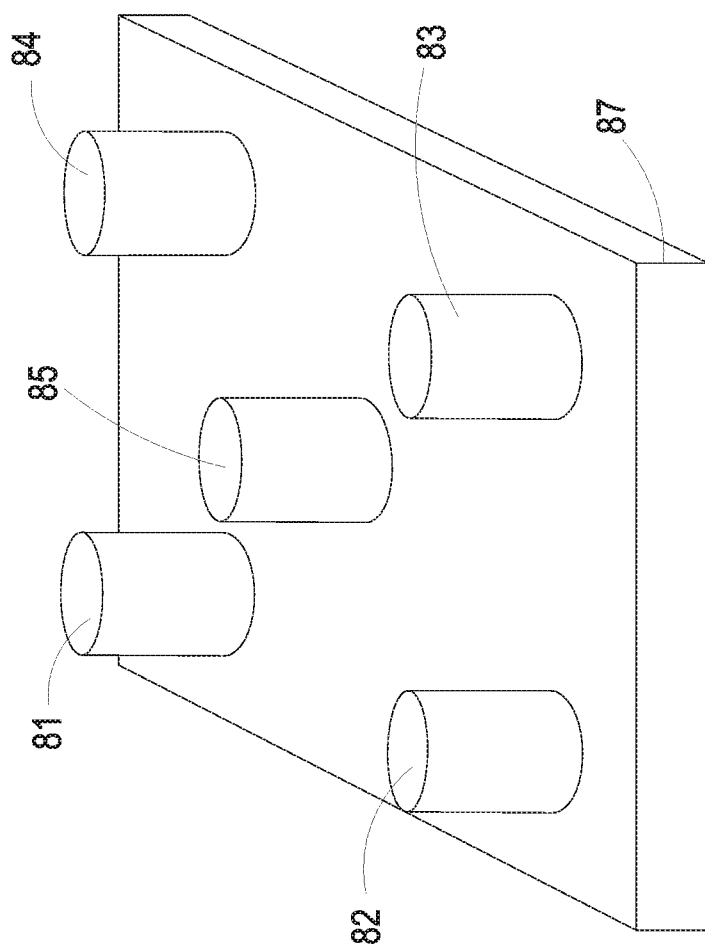

In another embodiment with the duty ratio D equal to 50%, as shown in FIG. 10D, the two middle pillars of FIG. 10A are combined into one middle pillar 65, and the cross section of the middle pillar 65 is a rectangle. The winding pillars 61, 62, 63 and 64 are corresponding to the winding pillars 51, 52, 53 and 54 of FIG. 10A respectively. The middle pillar 65 is located at the center of the set of the winding pillars 61 and 62 and the set of the winding pillars 63 and 64. In an embodiment, the winding direction is shown as FIG. 10E, and FIG. 10E is a vertical view of the FIG. 10D. One winding is wound around the winding pillars 62 and 64 and the middle pillar 65 anti-clockwisely and forms one inductor with the winding pillars 62 and 64. The other winding is wound around the winding pillars 61 and 63 and the middle pillar 65 anti-clockwisely and forms the other inductor with the winding pillars 61 and 63. In another embodiment, the winding direction is shown as FIG. 10F, and FIG. 10F is a vertical view of the FIG. 10D. One winding is first wound around the winding pillar 61 anti-clockwisely, then wound through the outer edge side of the winding pillar 64, and finally wound around the winding pillar 63 anti-clockwisely. Therefore, this winding and the winding pillars 61 and 63 form one inductor. The other winding is first wound around the winding pillar 62 anti-clockwisely, then wound through the outer edge side of the winding pillar 61, and finally wound around the winding pillar 64 anti-clockwisely. Therefore, this winding and the winding pillars 62 and 64 form the other inductor. In addition, in an embodiment, the middle pillar 65 which has a cross section in the shape of a rectangle may be replaced by a middle pillar 75 which has a cross section in the shape of a square, as shown in FIG. 10G. Alternatively, the middle pillar 65 may be replaced by a middle pillar 85 which has a cross section in the shape of a circle or an oval, as shown in FIG. 10H. The winding direction in the embodiments shown in FIGS. 10G and 10H can be derived according to that shown in FIG. 10E and FIG. 10F. Moreover, in those embodiments, the directions of DC magnetic flux on the winding pillars are the same. When the duty ratio D is 50%, the AC magnetic flux flowing through any winding pillar is divided equally into two parts flowing toward the two neighboring winding pillars (see FIG. 10B). Consequently, the AC magnetic flux is shared equally, and thus the thickness of the magnetic core substrate is reduced.

In another embodiment with the duty ratio D equal to 50%, the magnetic core assembly may be constructed by the magnetic core structure shown in FIG. 10I. The lower magnetic core includes four winding pillars 91, 92, 93 and 94, an auxiliary pillar unit and a substrate 97. The auxiliary pillar unit includes two side pillars 95 and 96. A quadrangle is formed by the connecting line of the centers of the four winding pillars, and the sides pillars are located at the two sides of the quadrangle respectively. In this embodiment, the winding direction may be similar to that shown in FIG. 10A, so as to make the DC magnetic flux on the winding pillars having the same direction. When the duty ratio D is 50%, the AC magnetic flux flowing through any winding pillar is divided equally into two parts flowing toward the two neighboring winding pillars (see FIG. 10B). Consequently, the AC magnetic flux is shared equally, and thus the thickness of the magnetic core substrate is reduced. In another embodiment, the side pillar 95 may be located at a side of the connecting line of the winding pillars 91 and 94, and the side pillar 96 may be located at a side of the connecting lone of the winding pillars 92 and 93 correspondingly.

In the embodiments shown in FIG. 10D, FIG. 10G, FIG. 10H and FIG. 10I, the manner of dividing the AC magnetic flux is not limited to be applied to the situation that the duty ratio is 50%. When the duty ratio D is larger than or equal to 30% and is smaller than or equal to 70%, the AC magnetic flux flowing out of the winding pillar can flow toward the two neighboring winding pillars and the neighboring middle or side pillar and form closed magnetic flux loop. The effect of sharing the AC magnetic flux is the best when the duty ratio D is 50%. When the AC magnetic flux is not shared equally, a part of the AC magnetic flux flows through the auxiliary pillar. Under this circumstance, an air gap is disposed on the auxiliary pillar unit. If the auxiliary pillar unit includes two auxiliary pillars, the length of the air gaps on the two auxiliary pillars are substantially the same. Alternatively, each of the auxiliary pillar unit and the four winding pillars has an air gap. The length of the air gaps on the auxiliary pillar unit are substantially the same, and the length of the air gaps on the four winding pillars are substantially the same. The length of the air gap on the auxiliary pillar is larger than or equal to the length of the air gap on the winding pillar. In addition, the upper magnetic core may have the same structure with the lower magnetic core, or the upper magnetic core may be an I-type magnetic core. The winding direction of the inductor is not limited. If the AC magnetic flux is ensured to be divided for reducing the thickness of substrate, the winding direction can be varied freely. Further, the structure of the magnetic core assembly is exemplified in the figures, but the exact positions of the pillars are not limited thereto. For example, when the winding pillar, the side pillar or the auxiliary is disposed at a side of the substrate, the pillar may be close to the edge of the substrate, or there may be a distance between the pillar and the edge of the substrate.

In above embodiments, the spatially relative terms, such as "on," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With regard to the power conversion circuit shown in FIG. 2A and FIG. 2B, the frequency of the circuit ripple at the input side thereof is a switching frequency fs. Even though the two switching power conversion units are connected in series, the ripple frequency is not increased for reducing the ripple amplitude. Accordingly, there is a need of providing a filter component with large volume at the input port to filter the current ripple. However, the filter component with large volume would increase the volume of the power conversion system.

For the high power applications, in an embodiment, the present disclosure utilizes a plurality of power conversion circuits connected in parallel and interleaved with each other to enlarge the load capacity of the power conversion system. The power conversion system includes X power conversion circuits, where X is an integer larger than 1. The X power conversion circuits are designated as A1, A2 . . . AX in FIG. 11A and FIG. 11B, and the X power conversion circuits are designated as B1, B2 . . . BX in FIG. 11C. The input ports of the X power conversion circuits are connected in parallel, and the output ports of the X power conversion circuits are connected in parallel. The circuit structure of each power conversion circuit is similar to that described above, and the detailed description thereof is omitted herein. In addition, the power conversion system further includes a controller 100.

Figure 11A:
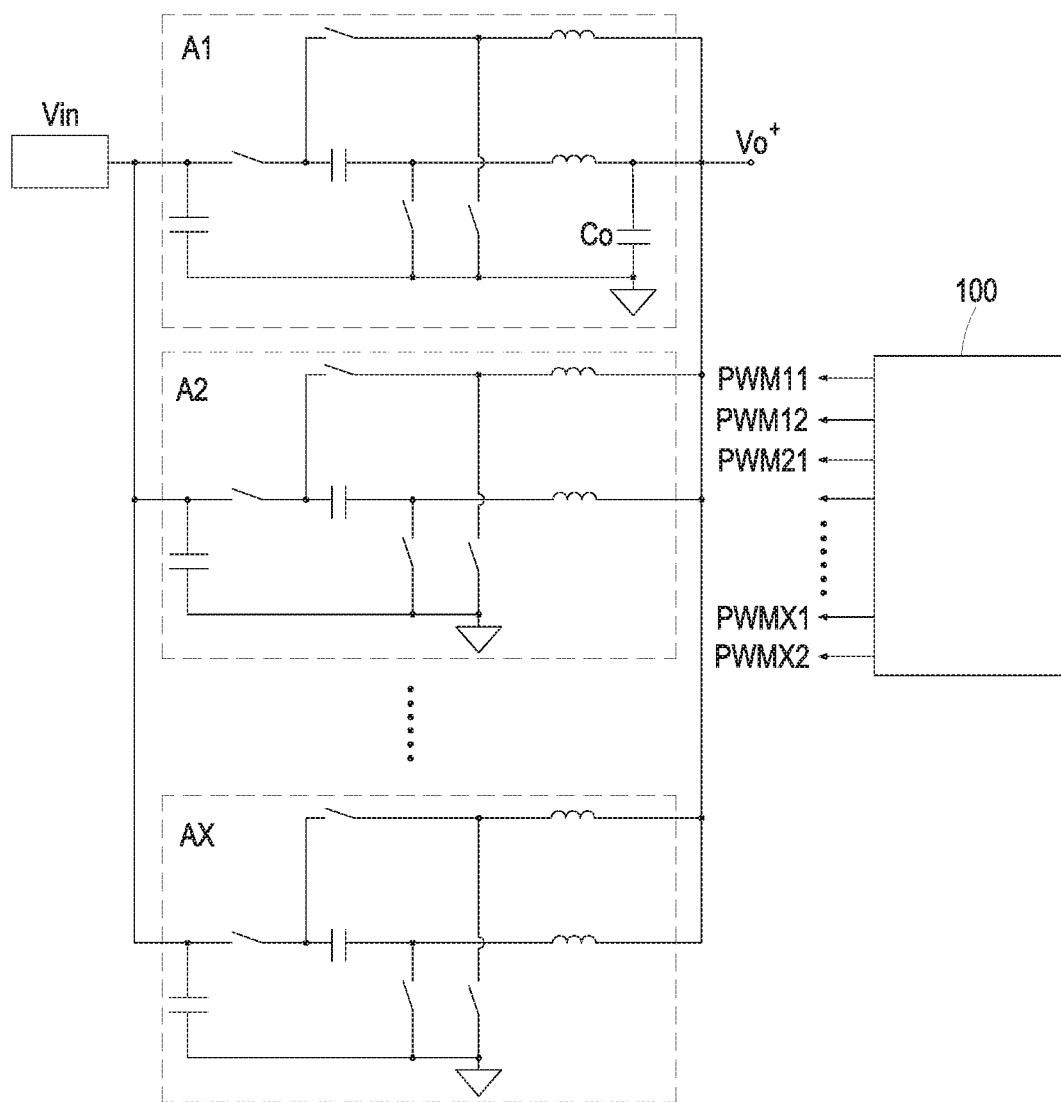
FIG. 11A and FIG. 11B are schematic circuit diagrams illustrating a plurality of first power conversion circuits connected in parallel and interleaved with each other.
Figure 11B:
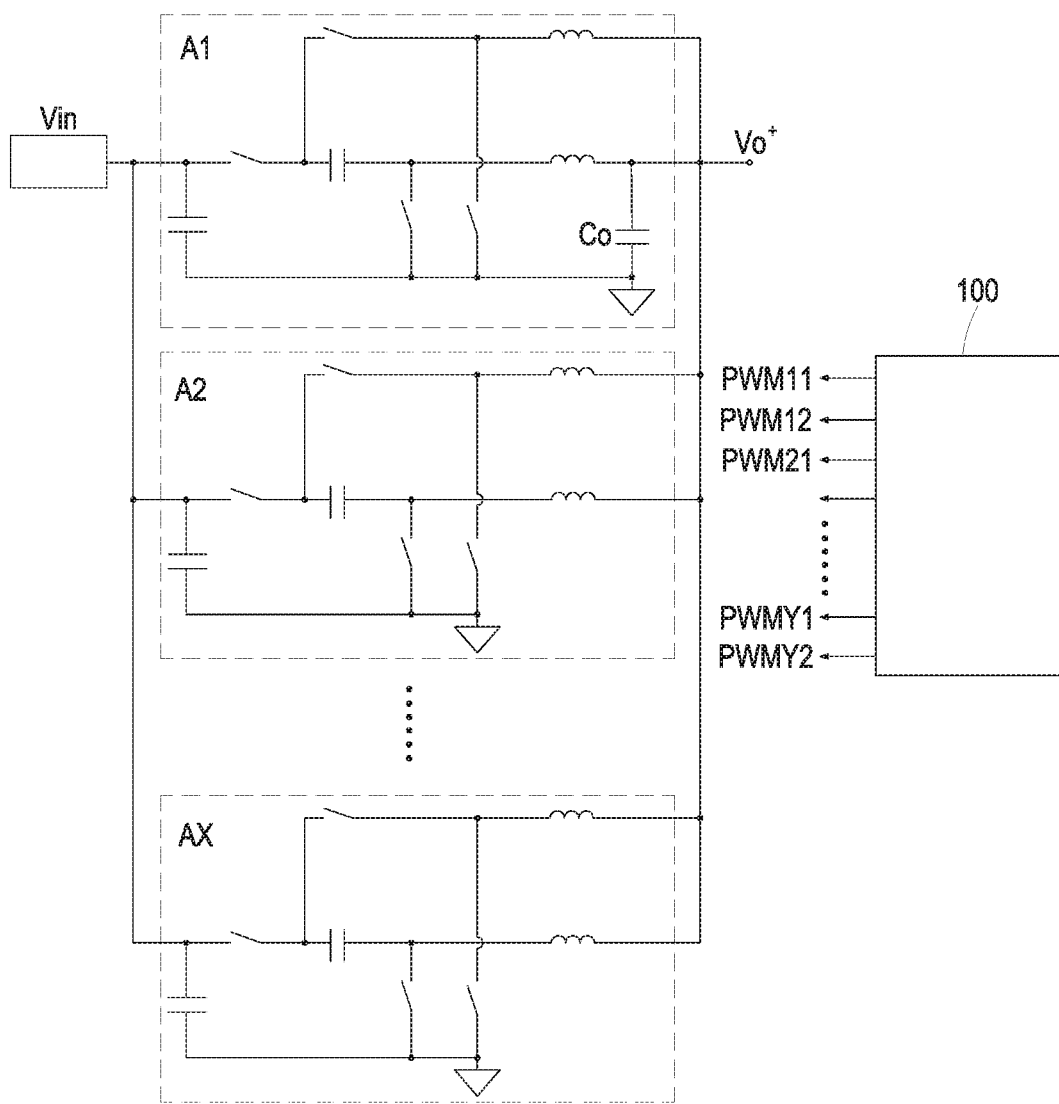
Figure 11C:
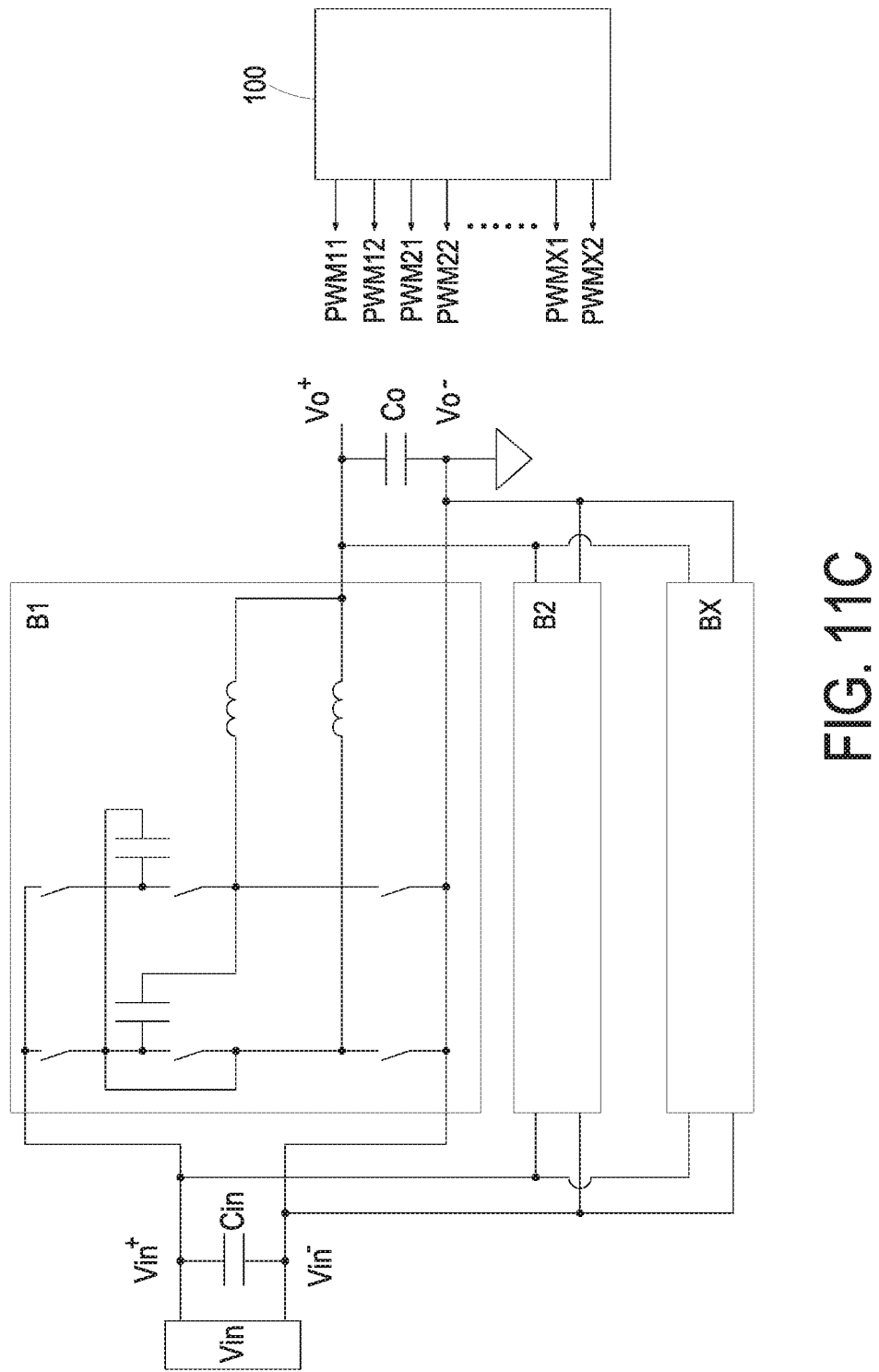
FIG. 11C is a schematic circuit diagram illustrating a plurality of second power conversion circuits connected in parallel and interleaved with each other.

FIG. 11A and FIG. 11B show the embodiments that a plurality of first power conversion circuits are connected in parallel and interleaved with each other. In the embodiment shown in FIG. 11A, X is odd, and the controller 100 outputs X sets of control signals (PWM11, PWM12), (PWM21, PWM22) . . . (PWMX1, PWMX2). The control signals PWM11, PWM21 . . . PWMX1 are 360/X out of phase with respect to each other in sequence. The control signals PWM11 and PWM12 are utilized to control the power conversion circuit A1, the control signals PWM21 and PWM22 are utilized to control the power conversion circuit A2, and so forth, and the control signals PWMX1 and PWMX2 are utilized to control the power conversion circuit AX. The detailed control manner similar to that shown in FIG. 2A, FIG. 3A and FIG. 3B, and is omitted herein. In the embodiment shown in FIG. 11B, X is even, and the controller 100 outputs Y sets of control signals (PWM11, PWM12), (PWM21, PWM22) . . . (PWMY1, PWMY2), where Y equals X/2. The control signals PWM11, PWM21 . . . PWMY1 are 360/Y (i.e., 720/X) out of phase with respect to each other in sequence. The control signals PWM11 and PWM12 are utilized to control the power conversion circuits A1 and A(Y+1), the control signals PWM21 and PWM22 are utilized to control the power conversion circuits A2 and A(Y+2), and so forth, and the control signals PWMY1 and PWMY2 are utilized to control the power conversion circuits AY and AX. FIG. 11C shows the embodiments that a plurality of second power conversion circuits are connected in parallel and interleaved with each other. In the embodiment shown in FIG. 11C, the controller 100 outputs X sets of control signals (PWM11, PWM12), (PWM21, PWM22) . . . (PWMX1, PWMX2). The control signals PWM11, PWM21 . . . PWMX1 are 360/2× out of phase with respect to each other in sequence. The control signals PWM11 and PWM12 are utilized to control the power conversion circuit B1, the control signals PWM21 and PWM22 are utilized to control the power conversion circuit B2, and so forth, and the control signals PWMX1 and PWMX2 are utilized to control the power conversion circuit BX. Through the phase difference among the control signals, the X power conversion circuits can be connected in parallel and interleaved with each other. Consequently, the current ripple at the input side of the power conversion system is reduced, and it is allowed to employ the filter component with small volume so that the size of the power conversion system is reduced.

Figure 12:
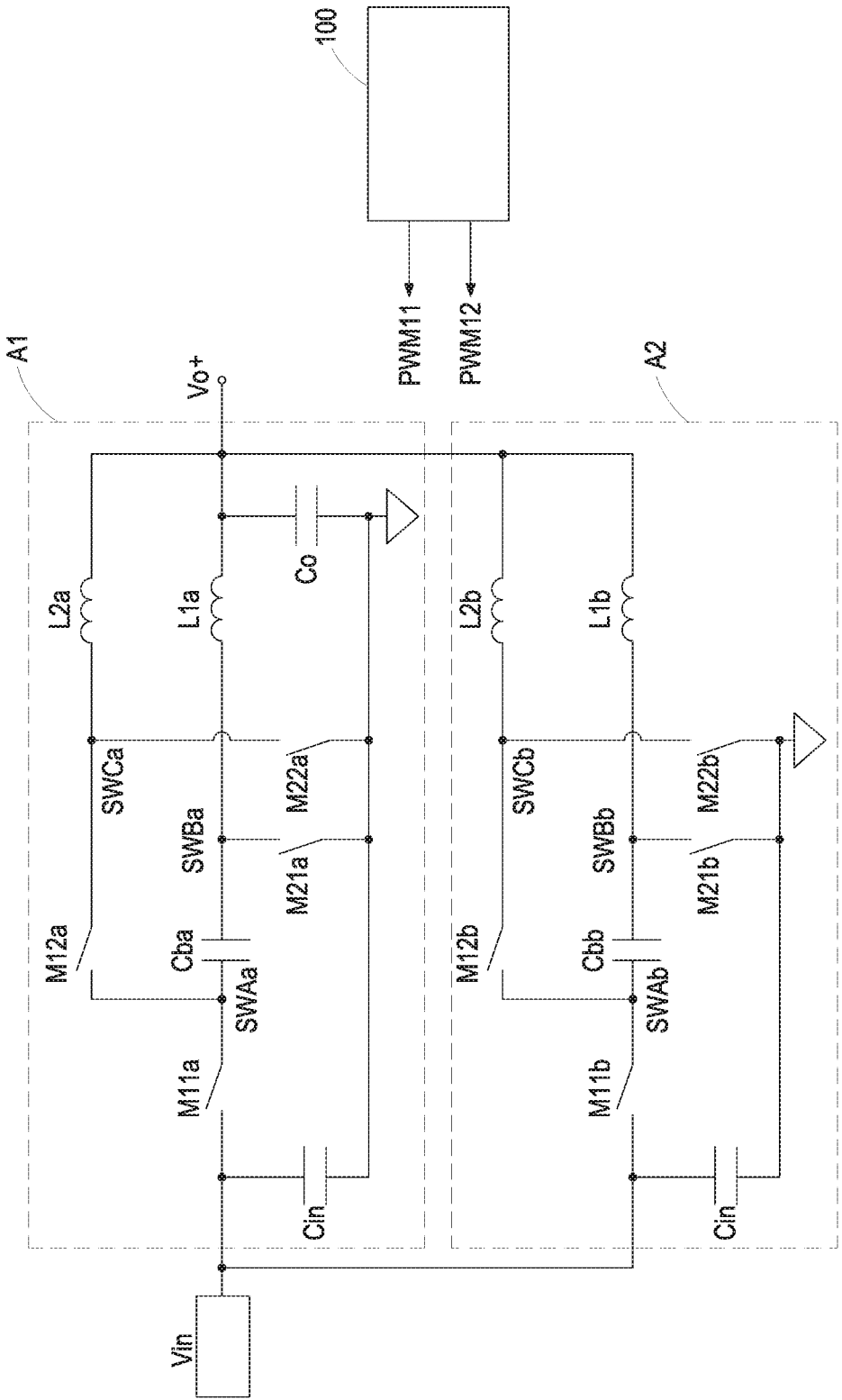
FIG. 12 is schematic circuit diagram illustrating a power conversion system including two first power conversion circuits.

Taking the power conversion system including two first power conversion circuits as an example (i.e., X equals 2), the two first power conversion circuits are connected in parallel and interleaved with each other. As shown in FIG. 12, for the two first power conversion circuits A1 and A2, the input ports are connected in parallel, and the output ports are connected in parallel. Each of the input ports may have at least one input capacitor Cin (see FIG. 12), or the input ports may share one set of input capacitor. Each of the output ports may have at least one output capacitor, or the output ports may share one set of output capacitor Co (see FIG. 12). The power conversion system further includes a controller 100, and the controller 100 outputs a set of PWM control signals PWM11 and PWM12. In the first power conversion circuit A1, two ends of the storage device Cba have a first node SWAa and a second node SWBa respectively. The first switch M11*a* of the first switching power conversion unit is controlled by the control signal PWM11, and the control signal of the second switch M21*a* of the first switching power conversion unit is complementary to the control signal PWM11. The first switch M12*a* of the second switching power conversion unit is controlled by the control signal PWM12, and the control signal of the second switch M22*a* of the second switching power conversion unit is complementary to the control signal PWM12. In the second power conversion circuit A2, the two ends of the storage device Cbb have a first node SWAb and a second node SWBb respectively. The first switch M11*b* of the first switching power conversion unit is controlled by the control signal PWM12, and the control signal of the second switch M21*b* of the first switching power conversion unit is complementary to the control signal PWM12. The first switch M12*b* of the second switching power conversion unit is controlled by the control signal PWM11, and the control signal of the second switch M22*b* of the second switching power conversion unit is complementary to the control signal PWM11.

Figure 13A:
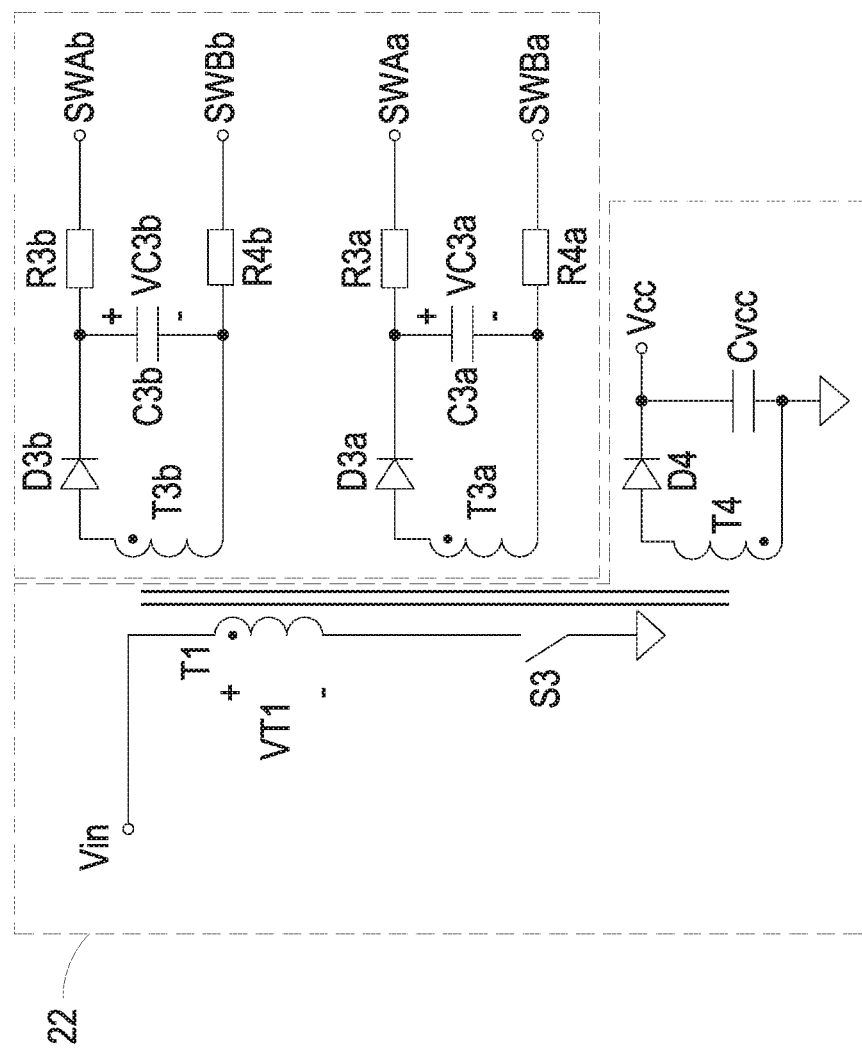
FIG. 13A and FIG. 13B are schematic circuit diagrams illustrating a precharge circuit of the power conversion system of FIG. 12.

With regard to the two power conversion circuits A1 and A2 connected in parallel and interleaved with each other of FIG. 12, the corresponding precharge circuit may be the circuits shown as FIG. 13A. As shown in FIG. 13A, two identical precharge circuits are utilized to realize the precharge for the two storage devices Cba and Cbb, the precharge circuit is similar to that shown in FIG. 5A and FIG. 5B, and the detailed description thereof is omitted herein. For example, the power circuit is a flyback circuit. The winding T3a of the precharge circuit is positively coupled to the magnetic element T1, and the turns ratio of the winding T3a to the magnetic element T1 is 1:2. The output of the precharge circuit is electrically connected to the first node SWAa and the second node SWBa so as to precharge the storage device Cba. The winding T3b of the precharge circuit is positively coupled to the magnetic element T1, and the turns ratio of the winding T3b to the magnetic element T1 is 1:2. The output of the precharge circuit is electrically connected to the first node SWAb and the second node SWBb so as to precharge the storage device Cbb. As the terminal voltage on the storage devices Cba and Cbb are increased to Vin/2, the two switching power conversion units enter the soft switching state of output voltage.

Figure 13B:
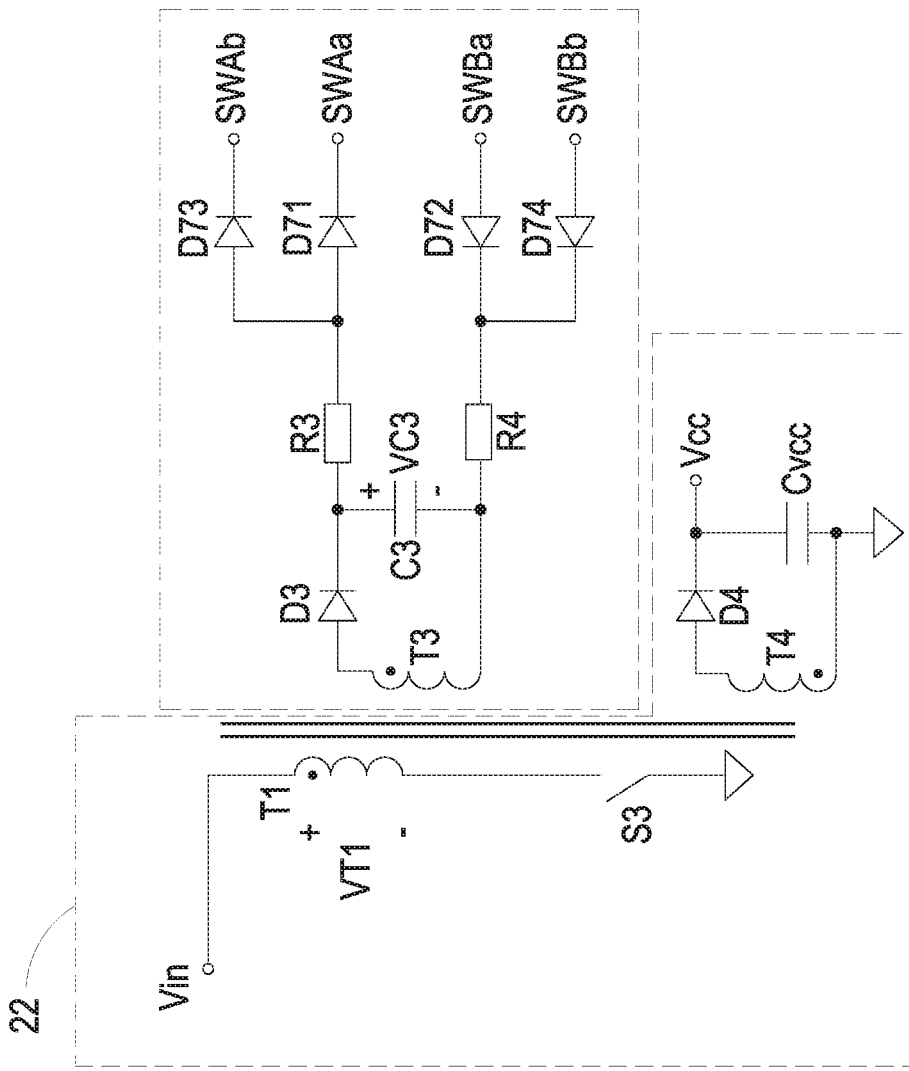

The terminal voltages of the storage devices Cba and Cbb of the two power conversion circuits A1 and A2 are the same. Accordingly, in another embodiment, only one precharge circuit is utilized to precharge the storage devices Cba and Cbb of the two switching power conversion units. As shown in FIG. 13B, the winding T3 of the precharge circuit is positively coupled to the magnetic element T1 of the power circuit 22, and the turns ratio of the winding T3 to the magnetic element T1 is 1:2. The voltage VC3 on the capacitor C3 precharges the storage device Cba through the diodes D71 and D72. The voltage VC3 on the capacitor C3 precharges the storage device Cbb through the diodes D73 and D74. When the terminal voltages on the storage devices Cba and Cbb are increased to Vin/2, the two switching power conversion units enter the soft switching state of output voltage. This implementation of precharge circuit is simple, and the structure of the transformer is simplified as well. The precharge circuit for the storage devices of the two power conversion circuits, which are connected in parallel and interleaved with each other, can be realized by disposing only four diodes.

Figure 14:
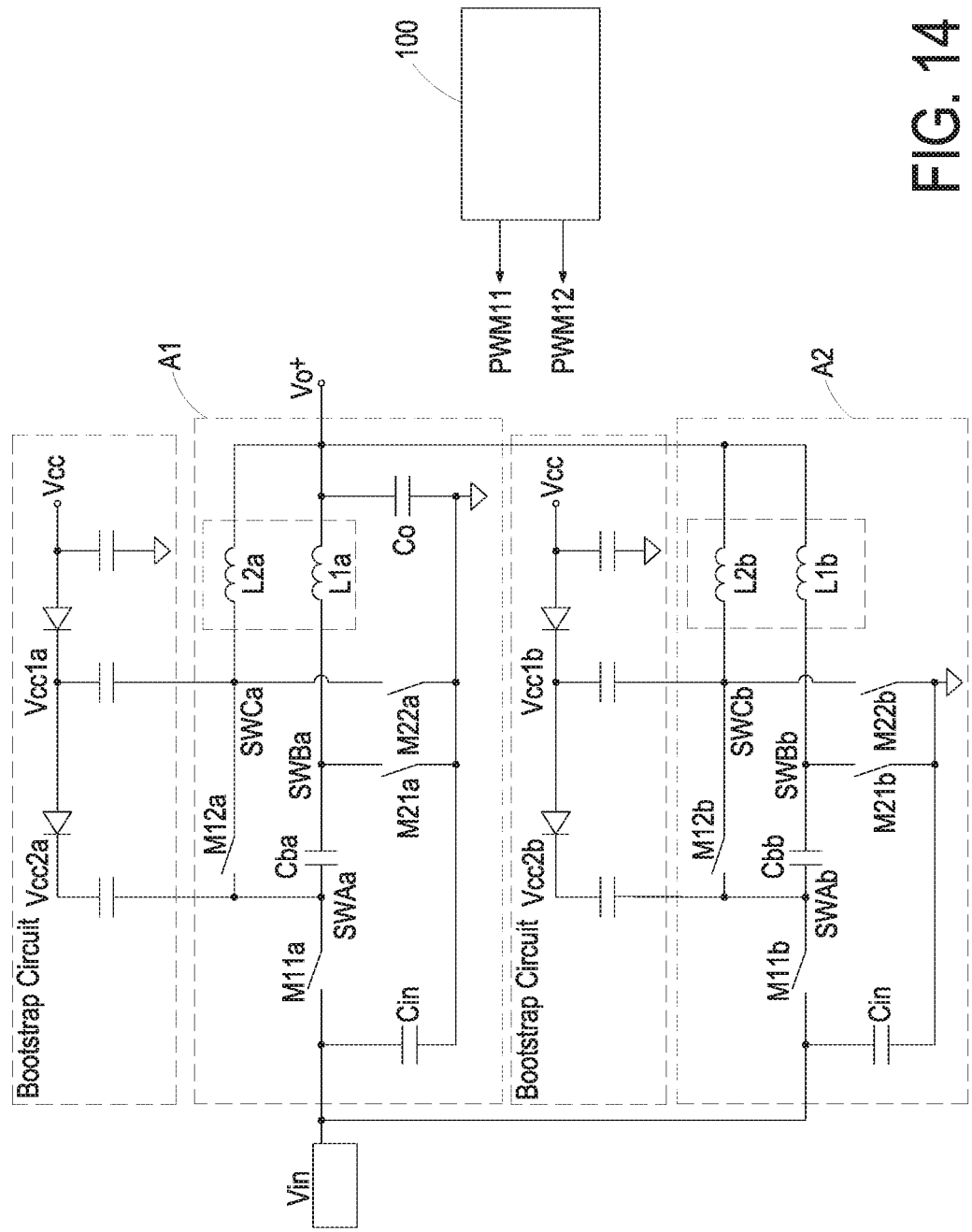
FIG. 14 is a schematic circuit diagrams illustrating a bootstrap circuit of the power conversion system of FIG. 12.

The bootstrap circuits for the two power conversion circuits A1 and A2, which are connected in parallel and interleaved with each other, are shown in FIG. 14. In this embodiment, two bootstrap circuits are utilized to supply power for the driving circuits of the two power conversion circuits respectively. The bootstrap circuit is similar to that shown in FIG. 8A or FIG. 8C, and the detailed description thereof is omitted herein. In the power conversion circuit A1 and the corresponding bootstrap circuit, the node voltage Vcc1a equals Vcc when the second switch M22a is turned on, and the node voltage Vcc1a supplies power for the corresponding driving circuit to drive and turn on the first switch M12a when the second switch M22a is turned off. After the first switch M12a is turned on, the node SWAa is shorted to the node SWCa, and the node voltage Vcc2a equals the node voltage Vcc1a. After the first switch M12a is turned off, the node voltage Vcc2a supplies power for the corresponding driving circuit to drive and turn on the first switch M11a. Accordingly, the work principle of the power conversion circuit A2 and the corresponding bootstrap circuit can be derived and is omitted herein.

Figure 15:
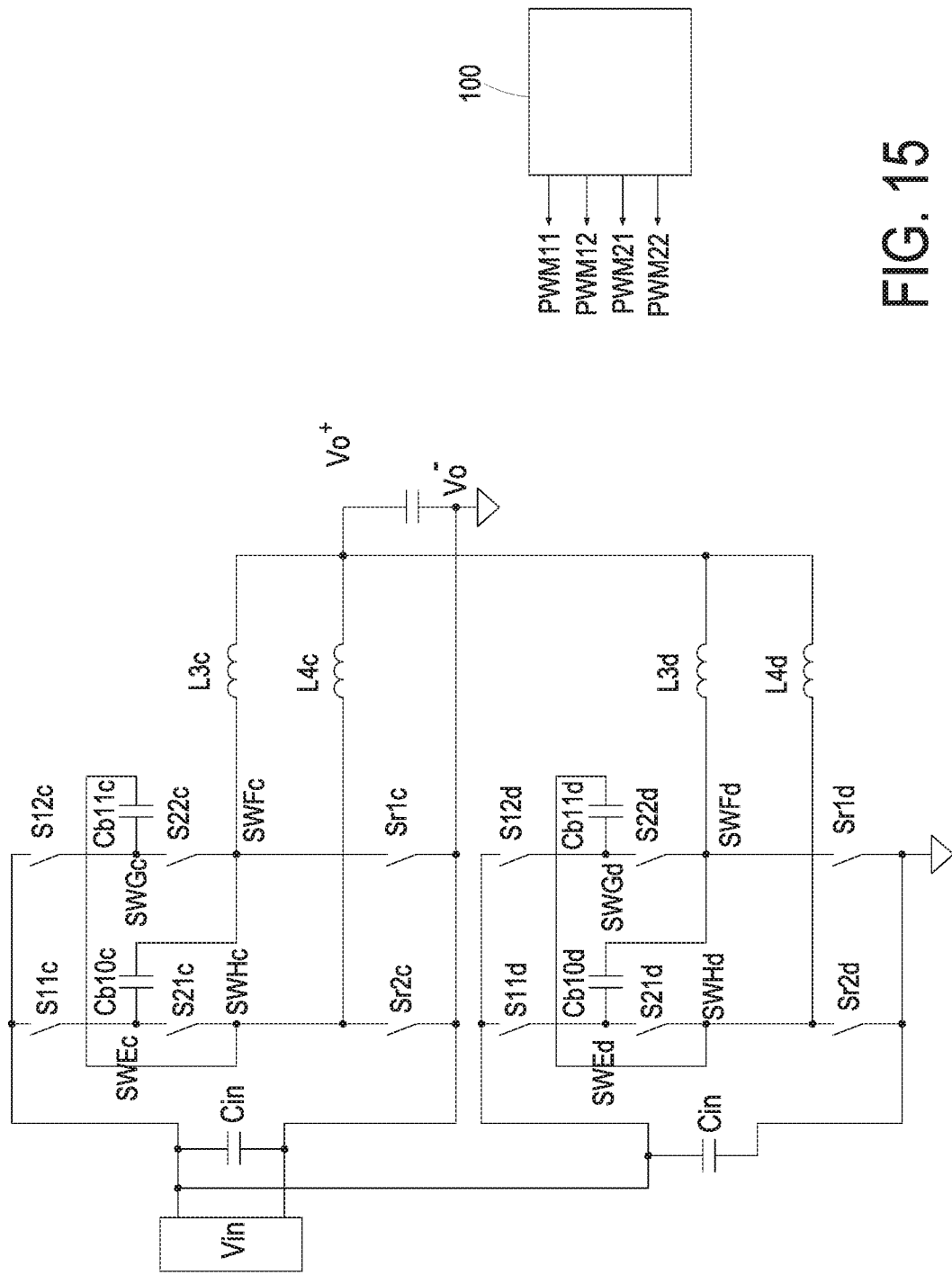
FIG. 15 is schematic circuit diagram illustrating a power conversion system including two second power conversion circuits.

Taking the power conversion system including two second power conversion circuits as an example (i.e., X equals 2), the two second power conversion circuits are connected in parallel and interleaved with each other. As shown in FIG. 15, in the first power conversion circuit B1, the two ends of the storage device Cb10c have a first node SWEc and a second node SWFc respectively, and the two ends of the storage device Cb11c have a first node SWGc and a second node SWHc respectively. In the second power conversion circuit B2, the two ends of the storage device Cb10d have a first node SWEd and a second node SWFd respectively, and the two ends of the storage device Cb11d have a first node SWGd and a second node SWHd respectively.

Figure 16:
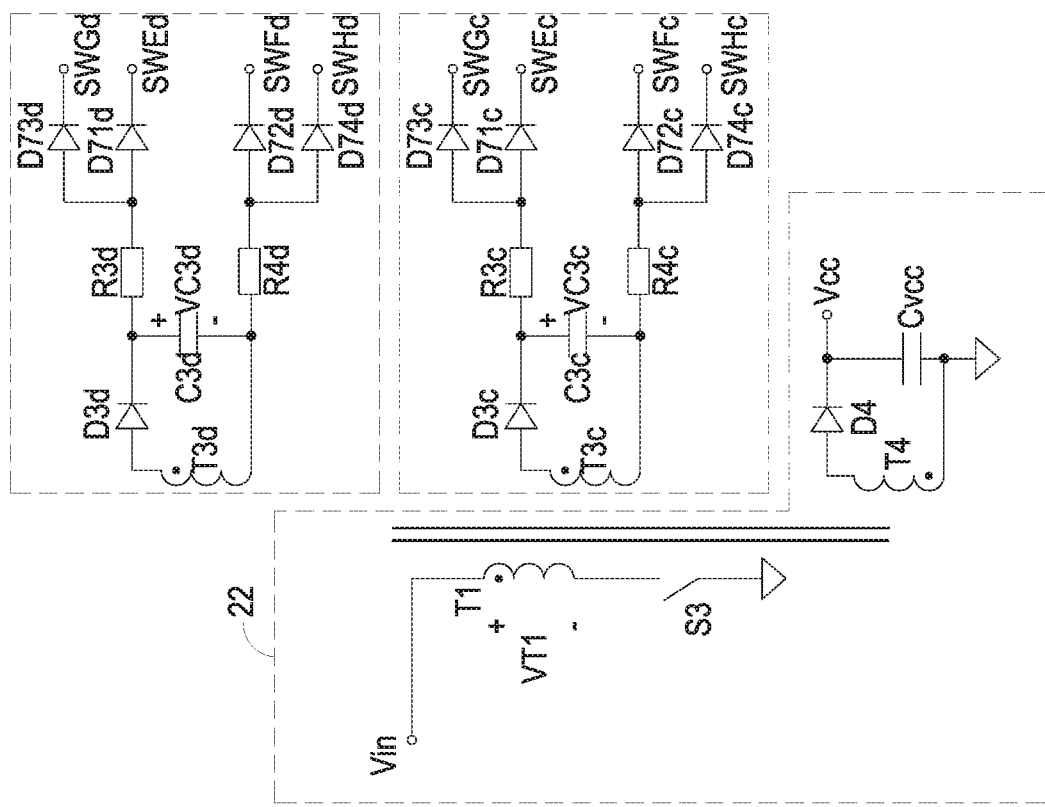
FIG. 16 is a schematic circuit diagram illustrating a precharge circuit of the power conversion system of FIG. 15.

With regard to the two power conversion circuits B1 and B2 connected in parallel and interleaved with each other of FIG. 15, the corresponding precharge circuit is shown as FIG. 16. As shown in FIG. 16, the power circuit is a flyback circuit, and there are two identical precharge circuits. The winding T3c is positively coupled to the magnetic element T1, and the turns ratio of the winding T3c to the magnetic element T1 is 1:2. The output of the precharge circuit is electrically connected to two sets of isolation diodes D71c/D72c and D73c/D74c. The outputs of the isolation diodes D71c and D72c are electrically connected to the first node SWEc and the second node SWFc respectively for precharging the storage device Cb10c. The outputs of the isolation diodes D73c and D74c are electrically connected to the first node SWGc and the second node SWHc respectively for precharging the storage device Cb11c. The other winding T3d is positively coupled to the magnetic element T1, and the turns ratio of the winding T3d to the magnetic element T1 is 1:2. The output of the precharge circuit is electrically connected to two sets of isolation diodes D71d/D72d and D73d/D74d. The outputs of the isolation diodes D71d/D72d are electrically connected to the first node SWEd and the second node SWFd respectively for precharging the storage device Cb10d. The outputs of the isolation diodes D73d/D74d are electrically connected to the first node SWGd and the second node SWHd respectively for precharging the storage device Cb11d. As the terminal voltages on the storage devices Cb10c, Cb11c, Cb10d and Cb11d are increased to Vin/2, the two switching power conversion units enter the soft switching state.

With regard to the two power conversion circuits B1 and B2 of FIG. 15, which are connected in parallel and interleaved with each other, in an embodiment, the corresponding precharge circuit includes four precharge circuits of FIG. 5C. Under this circumstance, four windings are positively coupled to the magnetic element separately, and the turns ratio of the winding to the magnetic element is 1:2. The four outputs of the four precharge circuits precharge four storage devices respectively. In another embodiment, the precharge circuit is similar to that shown in FIG. 5D. Different from the precharge circuit of FIG. 5D, the precharge circuit for the two power conversion circuits B1 and B2 includes four sets of isolation diodes. Moreover, the one winding of the precharge circuit is positively coupled to the magnetic element, the turns ratio of the winding to the magnetic element is 1:2, and the output of the winding is electrically connected to the four sets of isolation diodes. The four outputs of the four sets of isolation diodes precharge the four storage devices respectively. When the terminal voltage on the storage device is increased to Vin/2, the two power conversion circuits enter the soft switching state of output voltage. On condition that the precharge requirement for the storage device is satisfied, the number of the winding and the number of the set of isolation diodes can be varied freely to form the precharge circuit.

When the power conversion system includes the X second power conversion circuits B1 to BX, which are connected in parallel and interleaved with each other, the corresponding bootstrap circuit is similar to that shown in FIG. 8C, and the detailed description thereof is omitted herein.

In an embodiment, for satisfying the requirements of large current output, the corresponding precharge and bootstrap circuits can be implemented according to the precharge circuit of FIG. 13A, FIG. 13B or FIG. 13C and the bootstrap circuit of FIG. 14. In addition, if the number of the power conversion circuit is more (or even the number is odd), the corresponding precharge and bootstrap circuits can be derived from the above embodiments and are omitted herein. In an embodiment, the diodes of the precharge circuit, the clamping circuit and the bootstrap circuit of FIG. 13A, FIG. 13B, FIG. 13C and FIG. 14 may be replaced by the controllable switches.

From the above descriptions, the present disclosure provides a power conversion system. The power conversion circuit of the power conversion system is a multi-phase buck converter with extended duty ratio. Compared with the conventional buck circuit under the same input and output conditions, the power conversion circuit of the present disclosure can increase the duty ratio and reduce the amount of voltage jump while turning on or off switches. Therefore, the switching loss is reduced, and the efficiency is improved. Further, the precharge circuit is utilized to precharge the storage device in the power conversion circuit, thus the power conversion circuit enters a soft switching state, thereby reducing the voltage stress on the switches of the power conversion circuit. Accordingly, it is allowed to employ the switch component with low withstanding voltage so that the cost is reduced. Also, the switch component with low withstanding voltage has low conducting inner resistance, which can improve the power conversion efficiency and reduce the loss. In addition, the clamping circuit is disposed at the two ends of the switch in the power conversion circuit so as to clamp the peak voltage on the switch and protect the switch. Meanwhile, the peak energy is absorbed and fed back to the circuit. Consequently, the loss of the peak energy is reduced, and the efficiency of the power conversion circuit is improved. Moreover, through disposing the bootstrap circuit and the driving circuit, the bootstrap supply function and the control of switches are realized, which enhances the applicability of the power conversion circuit greatly and benefits the miniaturization of the power conversion system product. The structure of the bootstrap circuit is simple so that the cost is low. Furthermore, through the special structure of the magnetic core assembly of the power conversion system, the AC magnetic flux flowing through the winding pillar is shared. Accordingly, the thickness of the substrate of the magnetic core assembly is reduced, and the height of the power conversion system product is reduced, which makes the power conversion system product become thinner and increases the applicability. Further, in the power conversion system, the power density is improved, and the vertical thermal resistance is reduced. In addition, for the high power applications, the present disclosure utilizes a plurality of power conversion circuits connected in parallel and interleaved with each other to enlarge the load capacity of the power conversion system. Through the phase difference among the control signals, the power conversion circuits can be connected in parallel and interleaved with each other. Consequently, the current ripple at the input side of the power conversion system is reduced, and it is allowed to employ the filter component with small volume so that the size of the power conversion system is reduced.

While the disclosure has been described in terms of what is presently considered to be the most practical and preferred embodiments, it is to be understood that the disclosure needs not be limited to the disclosed embodiment.

What is claimed is:

1. A power conversion system, comprising:
a power conversion circuit, comprising:
an input port configured to receive an input voltage;
an output port configured to output an output voltage;
N cascaded switching power conversion units, wherein each of the N switching power conversion units comprises a first switch and a second switch, the first switch is serially coupled to one terminal of the second switch, the other terminal of the second switch is grounded, the first switch of the first switching power conversion unit is connected to the input port, the first switch of any other of the N switching power conversion units is serially coupled to the first switch of the preceding switching power conversion unit, and N is an integer larger than or equal to 2; and
N−1 storage device serially coupled between the input and output ports, wherein two ends of the storage device have a first node and a second node respectively, there are n first switches between the (n)th storage device and the input port, and n is an integer larger than or equal to 1 and smaller than or equal to N−1; and
N clamping circuits, wherein each of the N clamping circuits comprises at least one absorbing capacitor and at least one absorbing diode and has a first terminal, a second terminal and a third terminal, the first and second terminals are electrically connected to two ends of the corresponding second switch respectively, the at least one absorbing capacitor and the at least one absorbing diode are serially coupled between the first and second terminals for absorbing a peak voltage generated at the two ends of the corresponding second switch, and the third terminal is electrically connected to the corresponding first node or the input port.

2. The power conversion system according to claim 1, wherein one of the N clamping circuits comprises an absorbing diode, an absorbing capacitor and a discharging diode, a negative electrode of the absorbing diode is electrically connected to one terminal of the absorbing capacitor, a positive electrode of the absorbing diode is electrically connected to one terminal of the corresponding second switch, the other terminal of the absorbing capacitor is electrically connected to the other terminal of the corresponding second switch, a positive electrode of the discharging diode is electrically connected to the negative electrode of the absorbing diode and the absorbing capacitor, and a negative electrode of the discharging diode is electrically connected to the corresponding first node or the input port.

3. The power conversion system according to claim 1, wherein one of the N clamping circuits further comprises a fourth terminal, the third terminal of this clamping circuit is electrically connected to the input port, and the fourth terminal is electrically connected to the first node of the first storage device.

4. The power conversion system according to claim 3, wherein one of the N clamping circuits comprises an absorbing diode and two absorbing capacitors coupled in series, a negative electrode of the absorbing diode is electrically connected to one terminal of the first absorbing capacitor and the input port, a positive electrode of the absorbing diode is electrically connected to one terminal of the second absorbing capacitor and the first node of the first storage device, the other terminal of the first absorbing capacitor is electrically connected to one terminal of the corresponding second switch, and the other terminal of the second absorbing capacitor is electrically connected to the other terminal of the corresponding second switch.

5. The power conversion system according to claim 1, wherein in each of the N switching power conversion units, the first and second switches operate periodically according to a switching period, the first and second switches are turned on and off by complementary signals, and the switching period has a duty ratio.

6. The power conversion system according to claim 5, wherein when the duty ratio is smaller than or equal to 50%, each of the N clamping circuits comprises an absorbing diode, a discharging diode and an absorbing capacitor, the absorbing diode and the discharging diode are connected in series, a positive electrode of the absorbing diode is electrically connected to one terminal of the corresponding second switch, one terminal of the absorbing capacitor is electrically connected to a negative electrode of the absorbing diode and a positive electrode of the discharging diode, the other terminal of the absorbing capacitor is electrically connected to the other terminal of the corresponding second switch, and a negative electrode of the discharging diode is electrically connected to the corresponding first node.

7. The power conversion system according to claim 5, wherein when the duty ratio is larger than or equal to 50%, each of the N clamping circuits comprises an absorbing diode, a discharging diode and an absorbing capacitor, the absorbing diode and the discharging diode are connected in series, a positive electrode of the absorbing diode is electrically connected to one terminal of the corresponding second switch, one terminal of the absorbing capacitor is electrically connected to a negative electrode of the absorbing diode and a positive electrode of the discharging diode, the other terminal of the absorbing capacitor is electrically connected to the other terminal of the corresponding second switch, a negative electrode of the discharging diode of the first clamping circuit is electrically connected to the corresponding first node, and negative electrodes of the discharging diodes of the other clamping circuits are electrically connected to the input port.

8. The power conversion system according to claim 5, further comprising a controller, wherein the controller outputs a set of control signals for controlling the N switching power conversion units, the set of control signals comprises two control signals which are 180 degrees out of phase with respect to each other, one of the two control signal is utilized to control the first switch of the odd-numbered switching power conversion unit, the other control signal is utilized to control the first switch of the even-numbered switching power conversion unit, and the control signals of the first and second switches of each of the N switching power conversion units are complementary to each other.

9. A power conversion system, comprising:
X power conversion circuits, wherein X is an integer larger than or equal to one, and each of the X power conversion circuits comprises:
an input port configured to receive an input voltage;
an output port configured to output an output voltage;
N cascaded switching power conversion units, wherein each of the N switching power conversion units comprises a first switch and a second switch, the first switch is serially coupled to one terminal of the second switch, the other terminal of the second switch is grounded, the first switch of the first switching power conversion unit is connected to the input port, the first switch of any other of the N switching power conversion units is serially coupled to the first switch of the preceding switching power conversion unit, and N is an integer larger than or equal to 2; and
N−1 storage device serially coupled between the input and output ports, wherein two ends of the storage device have a first node and a second node respectively, there are n first switches between the (n)th storage device and the input port, and n is an integer larger than or equal to 1 and smaller than or equal to N−1,
wherein the X input ports of the X power conversion circuits are coupled in parallel, and the X output ports of the X power conversion circuits are coupled in parallel; and
X clamping circuit assemblies, wherein each of the X clamping circuit assemblies comprises N clamping circuits for absorbing a peak voltage generated at two ends of the second switch of the corresponding power conversion circuit, each of the N clamping circuits comprises at least one absorbing capacitor and at least one absorbing diode and has a first terminal, a second terminal and a third terminal, the first and second terminals are electrically connected to the two ends of the corresponding second switch respectively, the at least one absorbing capacitor and the at least one absorbing diode are serially coupled between the first and second terminals for absorbing the peak voltage generated at the two ends of the corresponding second switch, and the third terminal is electrically connected to the corresponding first node or the input port.

10. A power conversion system, comprising:
a power conversion circuit, comprising:
an input port configured to receive an input voltage;
an output port configured to output an output voltage; and
N cascaded switching power conversion units, wherein each of the N switching power conversion units comprises a first switch, a second switch and a third switch, one terminal of the first switch of the N switching power conversion units are electrically connected to the input port, wherein in each of the N switching power conversion units, the other terminal of the first switch is electrically connected to one terminal of the second switch and one terminal of the third switch through a storage device, the other terminal of the second switch is electrically connected to the other terminal of the first switch of another switching power conversion unit, the other terminal of the third switch is grounded, N is an integer larger than or equal to 2, and two ends of the storage device have a first node and a second node respectively; and
N clamping circuits, wherein each of the N clamping circuits comprises at least one absorbing capacitor and at least one absorbing diode and has a first terminal, a second terminal and a third terminal, the first and second terminals are electrically connected to two ends of the corresponding third switch respectively, the at least one absorbing capacitor and the at least one absorbing diode are serially coupled between the first and second terminals for absorbing a peak voltage generated at the two ends of the corresponding third switch, and the third terminal is electrically connected to the corresponding first node or the input port.

11. The power conversion system according to claim 10, wherein one of the N clamping circuits comprises an absorbing diode, an absorbing capacitor and a discharging diode, a negative electrode of the absorbing diode is electrically connected to one terminal of the absorbing capacitor, a positive electrode of the absorbing diode is electrically connected to one terminal of the corresponding third switch, the other terminal of the absorbing capacitor is electrically connected to the other terminal of the corresponding third switch, a positive electrode of the discharging diode is electrically connected to the negative electrode of the absorbing diode and the absorbing capacitor, and a negative electrode of the discharging diode is electrically connected to the first node of any of the N switching power conversion units.

12. The power conversion system according to claim 10, wherein one of the N clamping circuit further comprises a fourth terminal, the third terminal of this clamping circuit is electrically connected to the input port, and the fourth terminal is electrically connected to the first node of the corresponding switching power conversion unit.

13. The power conversion system according to claim 12, wherein one of the N clamping circuit comprises an absorbing diode and two absorbing capacitors coupled in series, a negative electrode of the absorbing diode is electrically connected to one terminal of the first absorbing capacitor and the input port, a positive electrode of the absorbing diode is electrically connected to one terminal of the second absorbing capacitor and the corresponding first node, the other terminal of the first absorbing capacitor is electrically connected to one terminal of the corresponding third switch, and the other terminal of the second absorbing capacitor is electrically connected to the other terminal of the corresponding third switch.

14. The power conversion system according to claim 10, wherein in each of the N switching power conversion units, the first, second and third switches operate periodically according to a switching period, the first and second switches are turned on and off at the same time, the first and third switches are turned on and off by complementary signals, and the switching period has a duty ratio.

15. The power conversion system according to claim 14, further comprising a controller, wherein the controller outputs a set of control signals for controlling the N switching power conversion unit, the set of control signals comprises N control signals which are 360/N degrees out of phase with respect to each other, the N control signals control the N first switches of the N switching power conversion units respectively, wherein in each of the N switching power conversion units, the control signals of the first and second switches are the same, and the control signal of the third switch is complementary to the control signal of the first switch.

16. A power conversion system, comprising:
X power conversion circuits, wherein X is an integer larger than or equal to one, and each of the X power conversion circuits comprises:
an input port configured to receive an input voltage;
an output port configured to output an output voltage; and
N cascaded switching power conversion units, wherein each of the N switching power conversion units comprises a first switch, a second switch and a third switch, one terminal of the first switch of the N switching power conversion units are electrically connected to the input port, wherein in each of the switching power conversion units, the other terminal of the first switch is electrically connected to one terminal of the second switch and one terminal of the third switch through a storage device, the other terminal of the second switch is electrically connected to the other terminal of the first switch of another switching power conversion unit, the other terminal of the third switch is grounded, N is an integer larger than or equal to 2, and two ends of the storage device comprises a first node and a second node respectively,
wherein the X input ports of the X power conversion circuits are coupled in parallel, the X output ports of the X power conversion circuits are coupled in parallel; and
X clamping circuit assemblies, wherein each of the X clamping circuit assemblies comprises N clamping circuits for absorbing a peak voltage generated at two ends of the third switch of the corresponding power conversion circuit, each of the N clamping circuits comprises at least one absorbing capacitor and at least one absorbing diode and has a first terminal, a second terminal and a third terminal, the first and second terminals are electrically connected to the two ends of the corresponding third switch respectively, the at least one absorbing capacitor and the at least one absorbing diode are serially coupled between the first and second terminals for absorbing a peak voltage generated at the two ends of the corresponding third switch, and the third terminal is electrically connected to the corresponding first node or the input port.

* * * * *